US008872154B2

(12) United States Patent   (10) Patent No.: US 8,872,154 B2
Franklin et al.             (45) Date of Patent: Oct. 28, 2014

(54) FIELD EFFECT TRANSISTOR FABRICATION FROM CARBON NANOTUBES

(75) Inventors: Aaron D. Franklin, Croton on Hudson, NY (US); Timothy D. Sands, West Lafayette, IN (US); Timothy S. Fisher, West Lafayette, IN (US); David B. Janes, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 939 days.

(21) Appl. No.: 12/755,188

(22) Filed: Apr. 6, 2010

(65) Prior Publication Data

US 2010/0295023 A1 Nov. 25, 2010

Related U.S. Application Data

(60) Provisional application No. 61/166,953, filed on Apr. 6, 2009.

(51) Int. Cl.
    *H01L 29/06* (2006.01)
(52) U.S. Cl.
    USPC ........................................ 257/9; 257/E51.04
(58) Field of Classification Search
    None
    See application file for complete search history.

(56) References Cited

U.S. PATENT DOCUMENTS

| 4,851,195 | A | 7/1989 | Matthews et al. |
| 4,935,345 | A | 6/1990 | Guilbeau et al. |
| 5,246,859 | A | 9/1993 | Nelson et al. |
| 5,382,417 | A | 1/1995 | Haase |
| 5,993,694 | A | 11/1999 | Ito et al. |
| 6,129,901 | A | 10/2000 | Moskovits et al. |
| 6,139,713 | A | 10/2000 | Masuda et al. |
| 6,217,828 | B1 | 4/2001 | Bretscher et al. |
| 6,232,706 | B1 | 5/2001 | Dai et al. |
| 6,297,592 | B1 | 10/2001 | Goren et al. |
| 6,359,288 | B1 | 3/2002 | Ying et al. |
| 6,465,132 | B1 | 10/2002 | Jin |
| 6,489,394 | B1 | 12/2002 | Andros |
| 6,566,704 | B2 | 5/2003 | Choi et al. |
| 6,705,152 | B2 | 3/2004 | Routkevitch et al. |
| 6,797,325 | B2 | 9/2004 | Wang et al. |

(Continued)

FOREIGN PATENT DOCUMENTS

| WO | 03052181 | 6/2003 |
| WO | 03091486 | 11/2003 |

(Continued)

OTHER PUBLICATIONS

Che et al., "Chemical Vapor Deposition Based Synthesis of Carbon Nanotubes and Naofibers Using a Template Method," Chem. Mater., vol. 10, No. 1 (1998), pp. 260-267.

(Continued)

*Primary Examiner* — Michael Lebentritt
*Assistant Examiner* — Kevin Quinto
(74) *Attorney, Agent, or Firm* — John V. Daniluck; Bingham Greenebaum Doll LLP

(57) ABSTRACT

Methods and apparatus for an electronic device such as a field effect transistor. One embodiment includes fabrication of an FET utilizing single walled carbon nanotubes as the semiconducting material. In one embodiment, the FETs are vertical arrangements of SWCNTs, and in some embodiments prepared within porous anodic alumina (PAA). Various embodiments pertain to different methods for fabricating the drains, sources, and gates.

15 Claims, 66 Drawing Sheets

(56) References Cited

U.S. PATENT DOCUMENTS

| | | | |
|---|---|---|---|
| 6,855,603 | B2 | 2/2005 | Choi et al. |
| 6,903,365 | B1 | 6/2005 | Nihei |
| 6,998,634 | B2 | 2/2006 | Cheong et al. |
| 7,037,767 | B2 | 5/2006 | Hirai |
| 7,038,299 | B2 | 5/2006 | Furukawa et al. |
| 7,084,002 | B2 | 8/2006 | Kim et al. |
| 7,129,554 | B2 | 10/2006 | Lieber et al. |
| 7,235,159 | B2 | 6/2007 | Gu et al. |
| 7,317,047 | B2 | 1/2008 | Hsu |
| 7,345,296 | B2 | 3/2008 | Tombler, Jr. et al. |
| 7,371,674 | B2 | 5/2008 | Suh et al. |
| 7,425,487 | B2 | 9/2008 | Kreupl et al. |
| 7,449,757 | B2 | 11/2008 | Bradlet et al. |
| 7,452,452 | B2 | 11/2008 | Ren et al. |
| 7,456,564 | B2 | 11/2008 | Song et al. |
| 7,538,062 | B1 | 5/2009 | Dai et al. |
| 7,576,410 | B2 | 8/2009 | Rueb et al. |
| 7,608,905 | B2 | 10/2009 | Bratkovski et al. |
| 7,615,492 | B2 | 11/2009 | Yang et al. |
| 7,646,045 | B2 | 1/2010 | Kreupl et al. |
| 2002/0117659 | A1 | 8/2002 | Lieber et al. |
| 2003/0041438 | A1 | 3/2003 | Wei et al. |
| 2003/0113713 | A1 | 6/2003 | Glezer et al. |
| 2003/0134433 | A1 | 7/2003 | Gabriel et al. |
| 2003/0143398 | A1* | 7/2003 | Ohki et al. ............ 428/398 |
| 2003/0218224 | A1 | 11/2003 | Schlaf et al. |
| 2004/0018587 | A1 | 1/2004 | Makowski et al. |
| 2004/0023428 | A1 | 2/2004 | Gole et al. |
| 2004/0065970 | A1 | 4/2004 | Blanchet-Fincher |
| 2004/0091285 | A1 | 5/2004 | Lewis |
| 2004/0120183 | A1 | 6/2004 | Appenzeller et al. |
| 2004/0124504 | A1 | 7/2004 | Hsu |
| 2004/0149979 | A1 | 8/2004 | Cheong et al. |
| 2004/0158410 | A1 | 8/2004 | Ono et al. |
| 2004/0200734 | A1 | 10/2004 | Co et al. |
| 2004/0245209 | A1 | 12/2004 | Jung et al. |
| 2004/0253805 | A1* | 12/2004 | Dubin et al. ............ 438/618 |
| 2005/0048414 | A1 | 3/2005 | Harnack et al. |
| 2005/0081625 | A1 | 4/2005 | Chen et al. |
| 2005/0112049 | A1 | 5/2005 | Hofmeister |
| 2005/0167655 | A1 | 8/2005 | Furukawa et al. |
| 2005/0184641 | A1 | 8/2005 | Armitage et al. |
| 2005/0188444 | A1 | 8/2005 | Jeong et al. |
| 2005/0224779 | A1 | 10/2005 | Wang et al. |
| 2005/0224888 | A1 | 10/2005 | Graham et al. |
| 2005/0248256 | A1 | 11/2005 | Song et al. |
| 2005/0249980 | A1 | 11/2005 | Itoh et al. |
| 2005/0255313 | A1 | 11/2005 | Kyotani et al. |
| 2005/0255581 | A1 | 11/2005 | Kim et al. |
| 2006/0004271 | A1 | 1/2006 | Peyser et al. |
| 2006/0128088 | A1 | 6/2006 | Graham et al. |
| 2006/0177952 | A1 | 8/2006 | Lambertini et al. |
| 2006/0208362 | A1 | 9/2006 | Dubin |
| 2006/0231946 | A1 | 10/2006 | Pan et al. |
| 2006/0240238 | A1 | 10/2006 | Boussaad et al. |
| 2006/0244361 | A1 | 11/2006 | Kim et al. |
| 2006/0270229 | A1 | 11/2006 | Cordemon et al. |
| 2006/0281306 | A1 | 12/2006 | Gstrein et al. |
| 2007/0042377 | A1 | 2/2007 | Gao et al. |
| 2007/0108482 | A1 | 5/2007 | Bertin et al. |
| 2007/0114657 | A1 | 5/2007 | Dangelo et al. |
| 2007/0208243 | A1 | 9/2007 | Gabriel et al. |
| 2007/0275499 | A1 | 11/2007 | Corderman et al. |
| 2008/0017845 | A1 | 1/2008 | Drndic et al. |
| 2008/0020477 | A1 | 1/2008 | Pronovost |
| 2008/0102213 | A1 | 5/2008 | Afzali-Ardakani et al. |
| 2008/0241755 | A1* | 10/2008 | Franklin et al. ............ 430/296 |
| 2008/0296562 | A1 | 12/2008 | Murduck et al. |
| 2008/0296563 | A1 | 12/2008 | Bourgoin et al. |
| 2009/0017284 | A1 | 1/2009 | Dionigi et al. |
| 2009/0061451 | A1 | 3/2009 | Achim et al. |
| 2009/0084678 | A1 | 4/2009 | Joshi et al. |
| 2009/0183816 | A1 | 7/2009 | Min et al. |
| 2009/0297913 | A1 | 12/2009 | Zhang et al. |
| 2010/0009134 | A1 | 1/2010 | Drndic et al. |

FOREIGN PATENT DOCUMENTS

| | | |
|---|---|---|
| WO | 2004029176 A1 | 4/2004 |
| WO | 2004035462 | 4/2004 |
| WO | 2004087564 | 10/2004 |
| WO | 2005093872 A1 | 10/2005 |
| WO | 2006031981 | 3/2006 |
| WO | 2006060054 A1 | 6/2006 |
| WO | 2006135253 | 12/2006 |
| WO | 2007089550 A2 | 8/2007 |
| WO | 2008024674 | 2/2008 |
| WO | WO-2008/024674 A1 * | 2/2008 |
| WO | 2008127293 A2 | 10/2008 |
| WO | 2008129524 | 10/2008 |
| WO | 2009036071 A2 | 3/2009 |
| WO | 2009073927 | 6/2009 |
| WO | 2009097357 | 8/2009 |

OTHER PUBLICATIONS

Kamins et al., "Growth and Structure of Chemically Vapor Deposited Ge Nanowires on Si Substrates," Nano Lett., vol. 4, No. 3 (2004), pp. 503-506.

Kikkawa et al., "Growth rate of silicon nanowires," Appl. Phys. Lett. 86, 123109, (2005), pp. 1-3.

Li et al., "highly-ordered carbon nanotube arrays for electronics applications," Appl. Phys. Lett., vol. 75, No. 3, (1999), pp. 367-369.

Maschmann et al., "Parametric study of synthesis conditions in plasma-enhanced CVD of high-quality single-walled carbon nanotubes," Carbon. vol. 44 (2006) pp. 10-18.

Masuda et al., "Fabrication of Gold Nanodot Array Using Anodic Porous Alumina as Evaporation Mask," Jpn. J. Appl. Phys., vol. 35 (1996), pp. L126-L129.

Persson et al., "Solid-phase diffusion mechanism for GaAs nanowire growth," Nature Materials, vol. 3, (2004), pp. 677-681.

Maschmann et al., "Vertical single-and double-walled carbon nanotubes grown from modified porous anodic alumina templates," Nanotechnology 17 (2006), pp. 3925-3929.

Franklin et al., "In-place fabrication of nanowire electrode arrays for vertical nanoelectronics on Si substrates," J. Vac. Sci. Technol. 852(2), Mar./Apr. 2007, pp. 343-347.

Maschmann et al., "Lithography-Free in Situ Pd Contacts to Templated Single-Walled Carbon Nanotubes," Nano Letters (2006), vol. 6, No. 12, pp. 2712-2717.

Ou et al., "Multisegmented on-dimensional hybrid structures of carbon nanotubes and metal nanowires," Applied Physics Letters 89, 243122 (2006), 4 pages.

Mclamore et al., "A Self-Referencing Glutamate Biosensor for Measuring Real Time Neuronal Glutamate Flux," Journal of Neuroscience Methods, 2010, 189, pp. 14-22.

Dale et al., "Listening to the Brain: Microelectrode Biosensors for Neurochemicals," Trends in Biotechnology, Aug. 2005, 23(8), pp. 420-428.

Bharathi et al., "A glucose biosensor based on electrodeposited biocomposites of gold nanoparticles and glucose oxidase enzyme," Analyst, 2001, 126(11), pp. 1919-1922.

U.S. Appl. No. 11/747,680, NF OA mailed Mar. 4, 2011, 7 pgs.
Applicant Response, U.S. Appl. No. 11/747,680, filed Sep. 1, 2011, 25 pgs.
U.S. Appl. No. 11/747,680, NF OA mailed Jan. 12, 2012, 10 pgs.
Applicant Response, U.S. Appl. No. 11/747,680, filed May 11, 2012, 26 pgs.
U.S. Appl. No. 11/747,680, Final OA mailed Sep. 5, 2012, 13 pgs.
Applicant Response, U.S. Appl. No. 11/747,680, filed Mar. 5, 2013, 19 pgs.
U.S. Appl. No. 11/747,680, NF OA mailed Jun. 5, 2013, 10 pgs.
U.S. Appl. No. 12/024,635, NF OA mailed Aug. 17, 2012, 10 pgs.
Applicant Response, U.S. Appl. No. 12/024,635, filed Feb. 19, 2013, 16 pgs.
U.S. Appl. No. 12/025,453, NF OA mailed Oct. 4, 2011, 10 pgs.
Applicant Response, U.S. Appl. No. 12/025,453, filed Mar. 5, 2012, 15 pgs.
U.S. Appl. No. 12/025,453, Final OA mailed Mar. 16, 2012, 10 pgs.
U.S. Appl. No. 12/694,876, NF OA mailed Dec. 20, 2012, 13 pgs.
Applicant Response, U.S. Appl. No. 12/694,876, filed Apr. 18, 2013, 19 pgs.

* cited by examiner

100 

```
┌─────────────────────────────────────────────────────┐
│ Prepare a plurality of metal film stacks within an  │
│ insulating matrix material.                         │
│ 101                                                 │
└─────────────────────────────────────────────────────┘

┌─────────────────────────────────────────────────────┐
│ Create a plurality of ordered, vertical pores       │
│ within each stack.                                  │
│ 102                                                 │
└─────────────────────────────────────────────────────┘

┌─────────────────────────────────────────────────────┐
│ Grow a nanotube within each pore.                   │
│ 103                                                 │
└─────────────────────────────────────────────────────┘

┌─────────────────────────────────────────────────────┐
│ Establish electrical communication from one end of  │
│ each nanotube to a common electrical plane (source).│
│ 104                                                 │
└─────────────────────────────────────────────────────┘

┌─────────────────────────────────────────────────────┐
│ Deposit an insulator within each pore.              │
│ 105                                                 │
└─────────────────────────────────────────────────────┘

┌─────────────────────────────────────────────────────┐
│ Remove the film material surrounding the filled     │
│ pores and create a plurality of pillars each        │
│ containing a nanotube                               │
└─────────────────────────────────────────────────────┘

┌─────────────────────────────────────────────────────┐
│ Deposit gate material around the pillars            │
│ 108                                                 │
└─────────────────────────────────────────────────────┘
```

```
┌─────────────────────────────────────────────┐
│   Deposit insulating material around pillars.│
│                    110/1                     │
└─────────────────────────────────────────────┘

┌─────────────────────────────────────────────┐
│  Remove top surface material to expose ends of│
│                  nanotubes.                  │
│                    111/1                     │
└─────────────────────────────────────────────┘

┌─────────────────────────────────────────────┐
│  Deposit a common electrical plane (drain) on tops of│
│  exposed nanotube ends; establish gate electrical contact.│
│                    112/1                     │
└─────────────────────────────────────────────┘
```

Wet etch gate metal to define channel length. PR defines a gate contact, even if wet – etched the PR can extend into the square ~3 μm and only need to etch ~200 nm so even with undercutting should keep gate contact there.
1090/1

ALD of SiO$_2$ or application of SOG silicate.
1100/1

Etchback of SOG and capping portion of Al$_2$O$_2$ that is covering the top of the pores, to expose tips of SWCNTs.
1110/1

Litho pattern top contact squares, deposit Pd contacts, lift-off. Also litho define gate contact, etch SiO$_2$ and deposit/lift-off. Define source contact, etch SiO$_2$ to Pt, deposit/liftoff.
1120/1

FIG. 1(e)

1002 

---

Lithographically keep gate contact area and etchback exposed portion of gate metal to define channel length.
1090/2

---

ALD of SiO$_2$ or application of SOG silicate.
1100/2

---

Etchback of SOG and capping portion of Al$_2$O$_3$ that is covering the top of the pores to expose tips of SWCNTs.
1110/2

---

Litho pattern top drain contact squares, deposited Pd contacts, lift-off. Litho define source contacts, etch SiO$_2$ to Pt, deposit/lift-off.
1120/2

FIG. 1(f)

2000 

Deposit 100 nm Ti / 100 nm Al / mm Fe / 300 nm Al on Si chip.
2010

Using electron beam lithography, pattern hexagonal pore pattern in strip 300 μm x 5000 μm with 100 nm inner-pore spacing.
2020

Anodize at 40 V in 0.3 M oxalic acid held at 5°C to form porous anodic alumina (PAA) on some the chip.
2030

Grow single-walled carbon nanotubes (SWCNTs) and penetrate alumina barrier using microwave plasma-enhanced chemical vapor deposition (MPCVD) with the following parameters: 900°C, 300 W, 50 sccm $H_2$, 10 sccm $CH_4$ 10 torr, 5 min.
2040

Electrodeposit Pd on specified area of sample with 500 ms pulses of 2mA/cm$^2$ to form nanowire contacts.
2050

Apply spin-on glass (SOG) and cure briefly on hotplates and then for 1 hour at 450°C in $N_2$. Ar ion bombardment etch back SOG and SWCNTs on PAA surface to planarize, using 60 sccm Ar, 300 W coil, 500 W platen, 1 Pa, for = 3 min.
2060

Lithographically open the ordered pore area that does not have Pd nanowires and expose to $O_2$ plasma at 600 W for 1 min to remove the SWCNTs. Remove resist in acetone/methanol.
2070

| Etch the PAA in chronic acid heated to 65°C to create SOG pillars (etch rate ≈10 nm/min).<br>2080 |

| Lithographically expose the ordered pore region and sputter Al gate metal at 75 W, 10 mtorr Ar, 15 min, followed by lift-off in acetone.<br>2090 |

| Lithographically define electrodes on regions without Pd or SWCNTs. Deposit gate electrode (*e.g.*, 20 nm Ti / 80 nm Au) and lift-off in acetone.<br>2100 |

| Apply SOG using the same process as in step 2060, with the omission of the 450°C<br>2110 |

| Ar ion bombardment etch the SOG and Al-coated pillars until the surface is planarized, using the same process as in step 2060. The tips of the nanotubes should be exposed. 2120 |

| Oxidize the Al gate metal to the desired depth to define the final channel length<br>2130 |

| Lithographically define top source electrodes and deposit 8 nm Pd / 20 nm Ti / 80 nm Au. Lift-off in acetone. The various contact electrodes are shown in FIG. 11-14.<br>2140 |

FIG. 1(h)

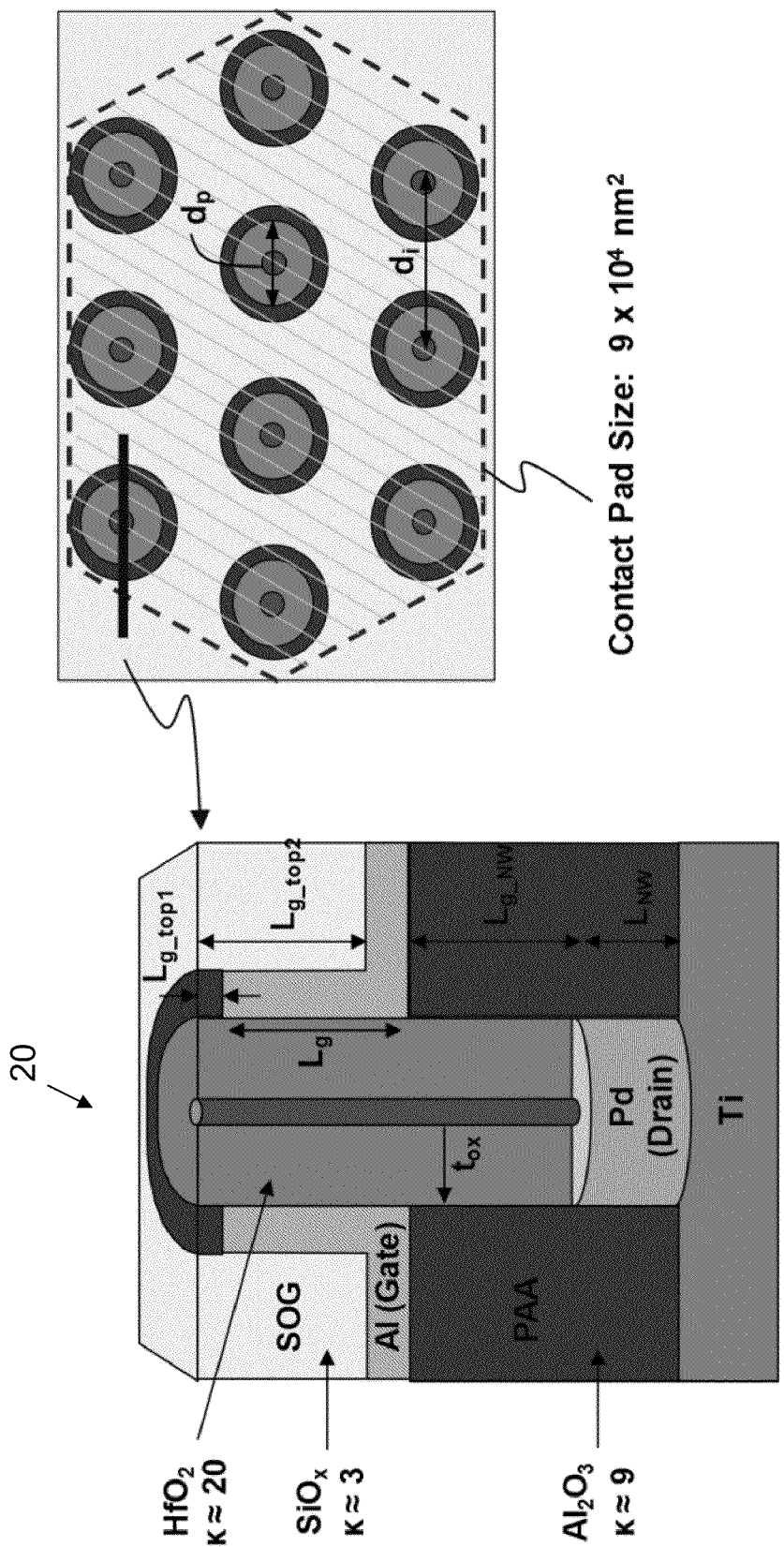
FIG. 2.3

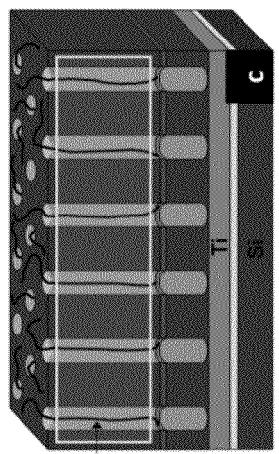
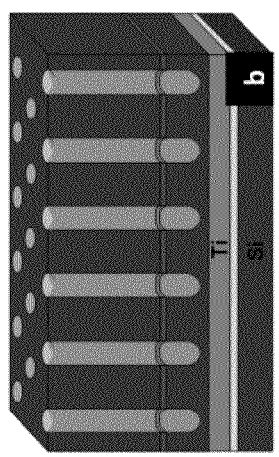
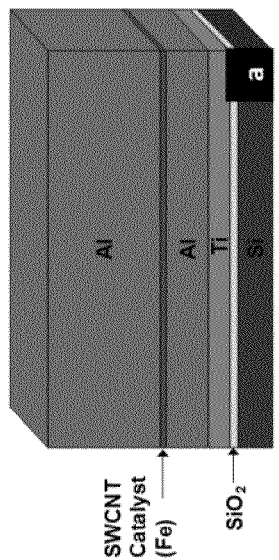
FIG. 3.1
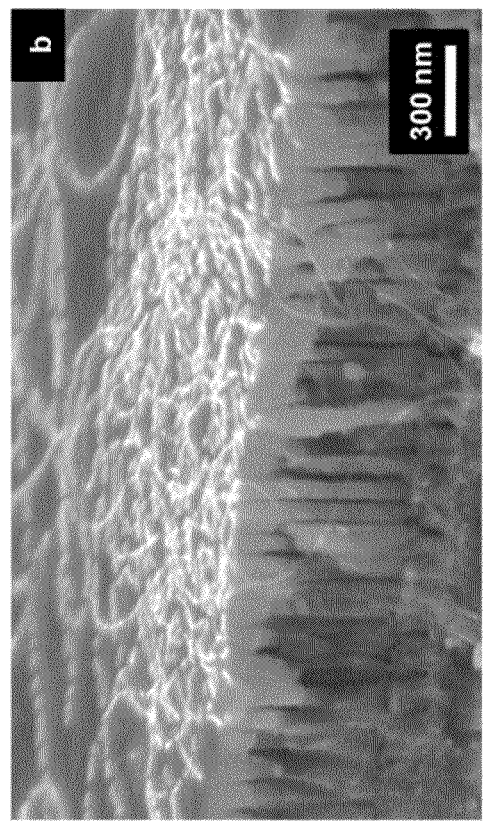
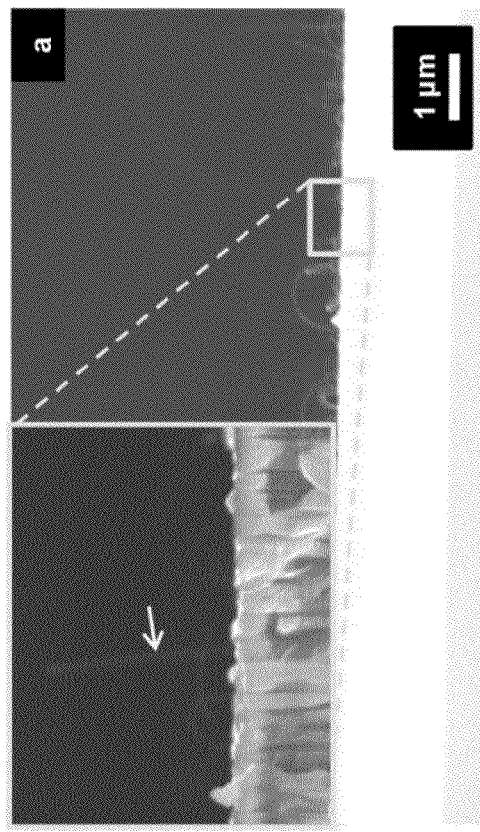
FIG. 3.2

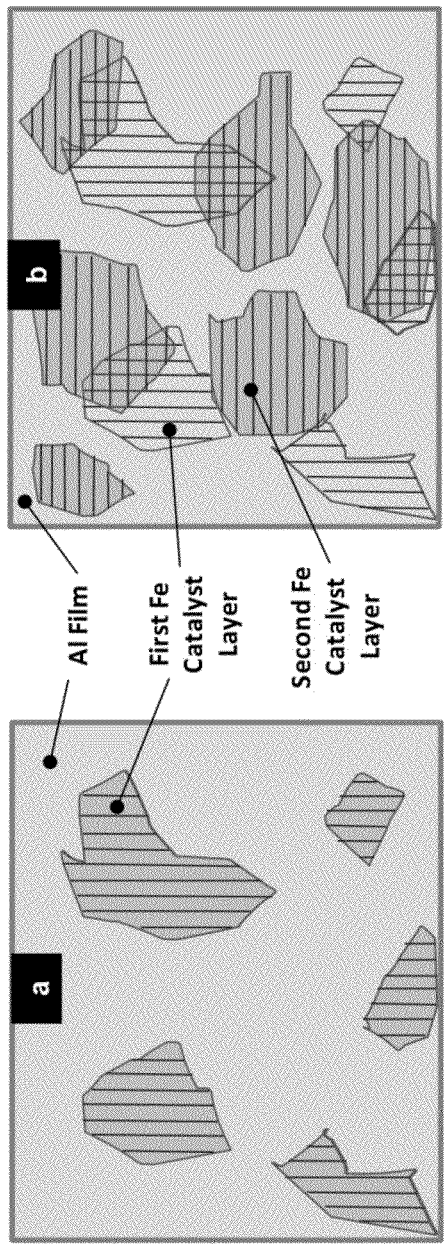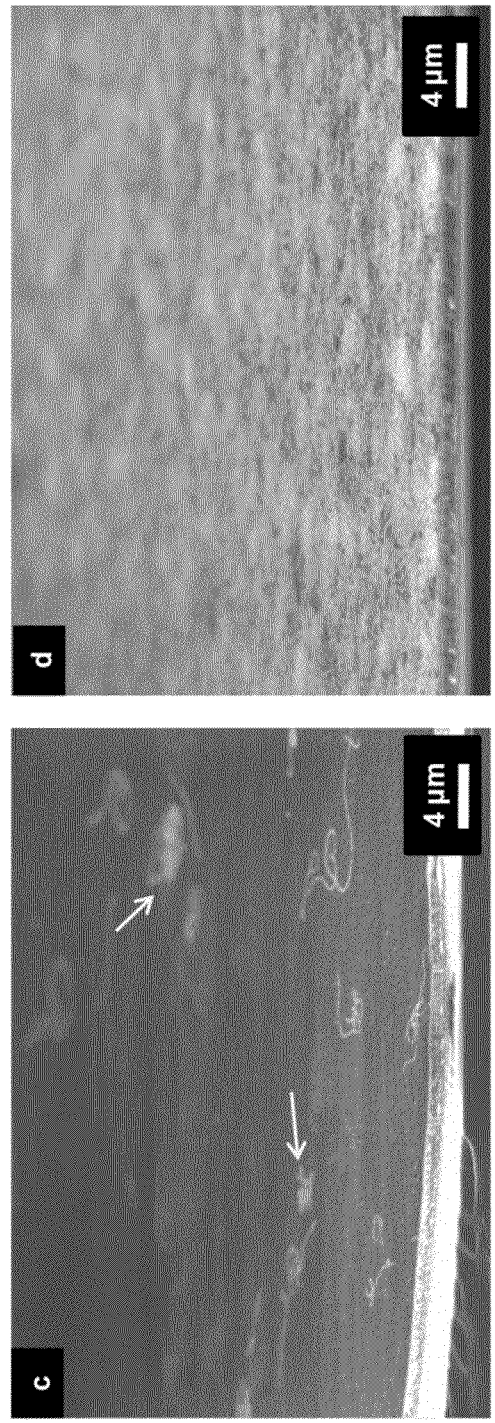
FIG. 3.3

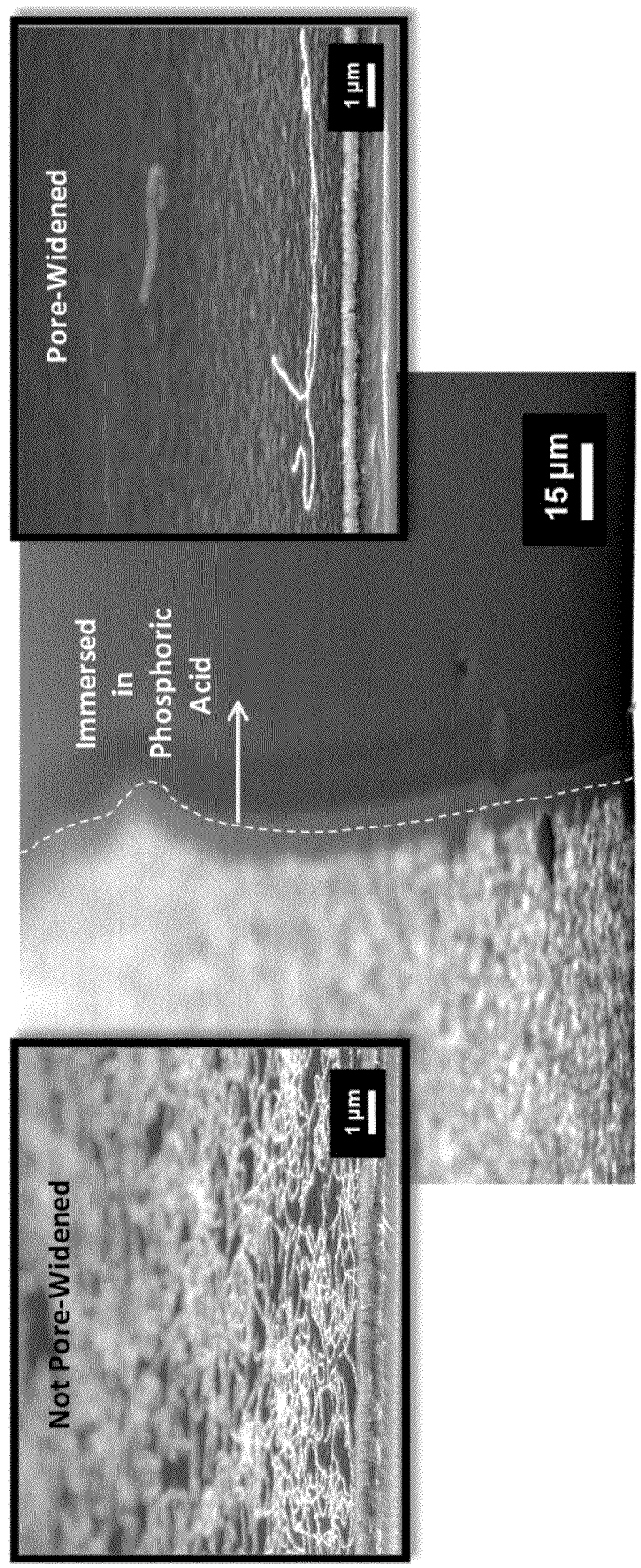
FIG. 3.4

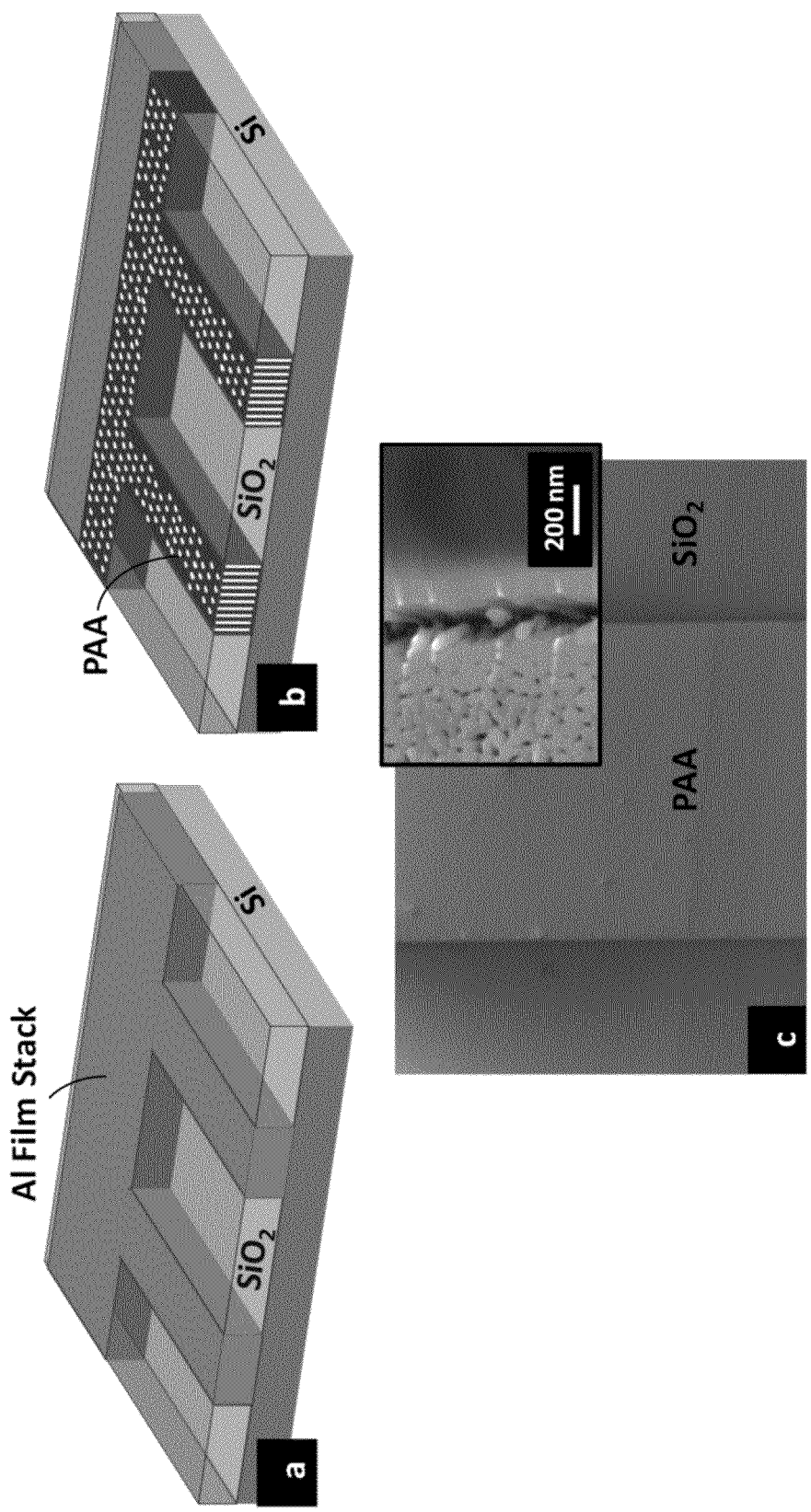
FIG. 3.5

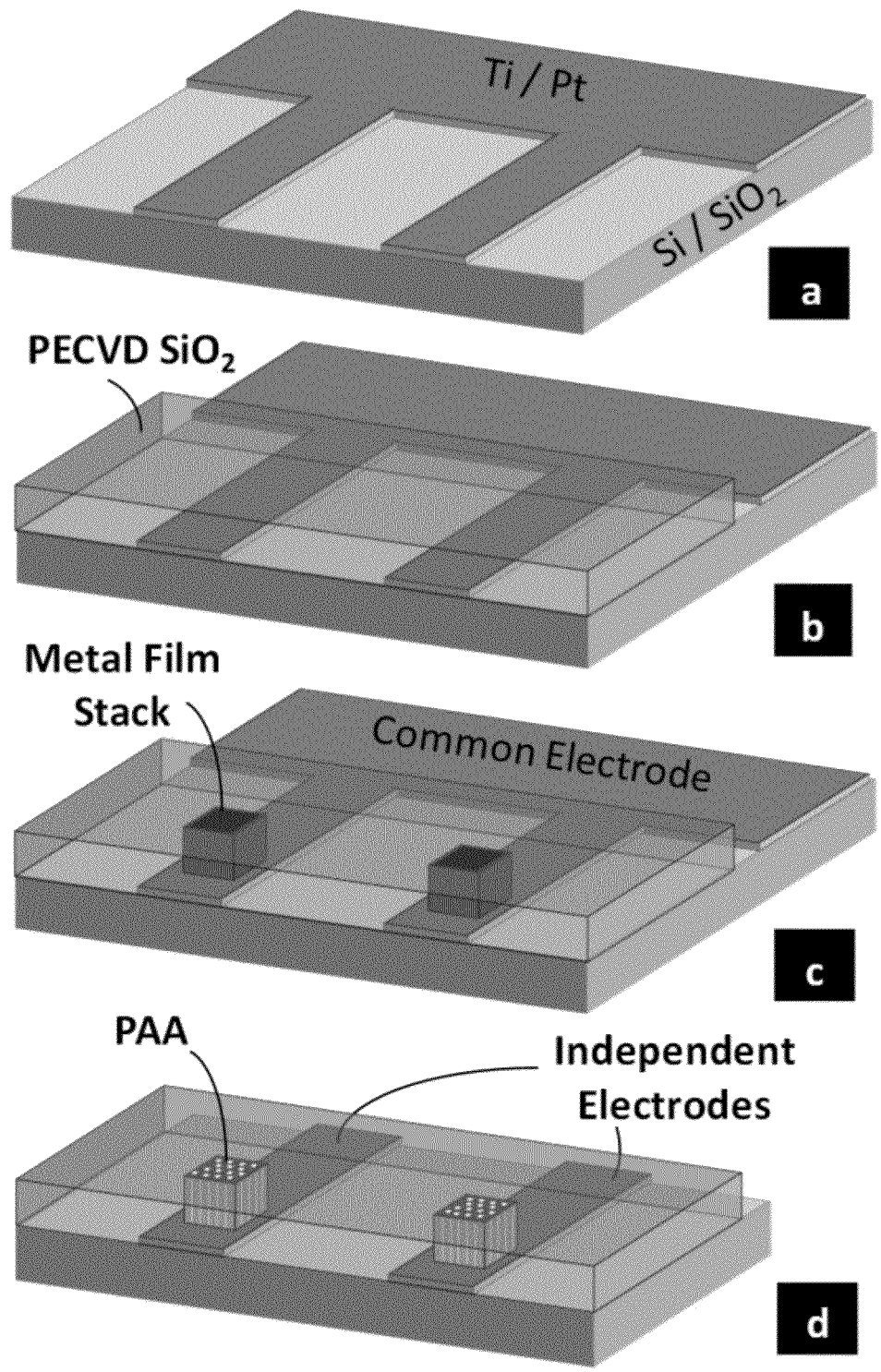
FIG. 3.6

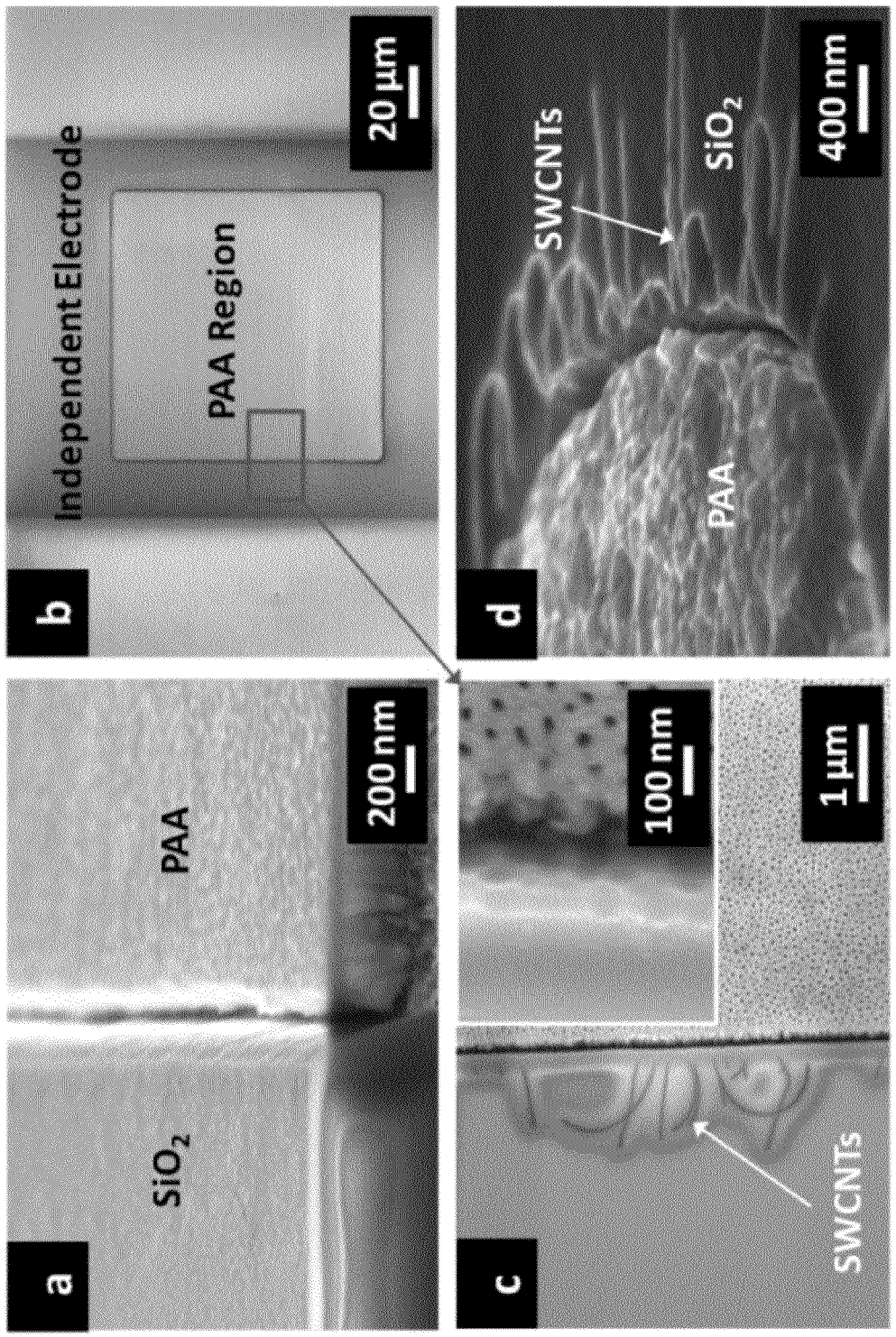
FIG. 3.7

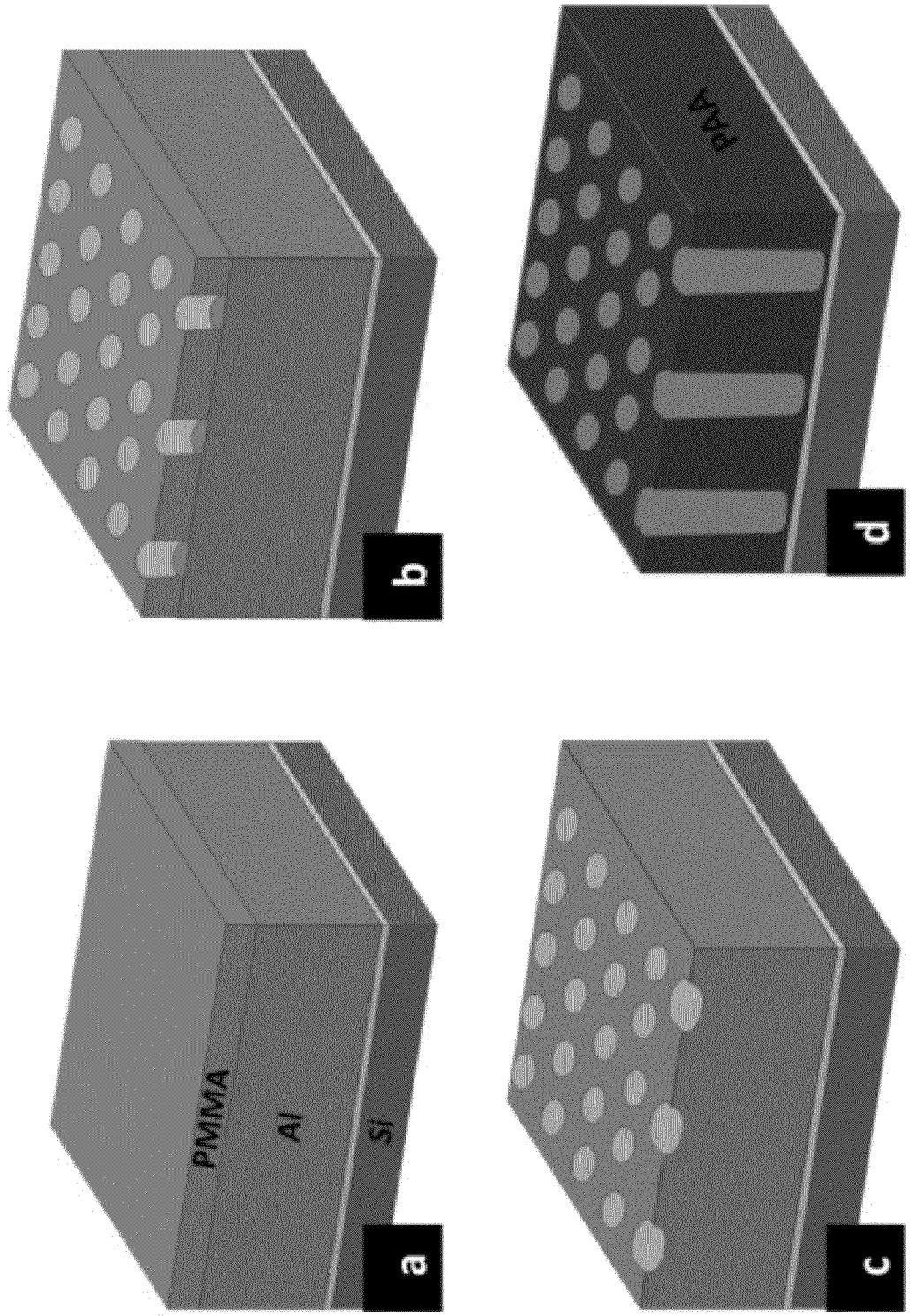
FIG. 3.8

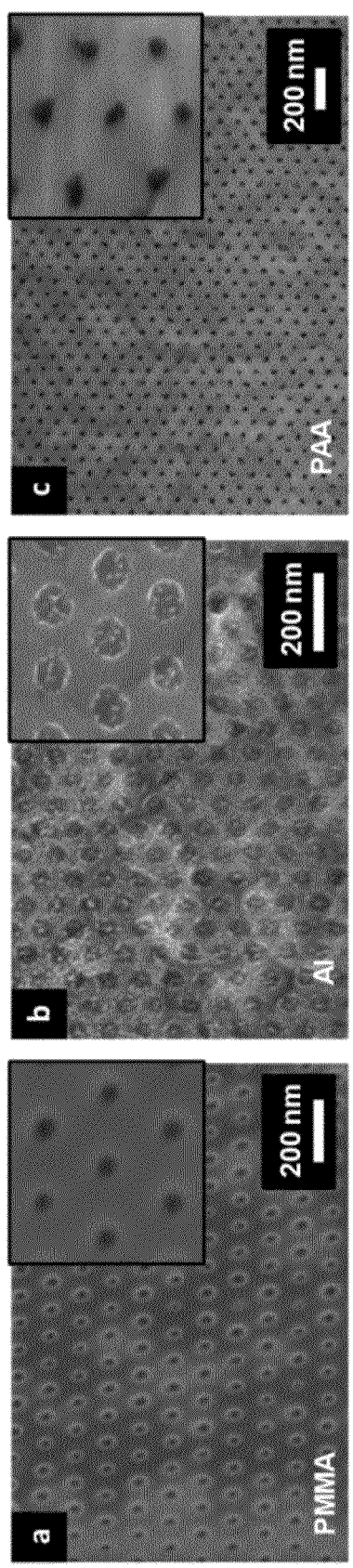
FIG. 3.9

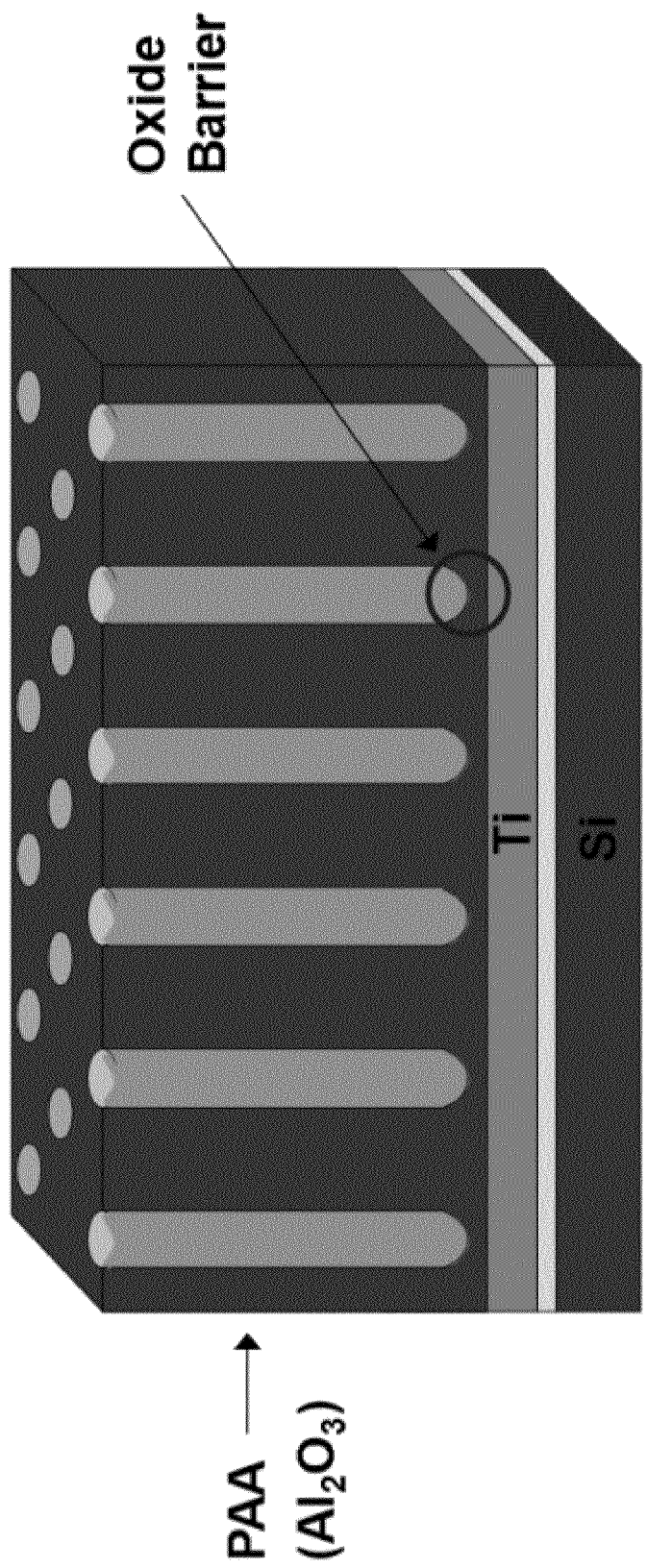
FIG. 4.1

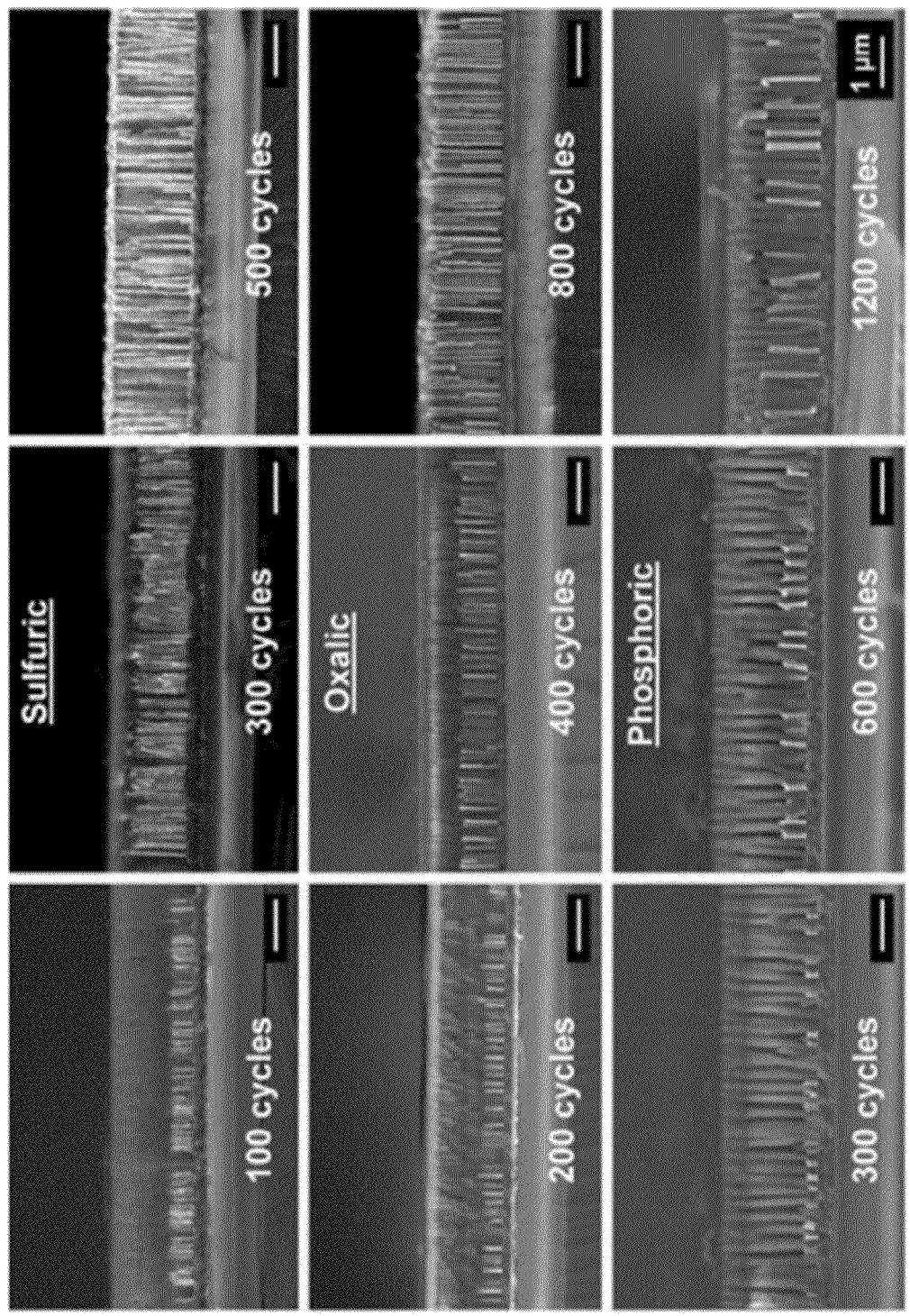
FIG. 4.2

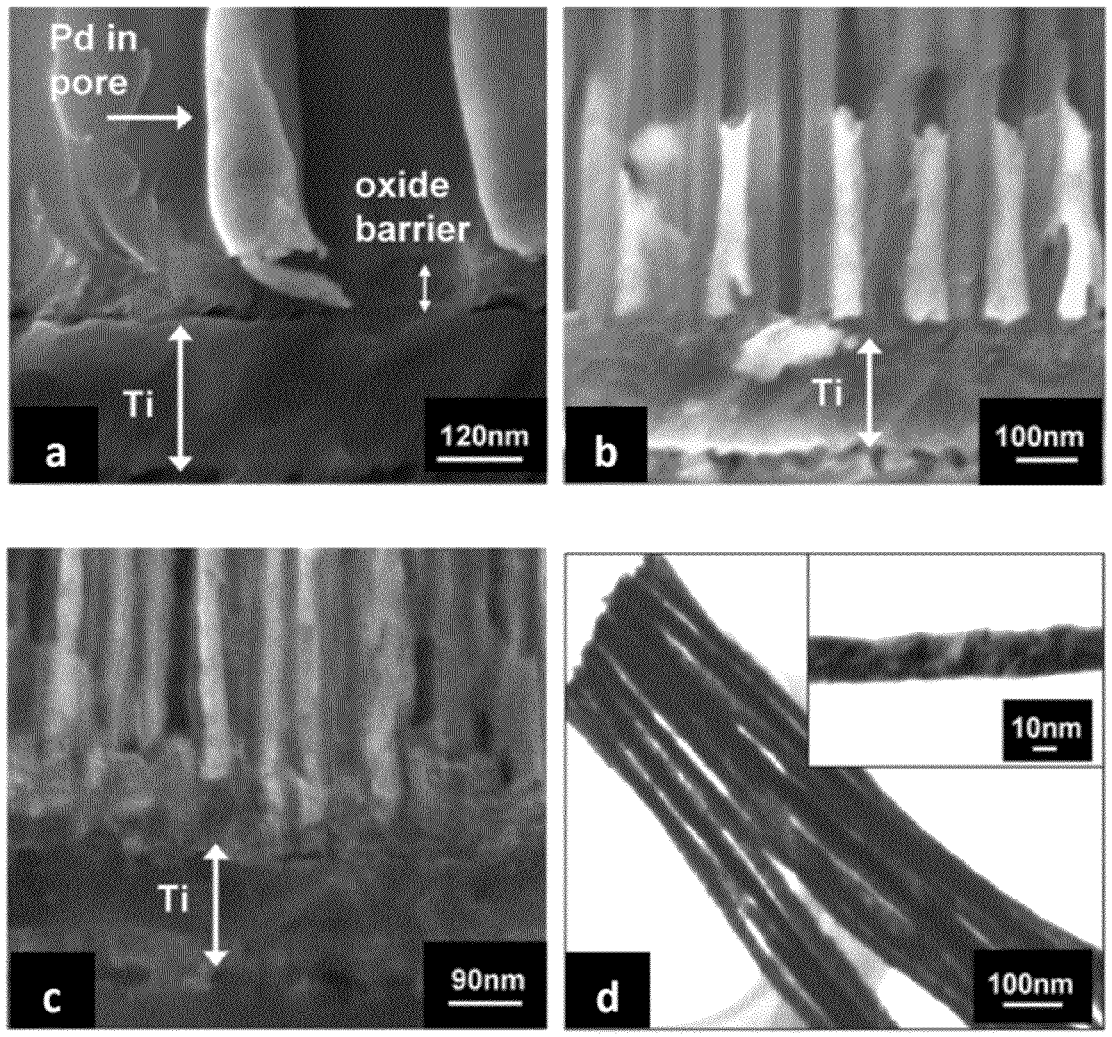
FIG. 4.3

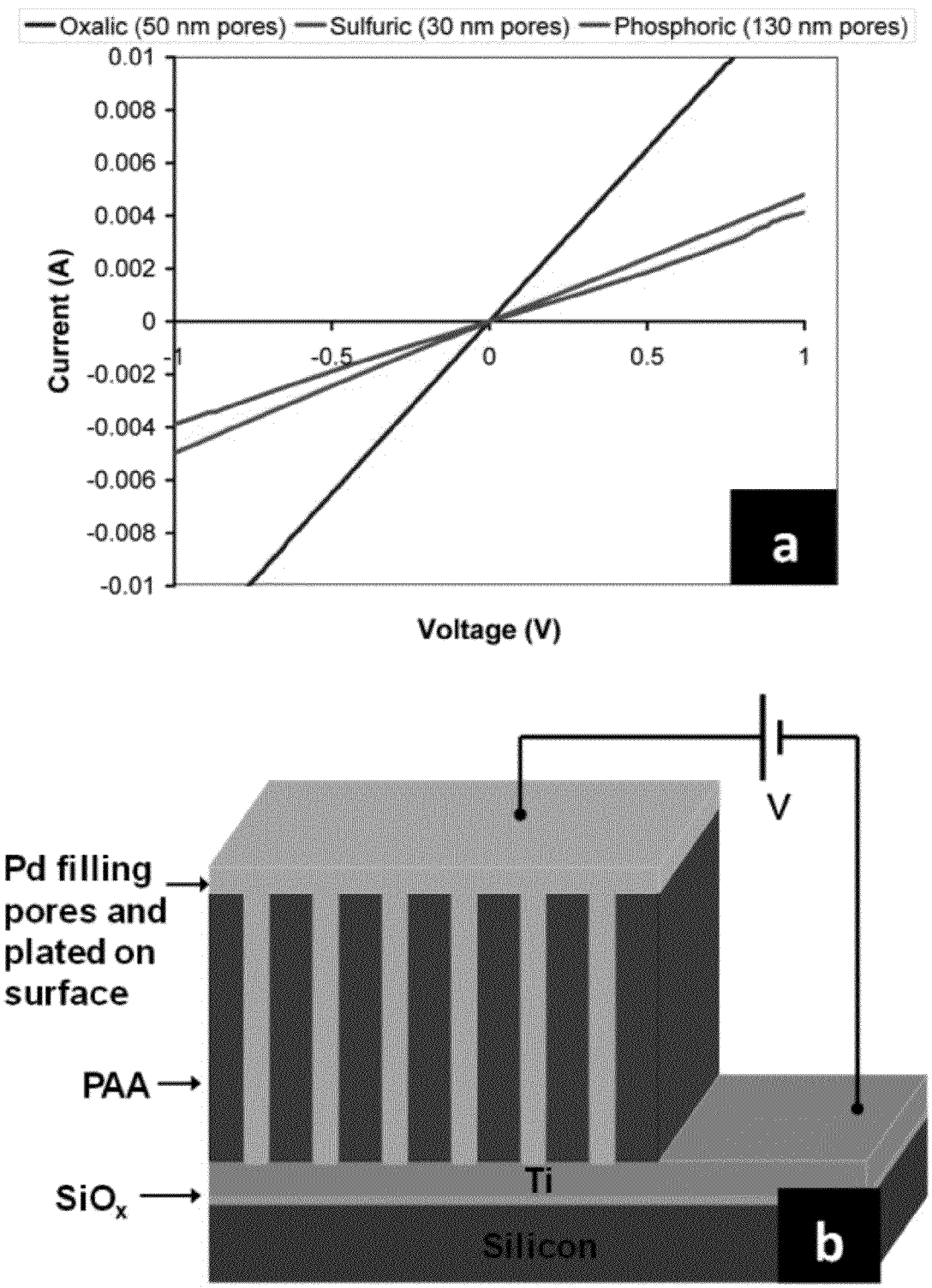
FIG. 4.4

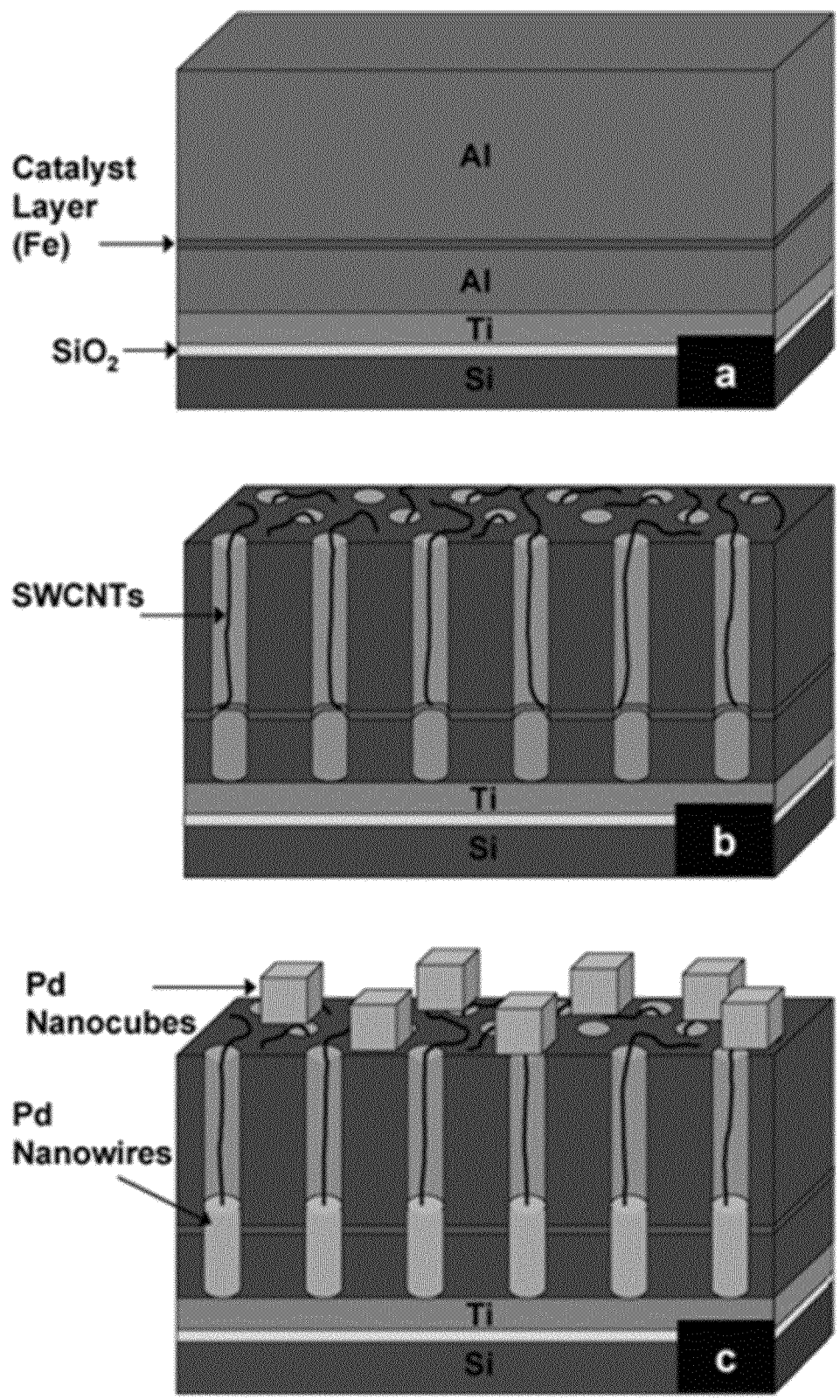
FIG. 5.1

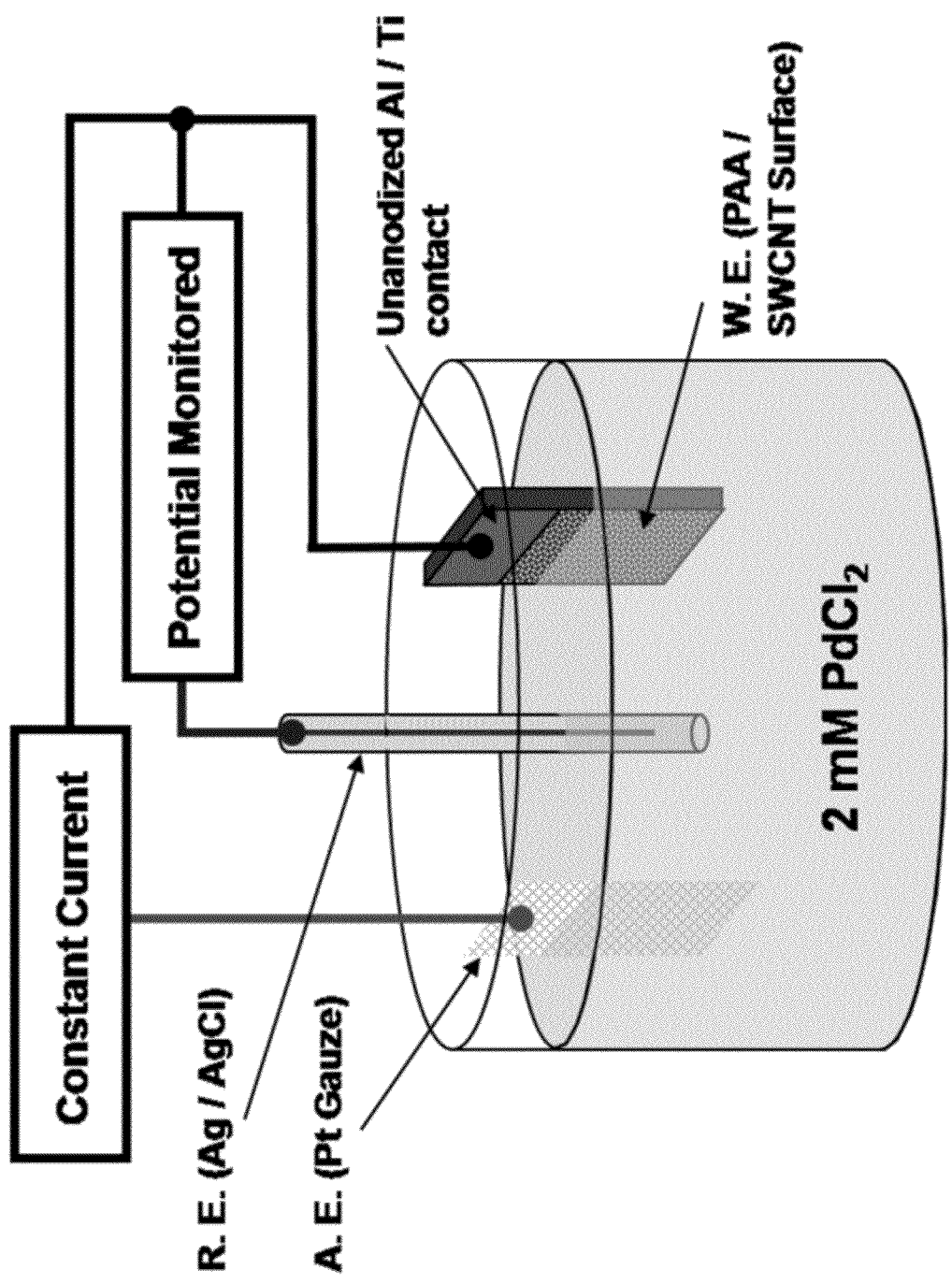
FIG. 5.2

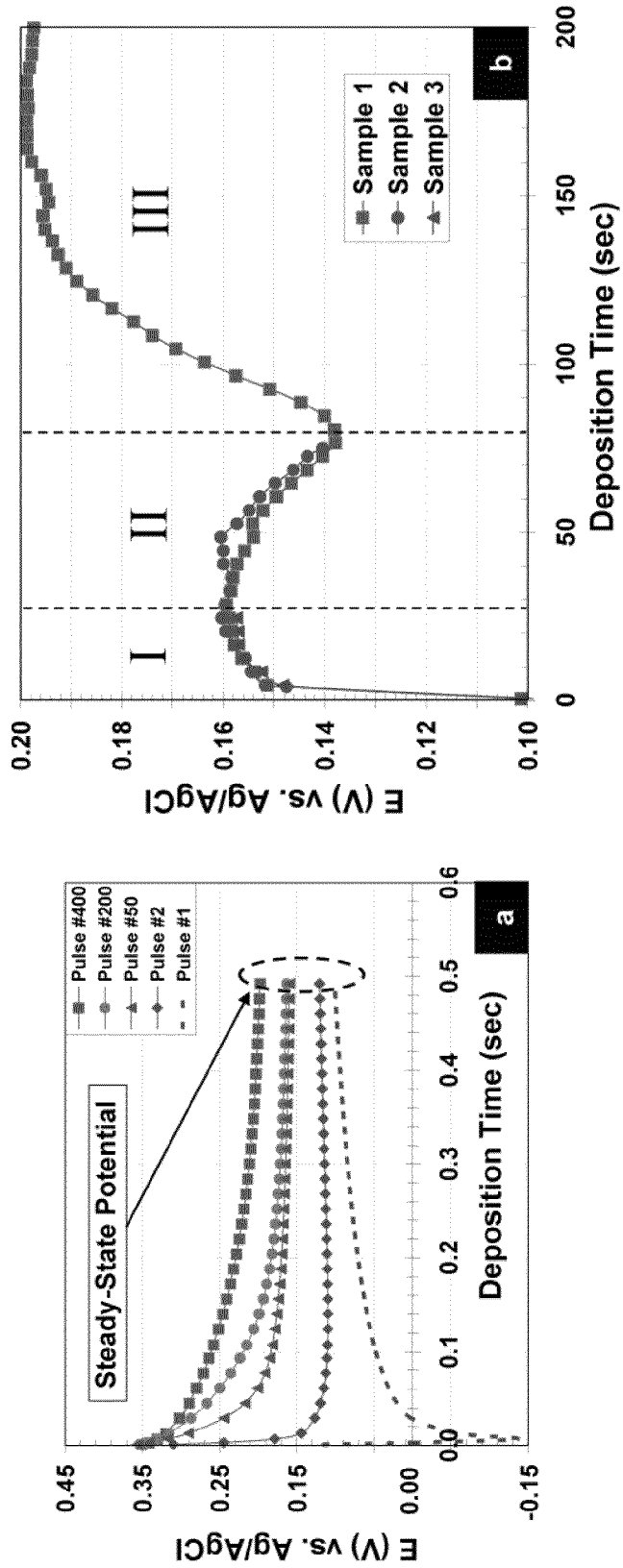
FIG. 5.3

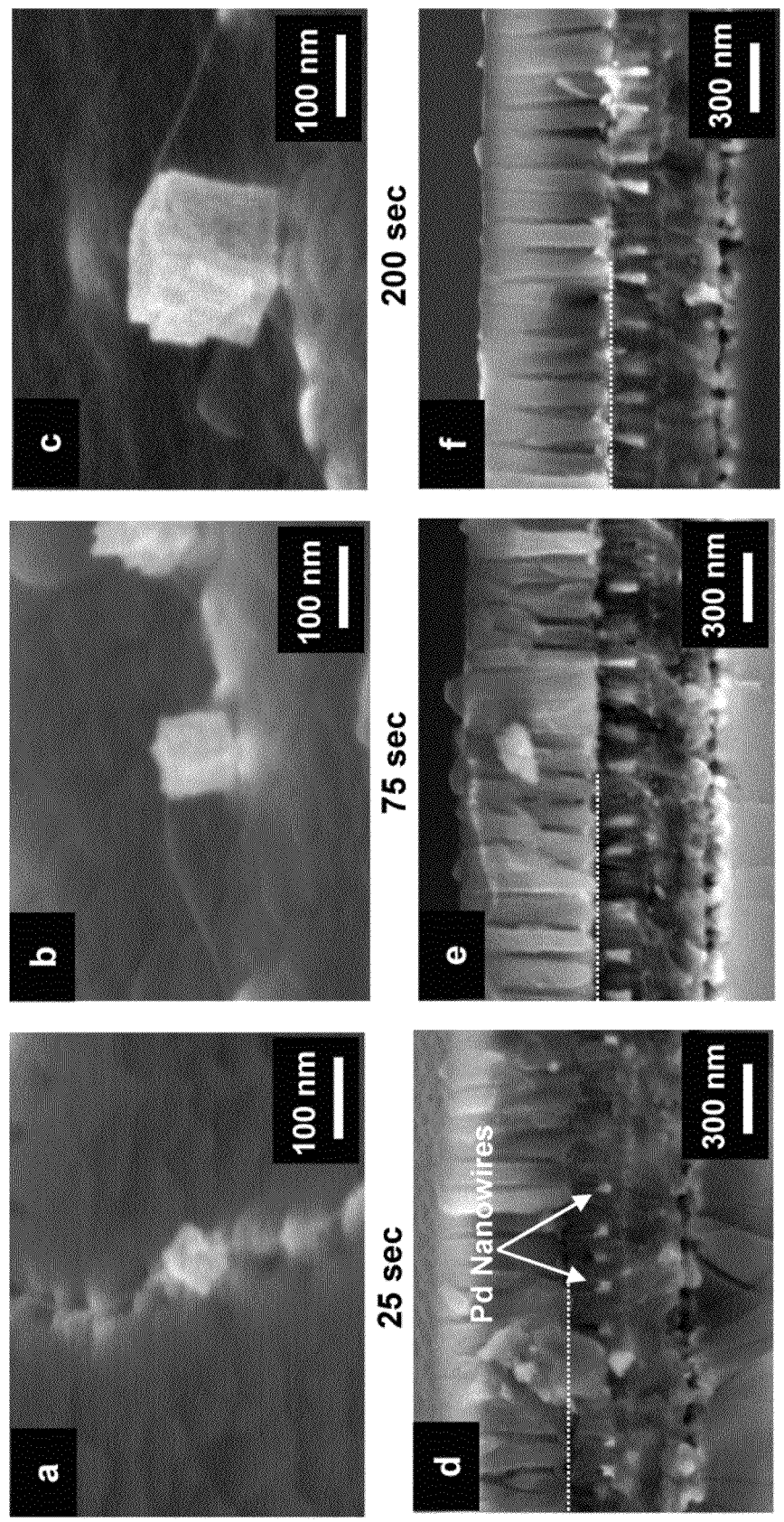
FIG. 5.4

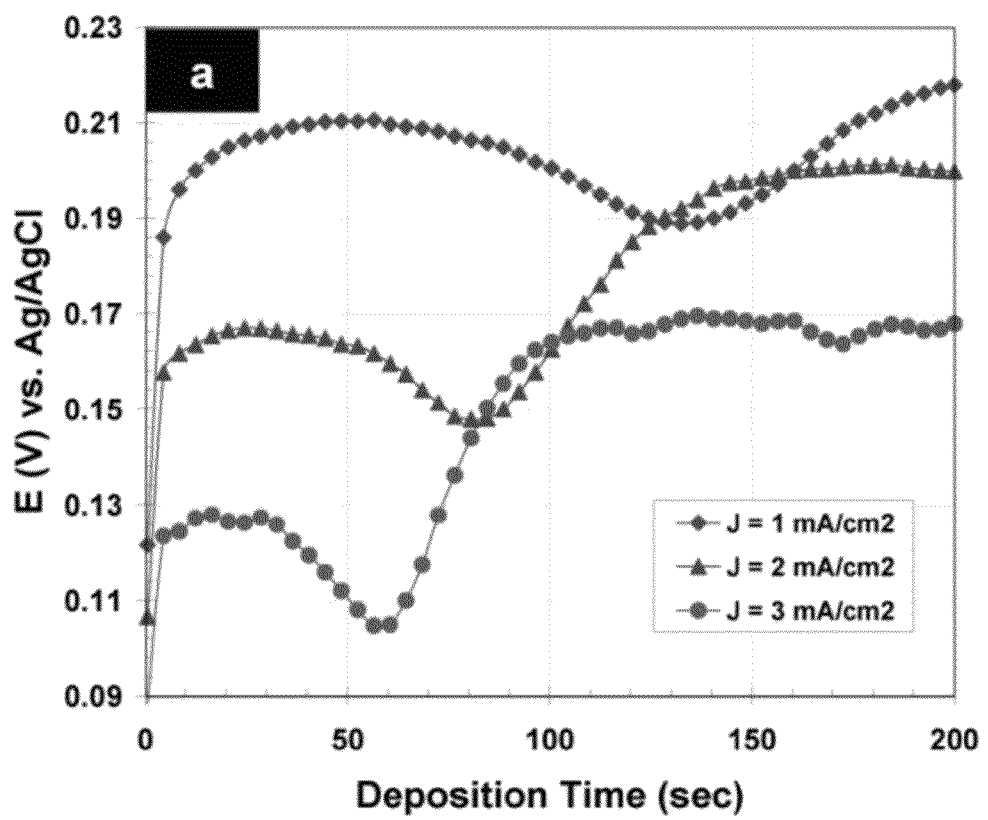
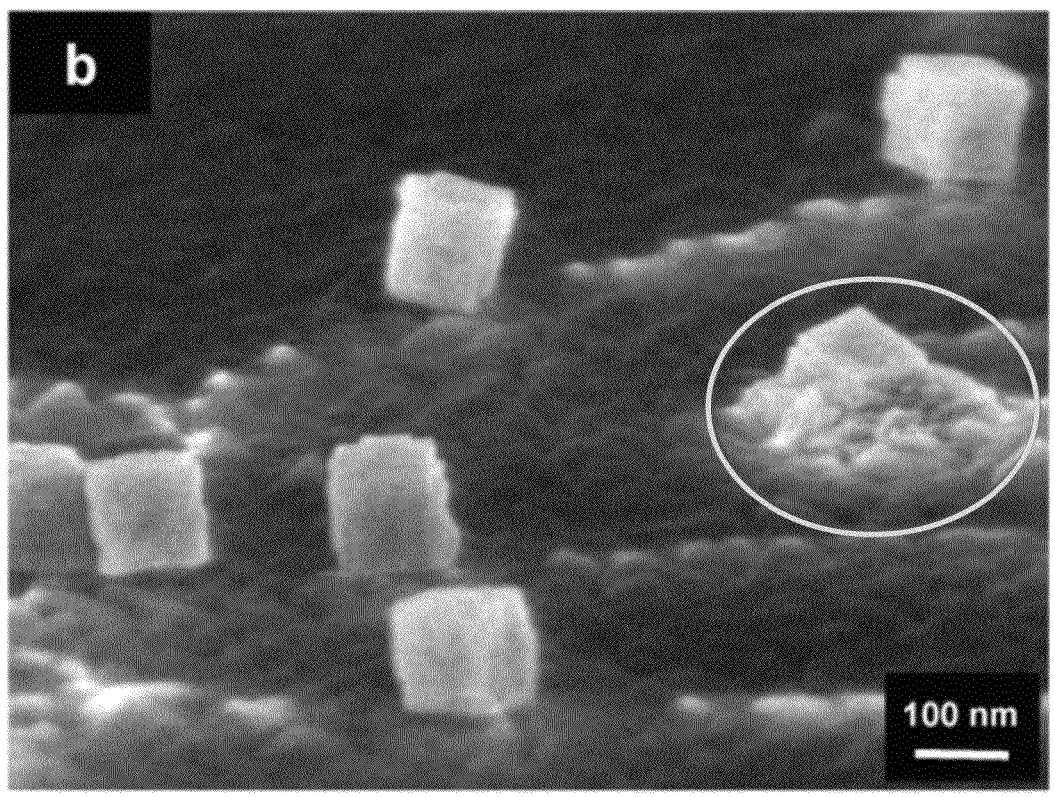
FIG. 5.5

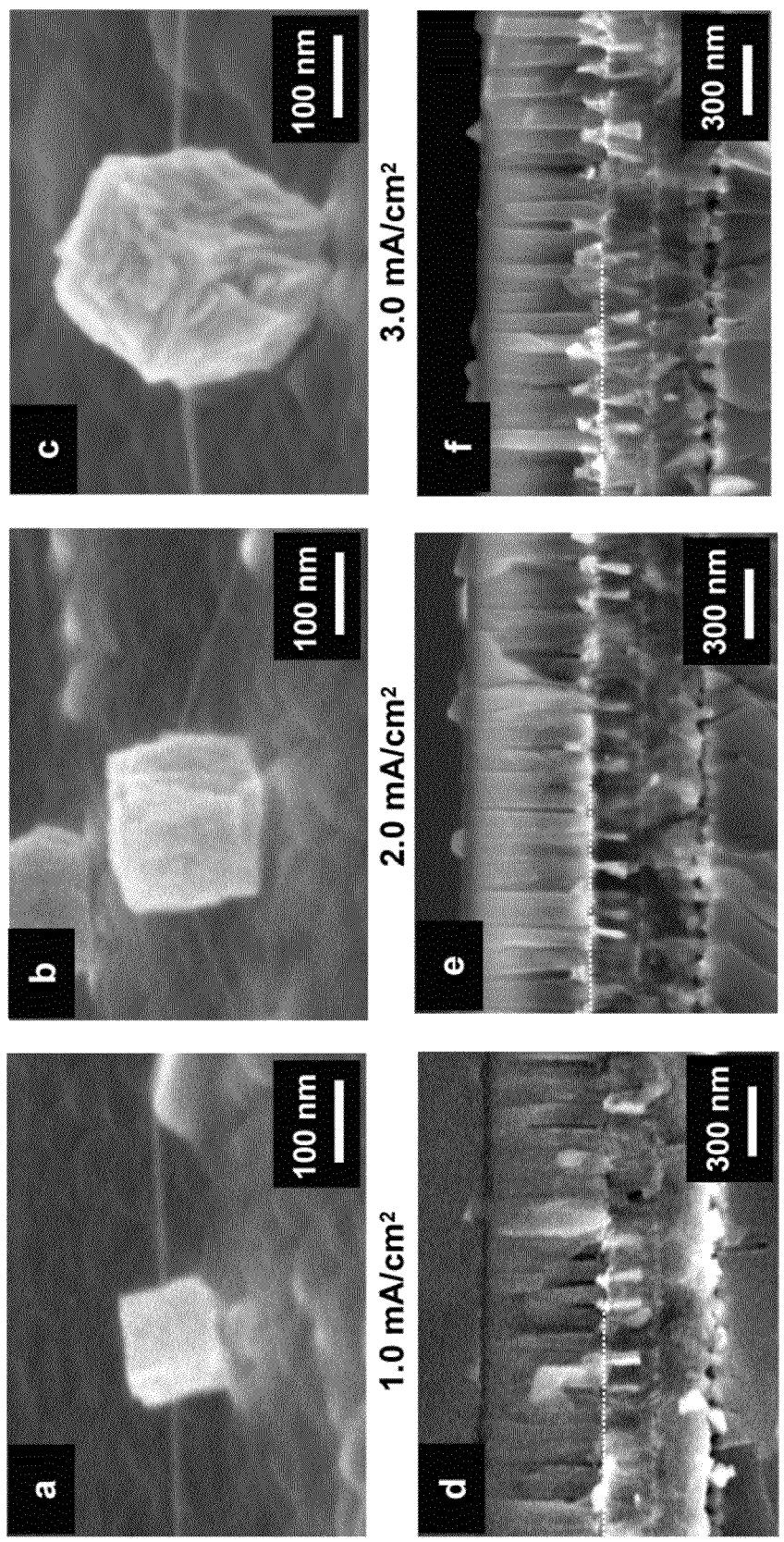
FIG. 5.6

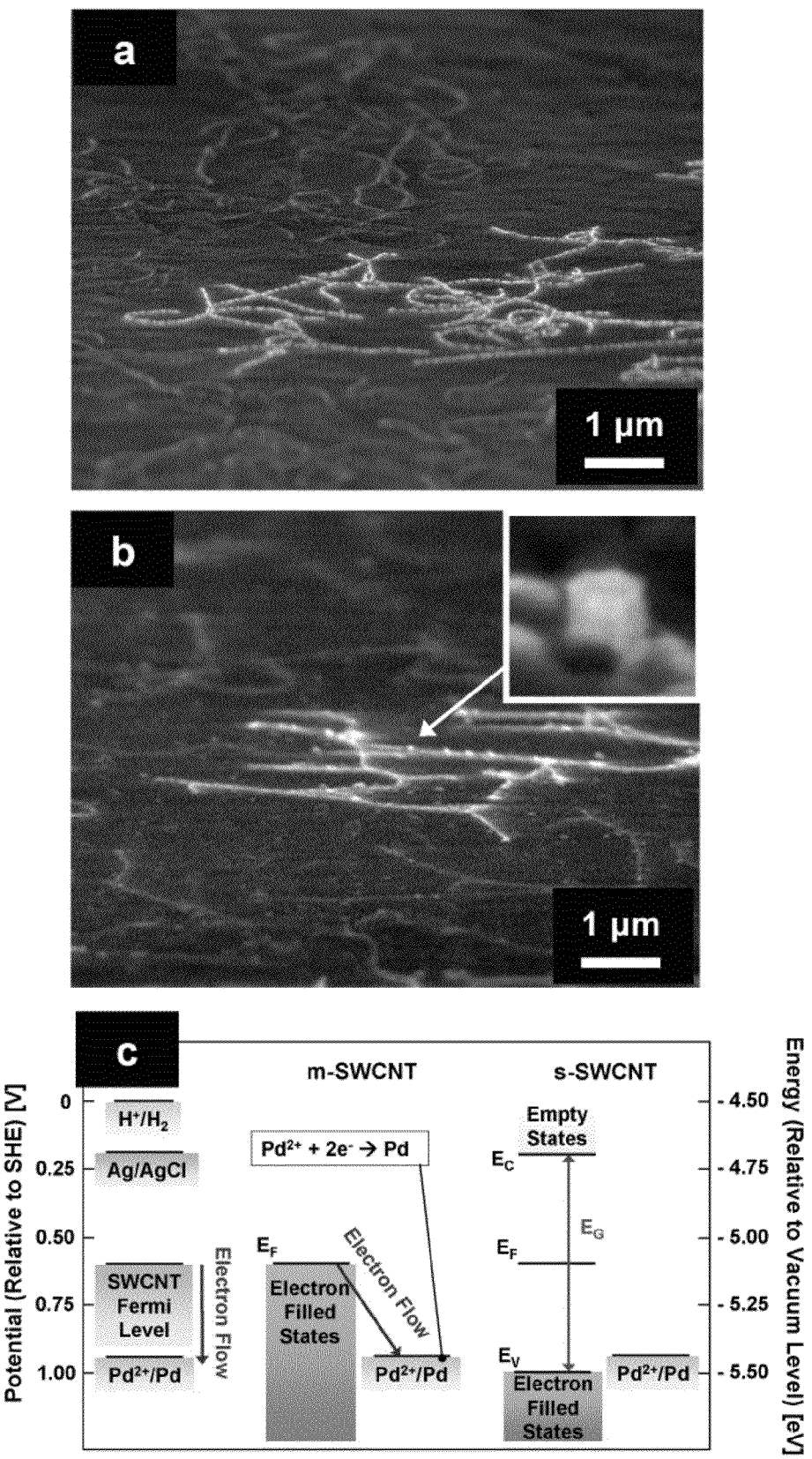
FIG. 5.7

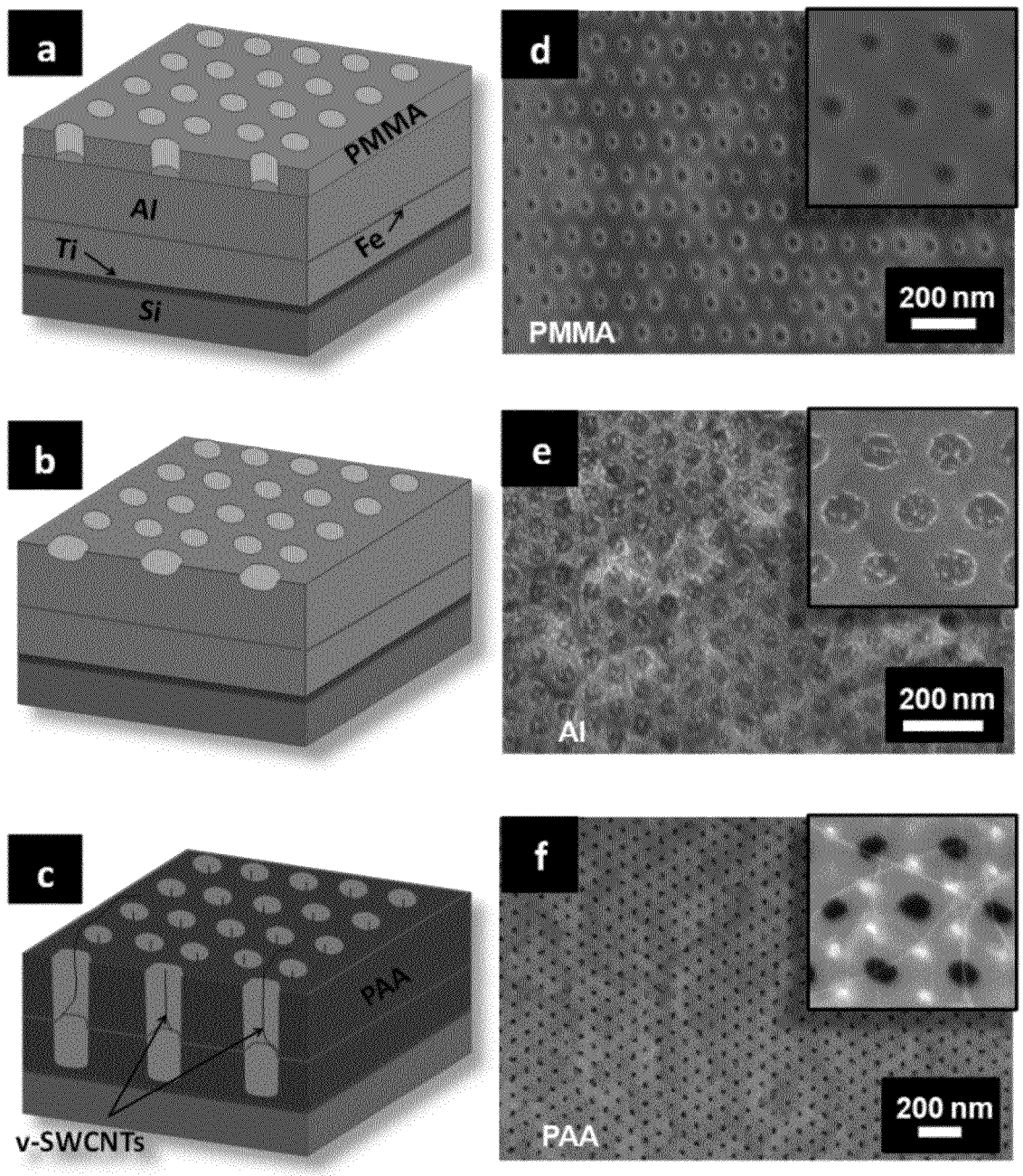
FIG. 6.1

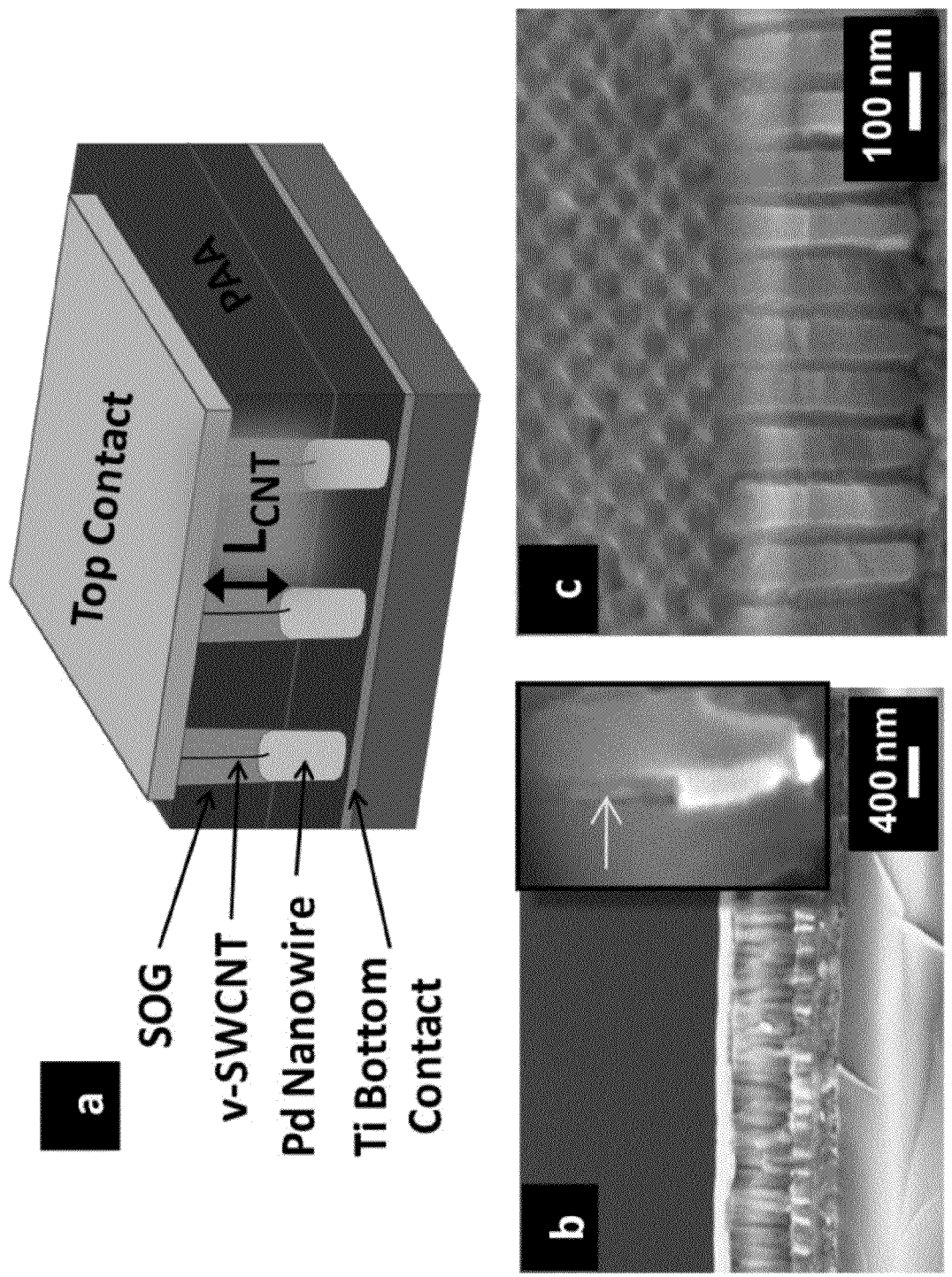
FIG. 6.2

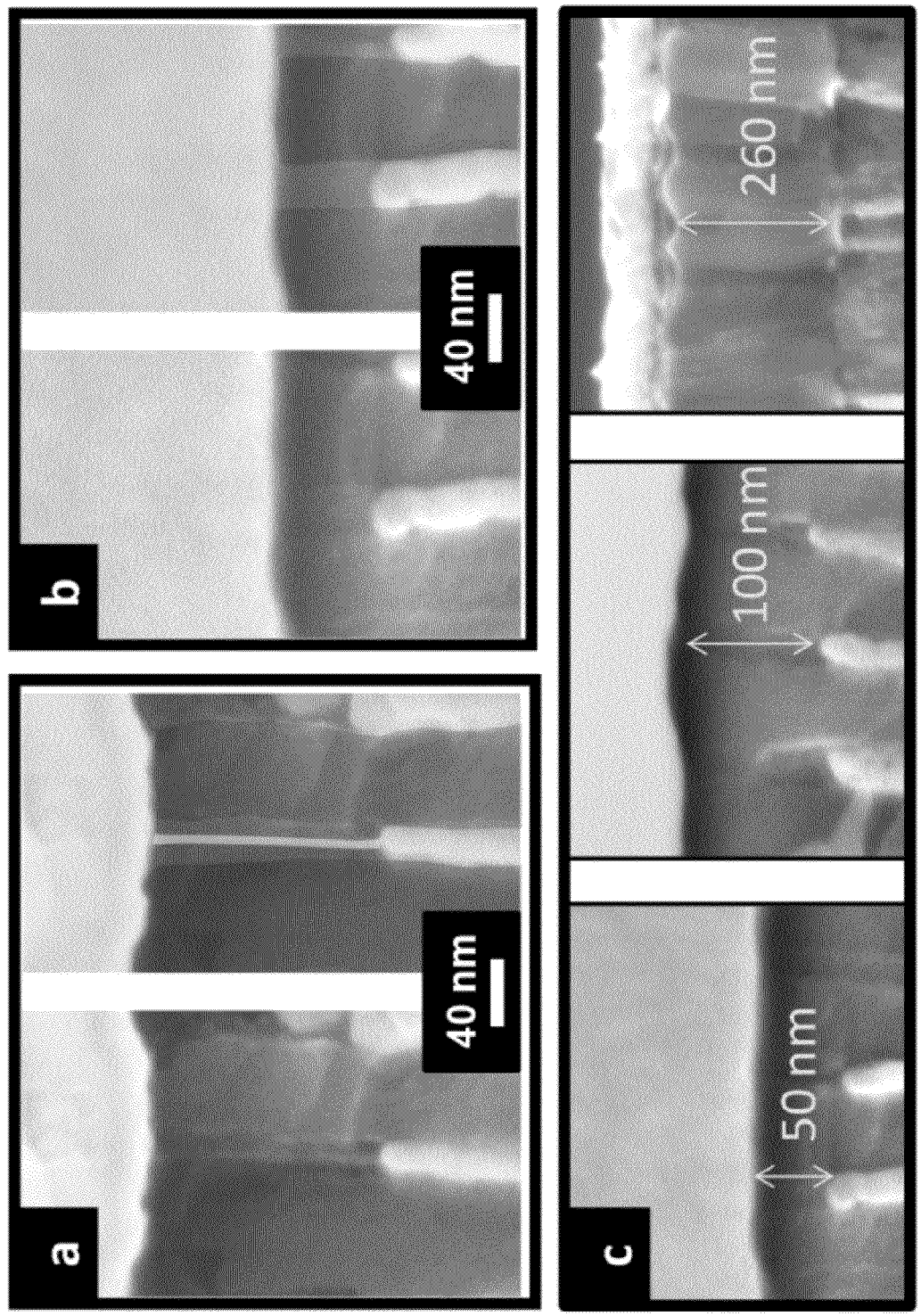
FIG. 6.3

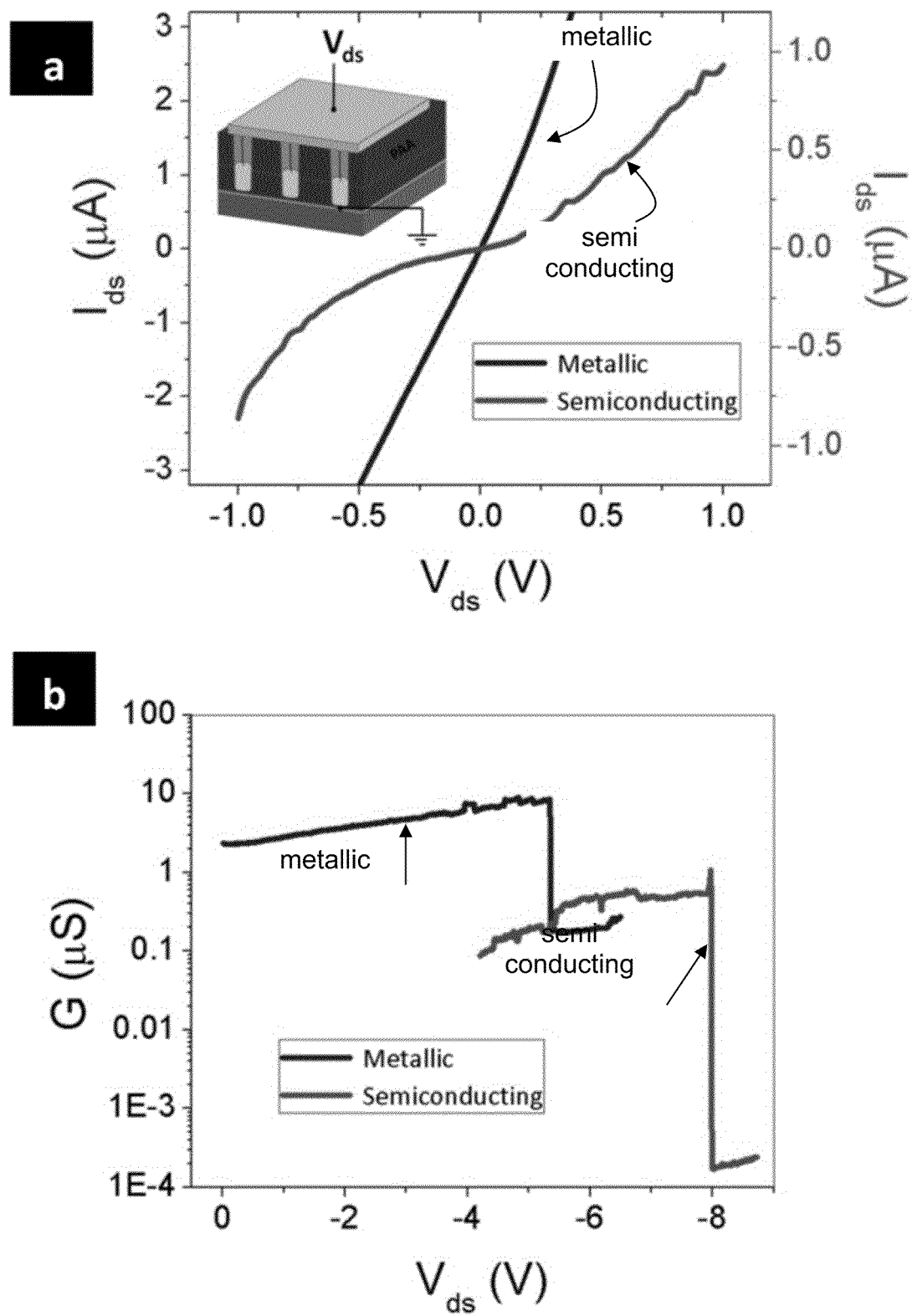
FIG. 6.4

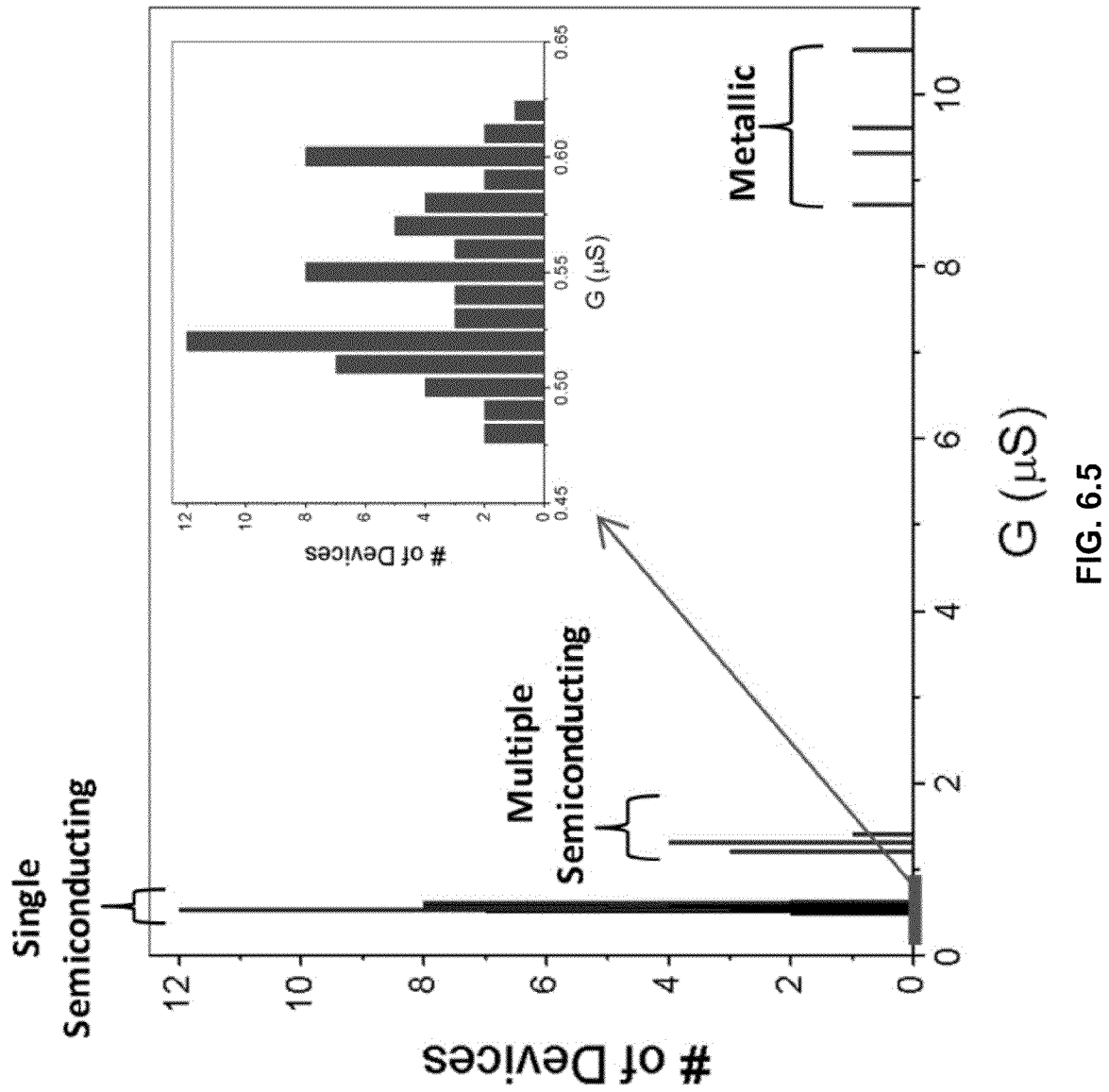
FIG. 6.5

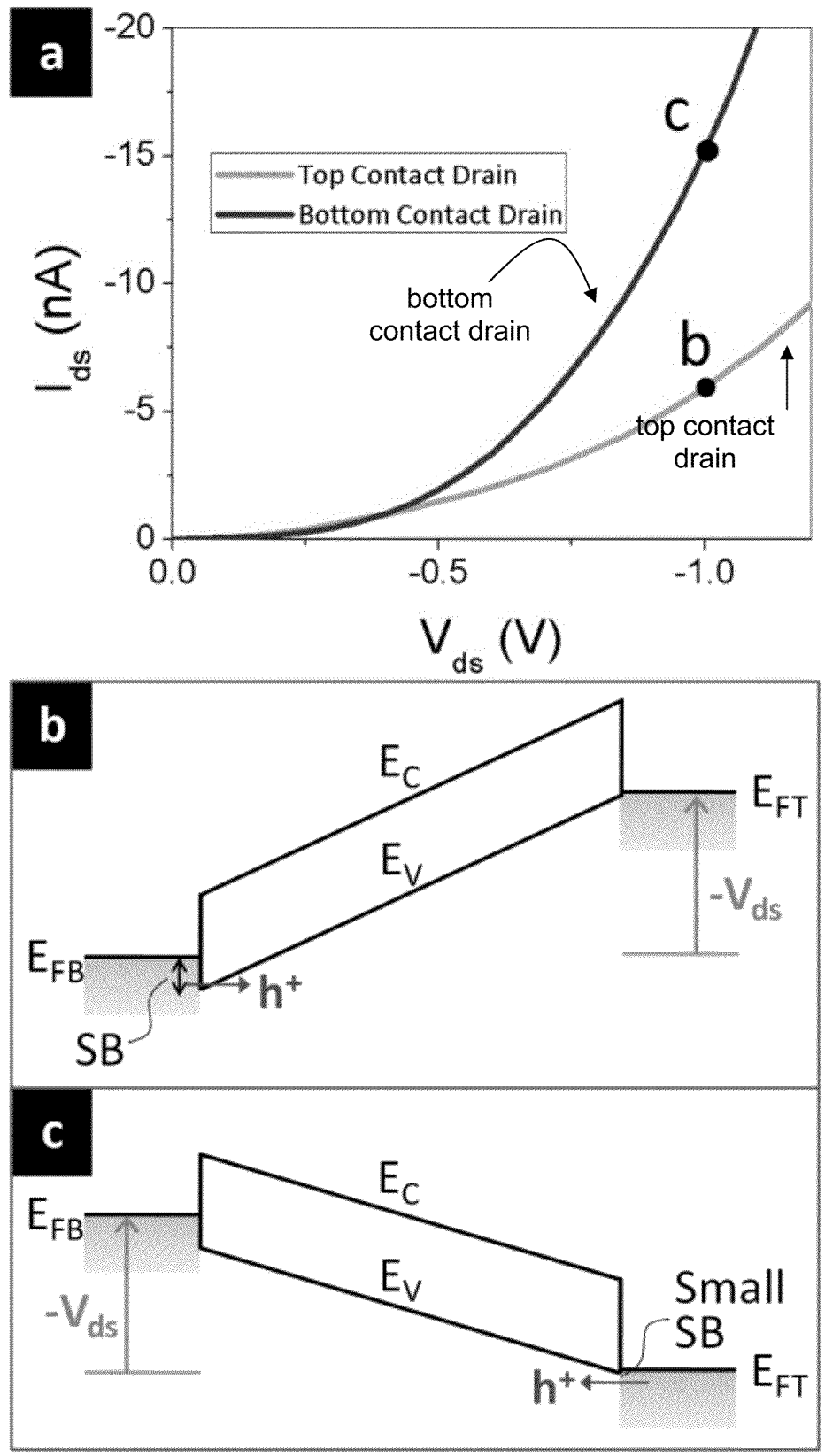
FIG. 6.6

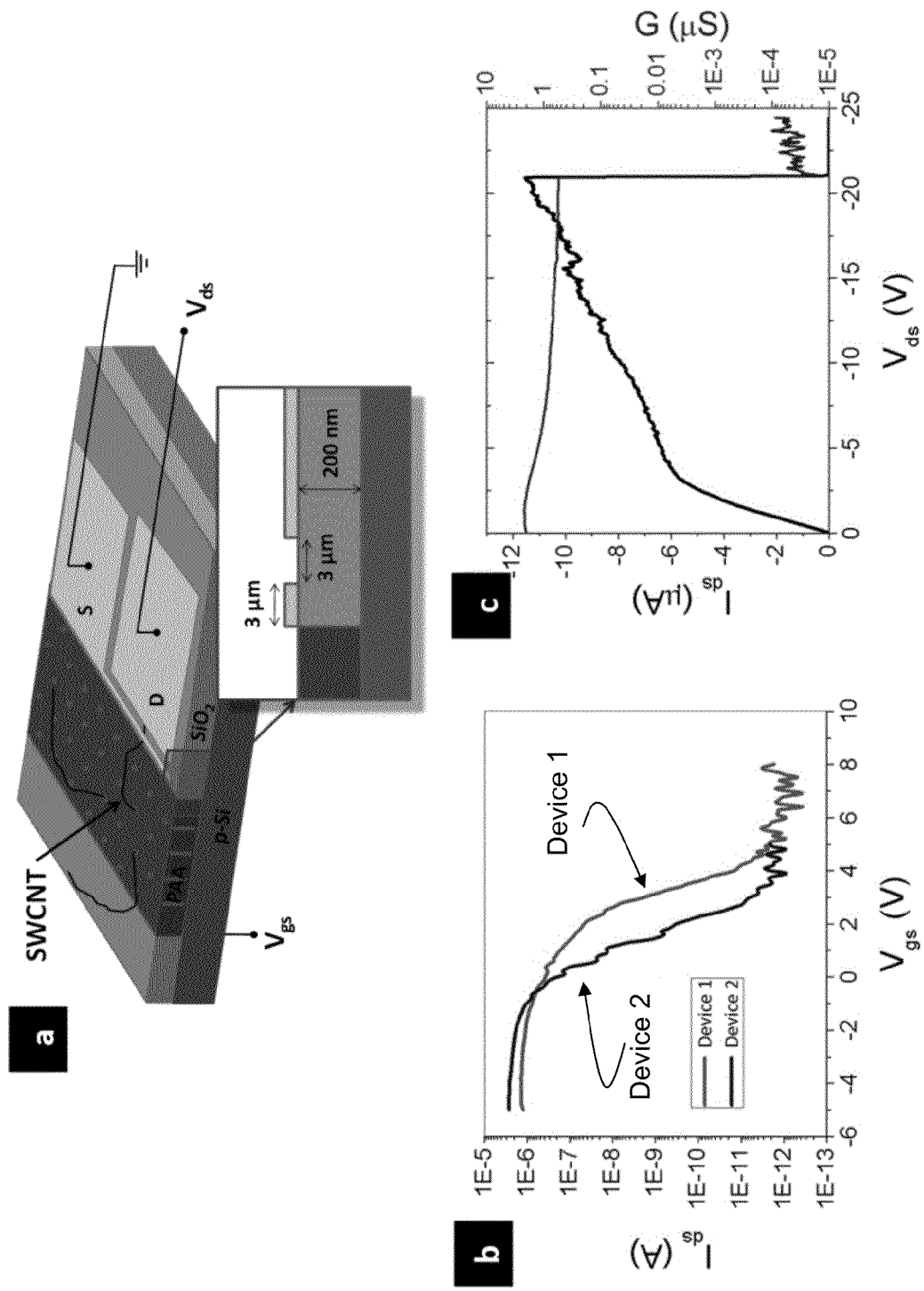
FIG. 6.7

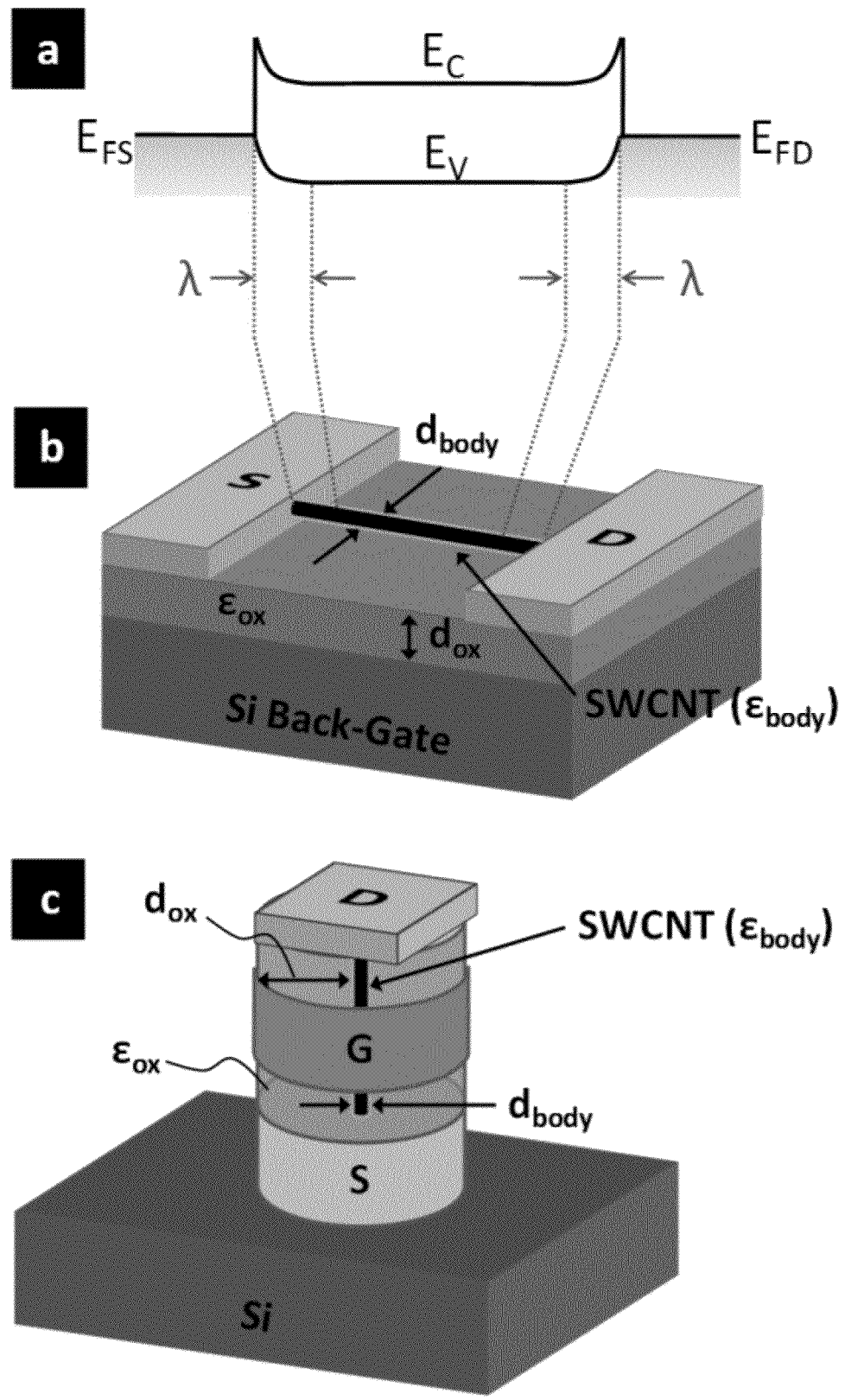
FIG. 7.1

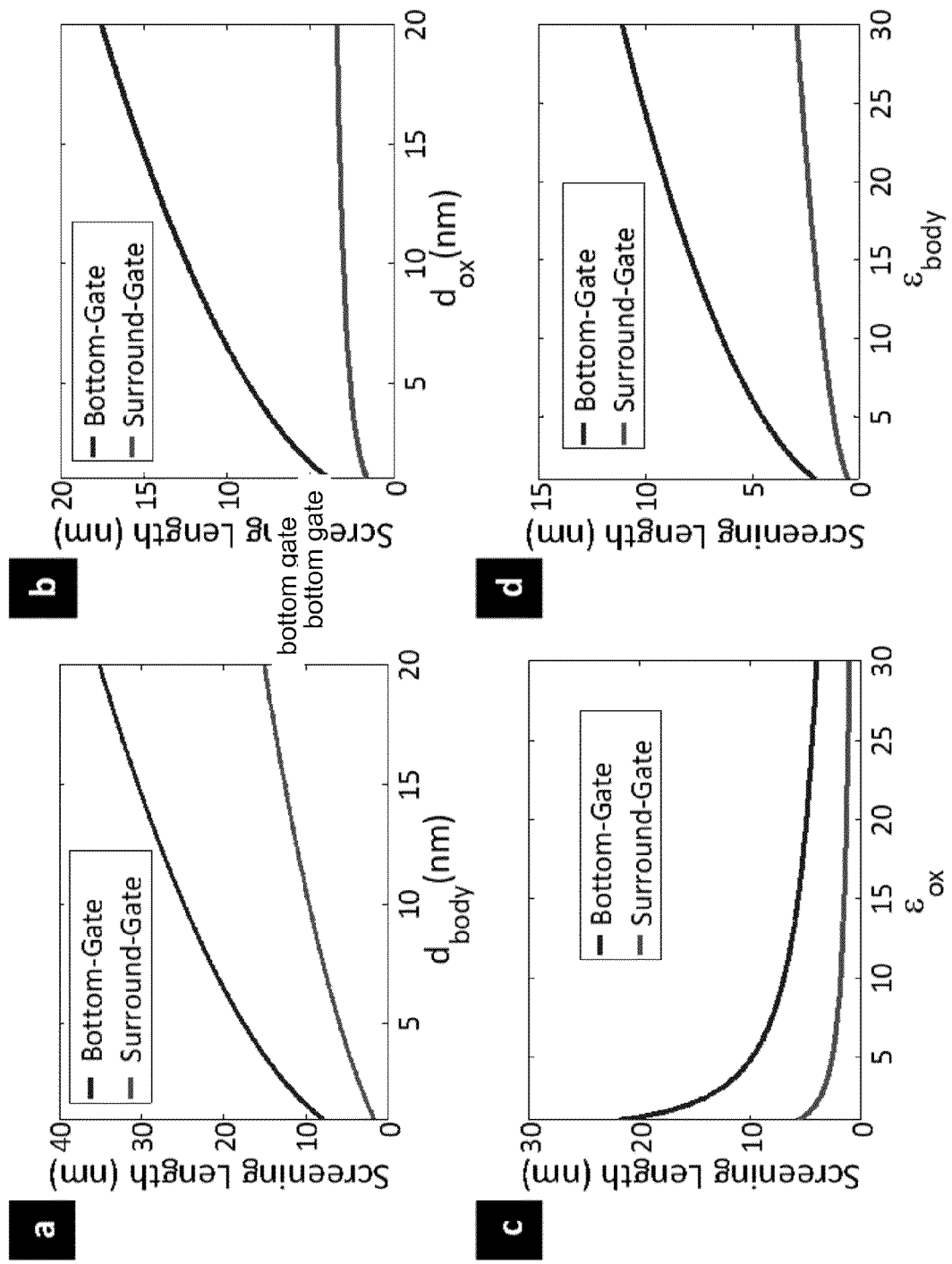
FIG. 7.2

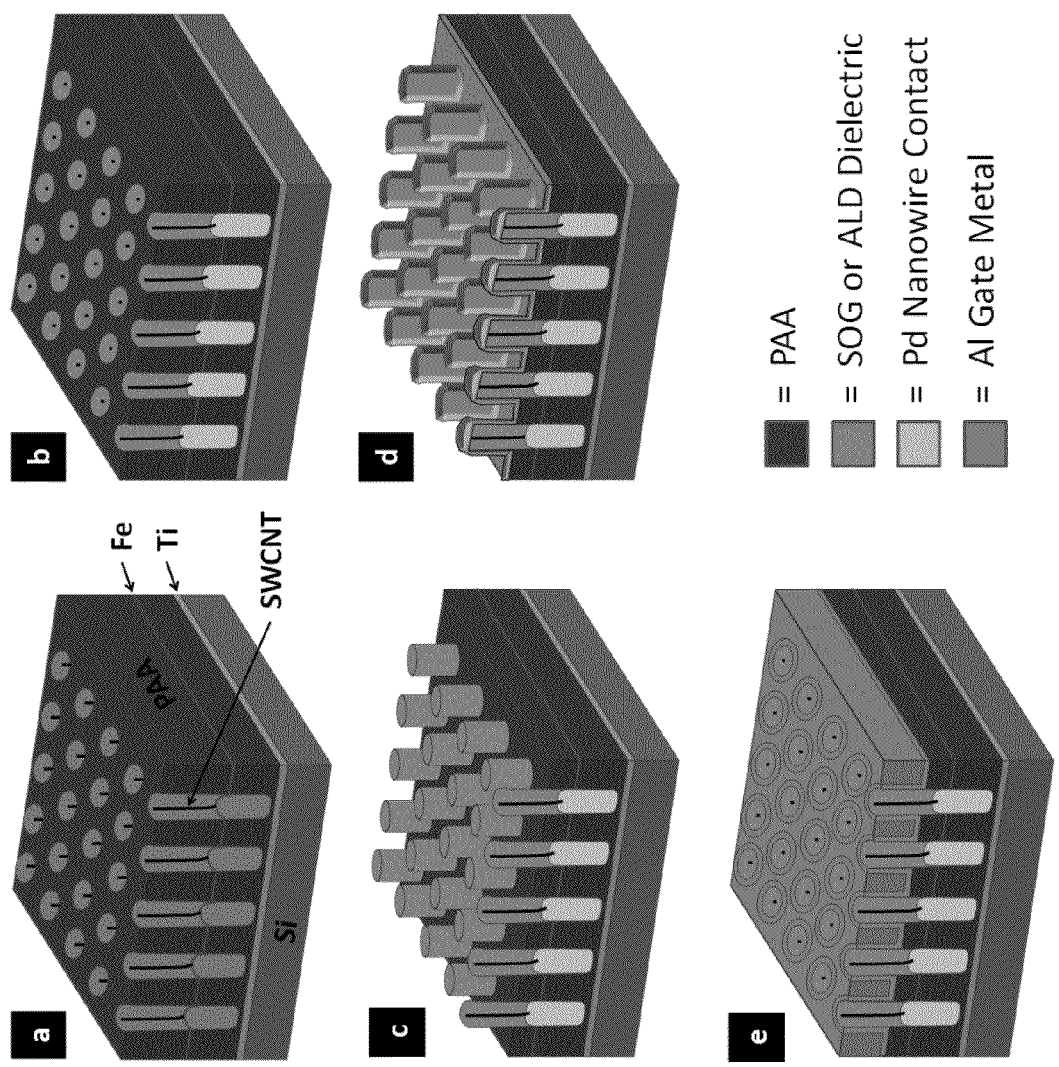
FIG. 7.3

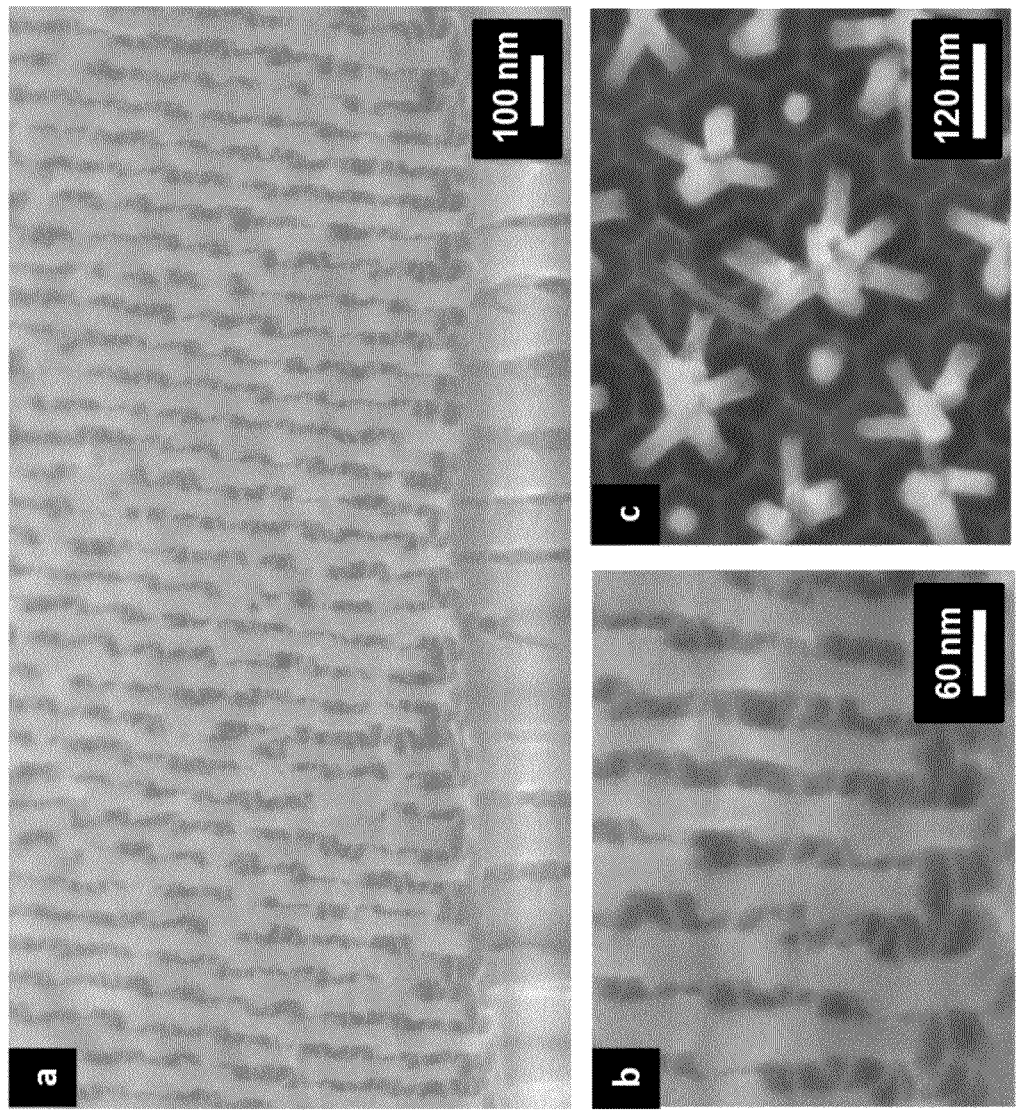
FIG. 7.4

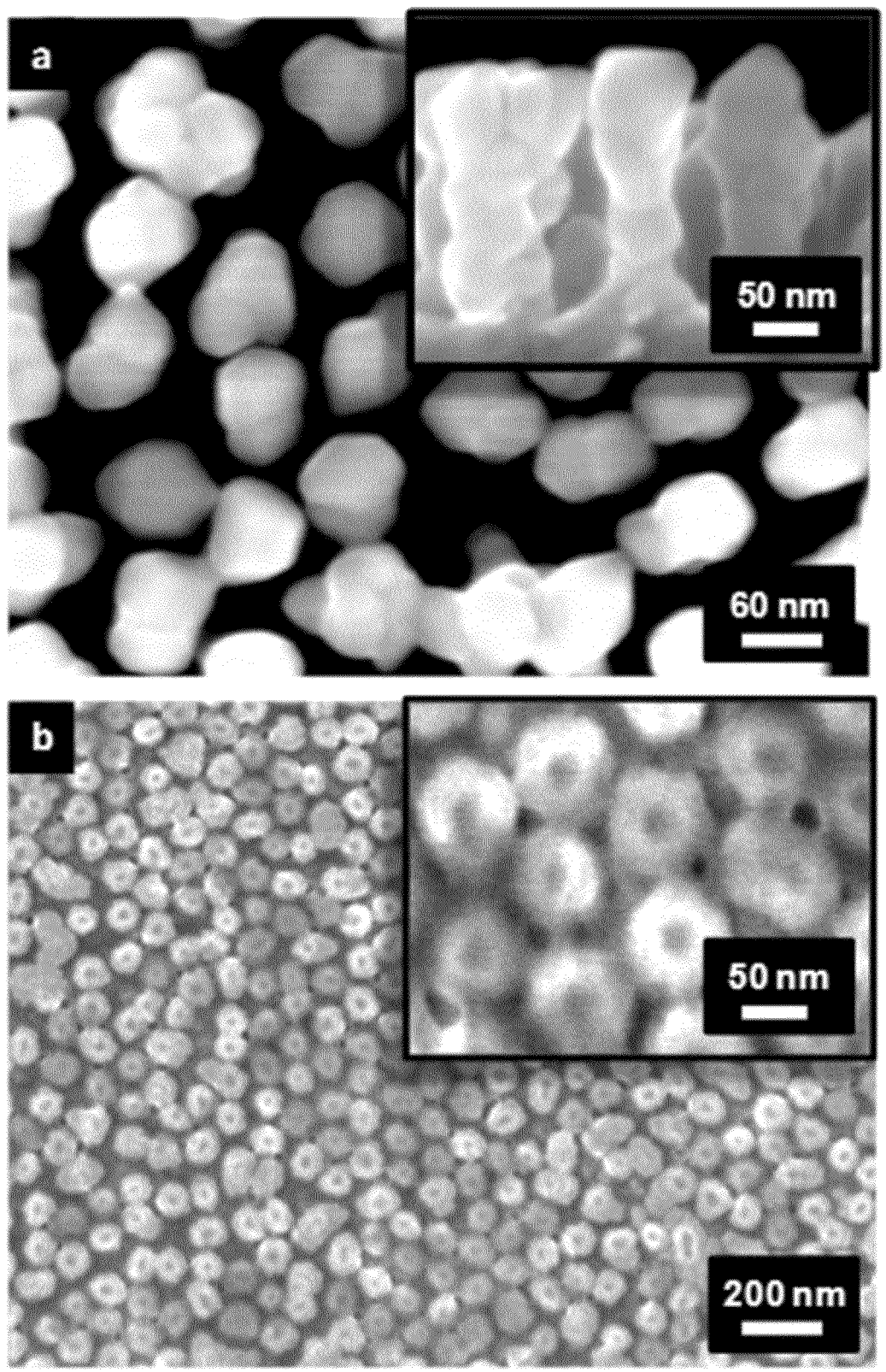
FIG. 7.5

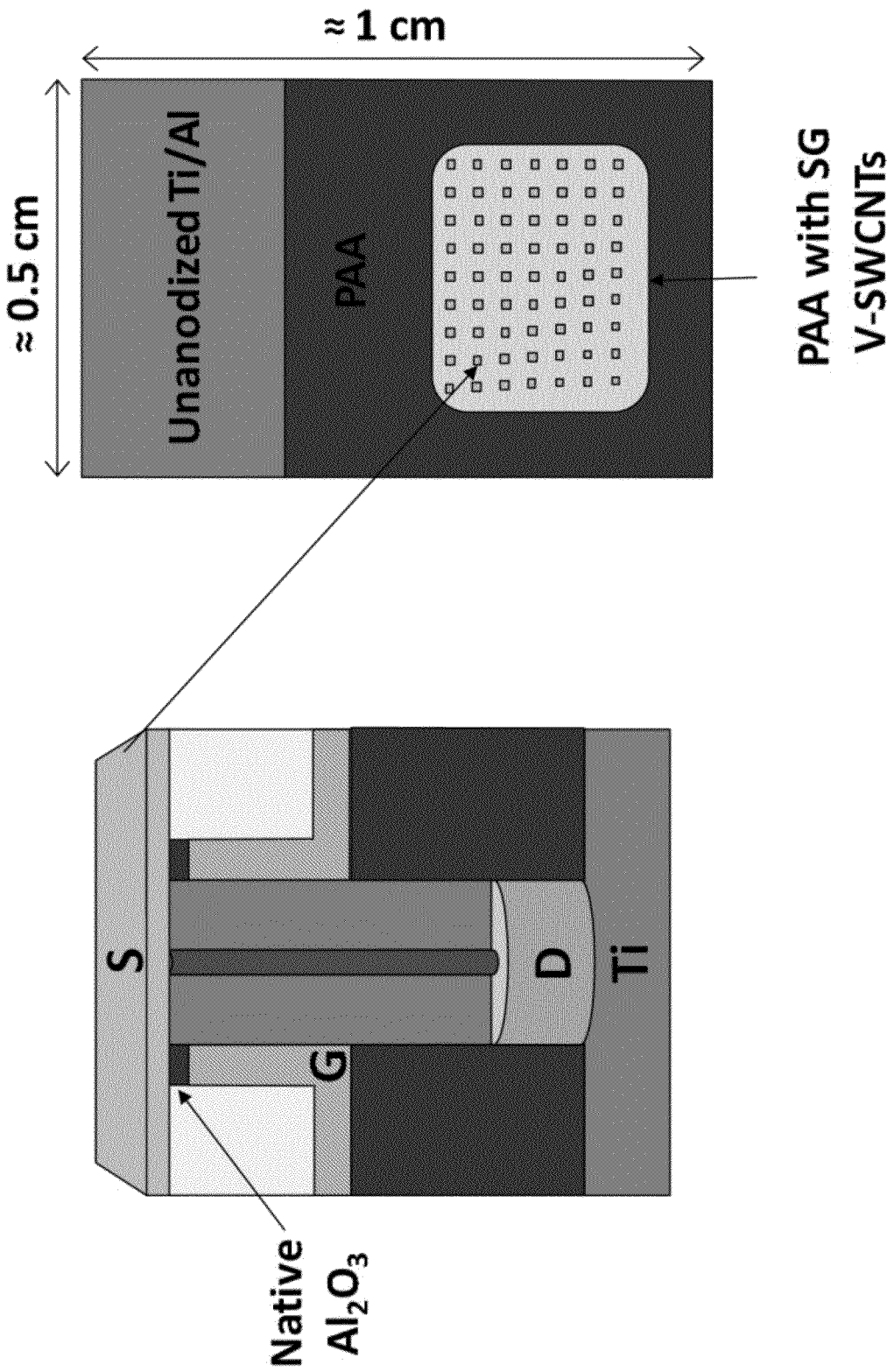
FIG. 7.6

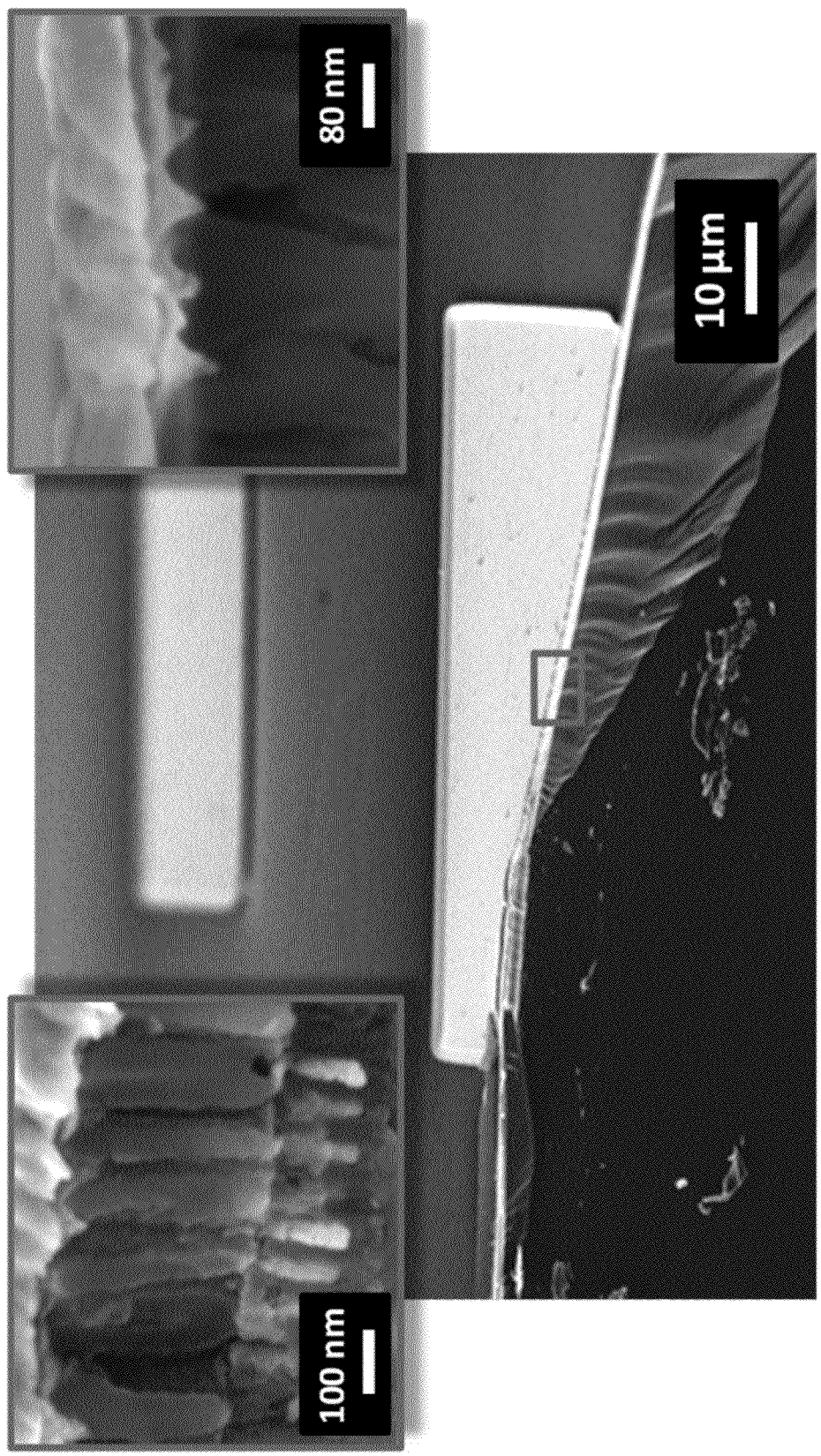
FIG. 7.7

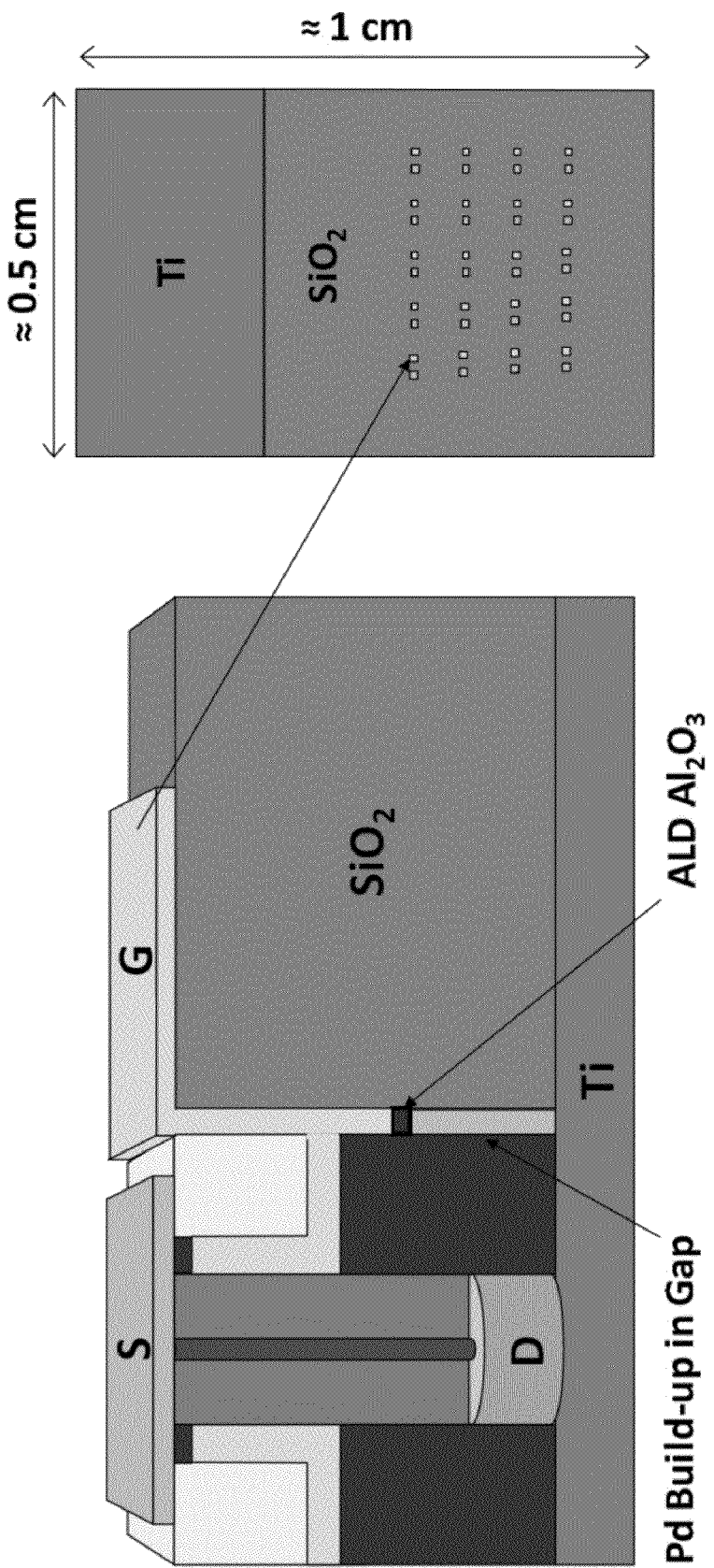
FIG. 7.8

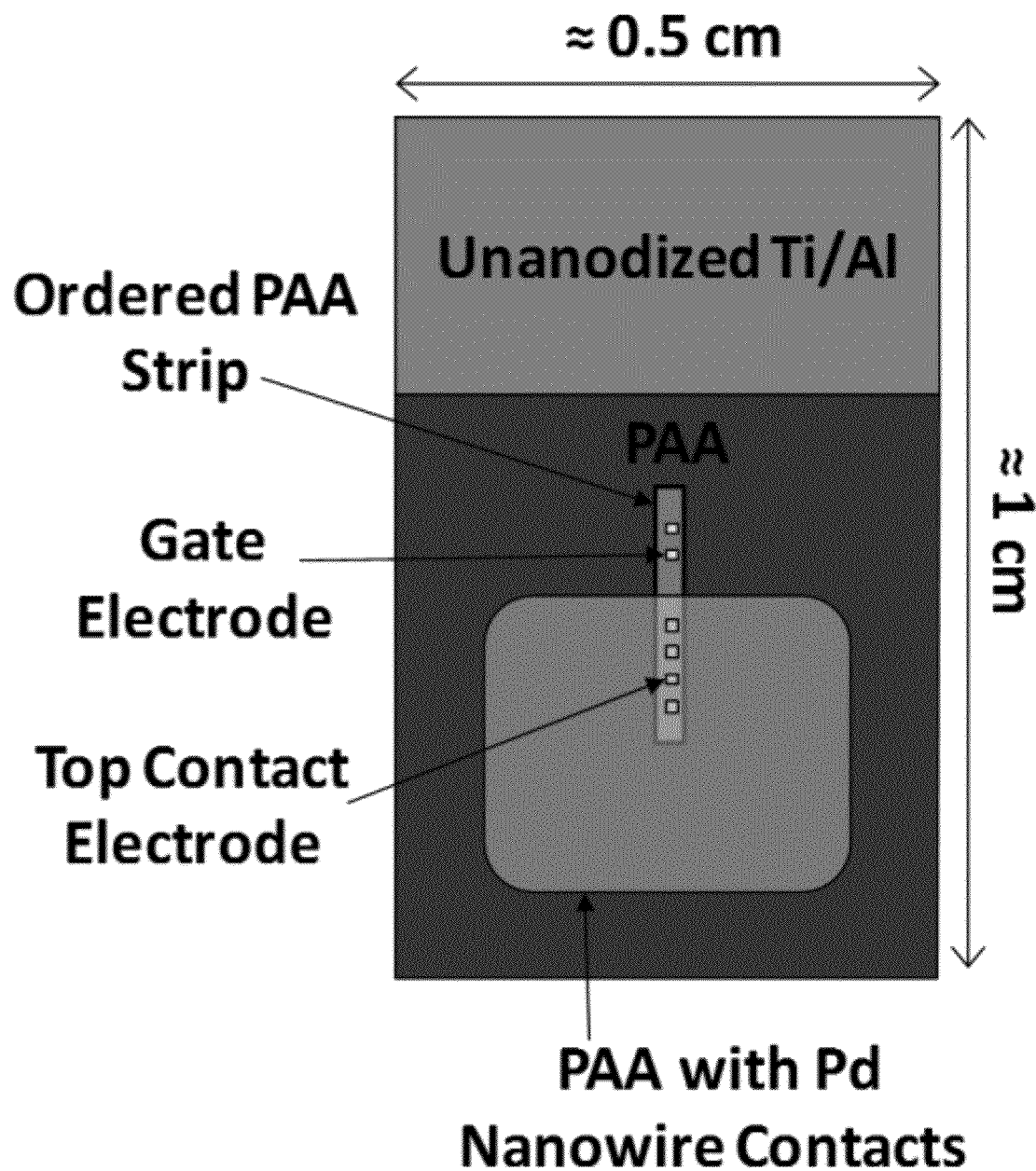
FIG. 7.9

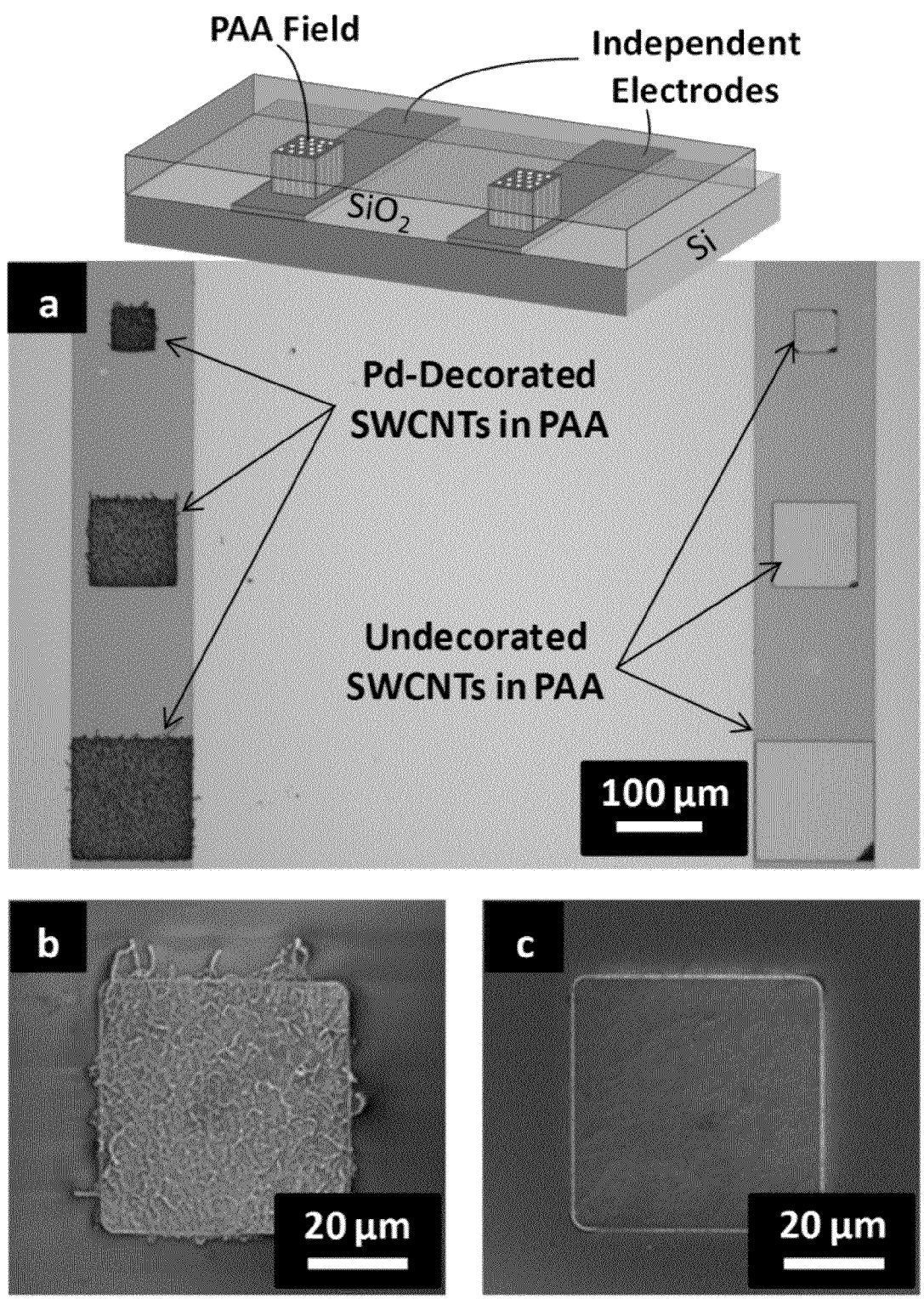
FIG. 8.1

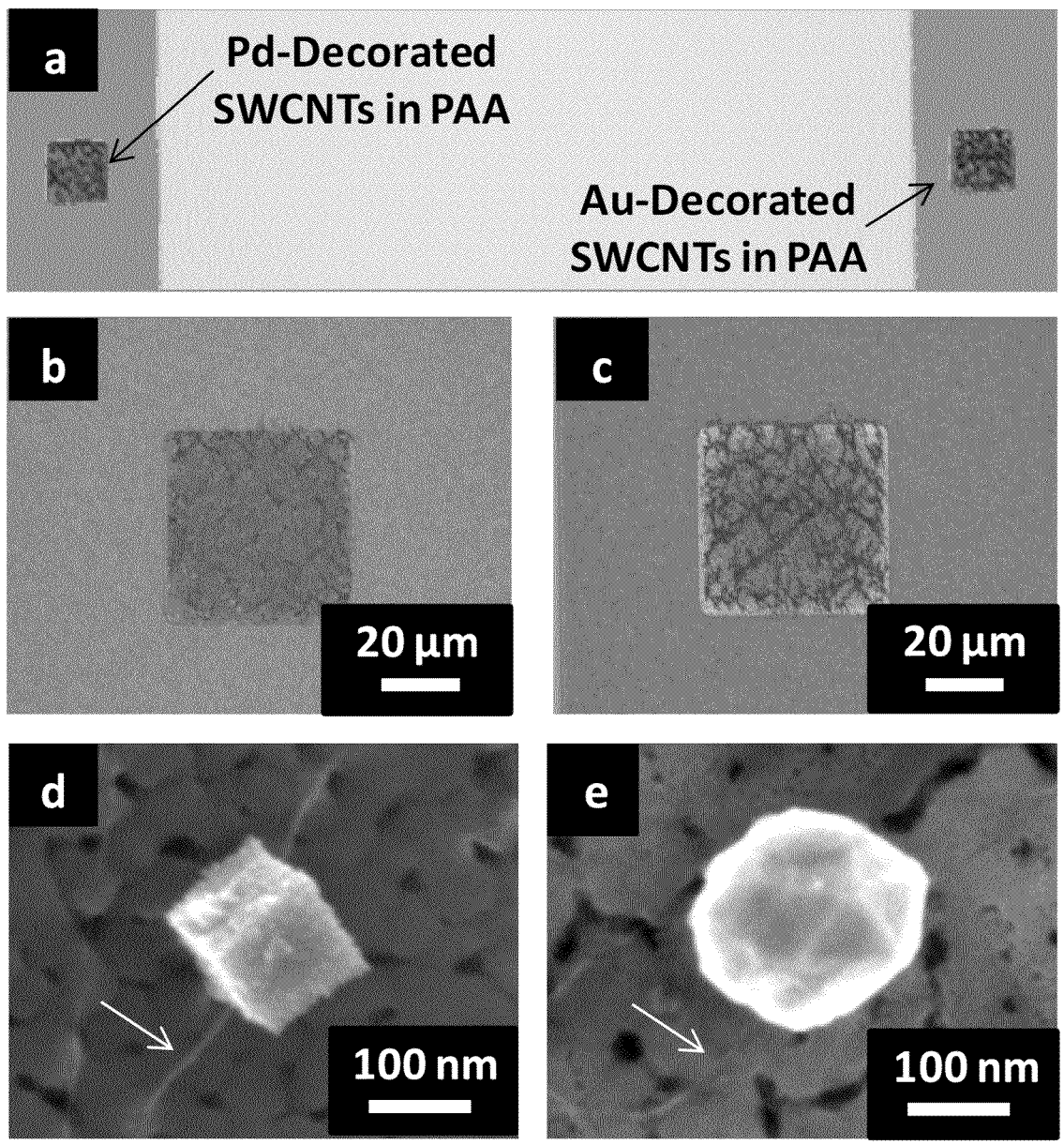
FIG. 8.2

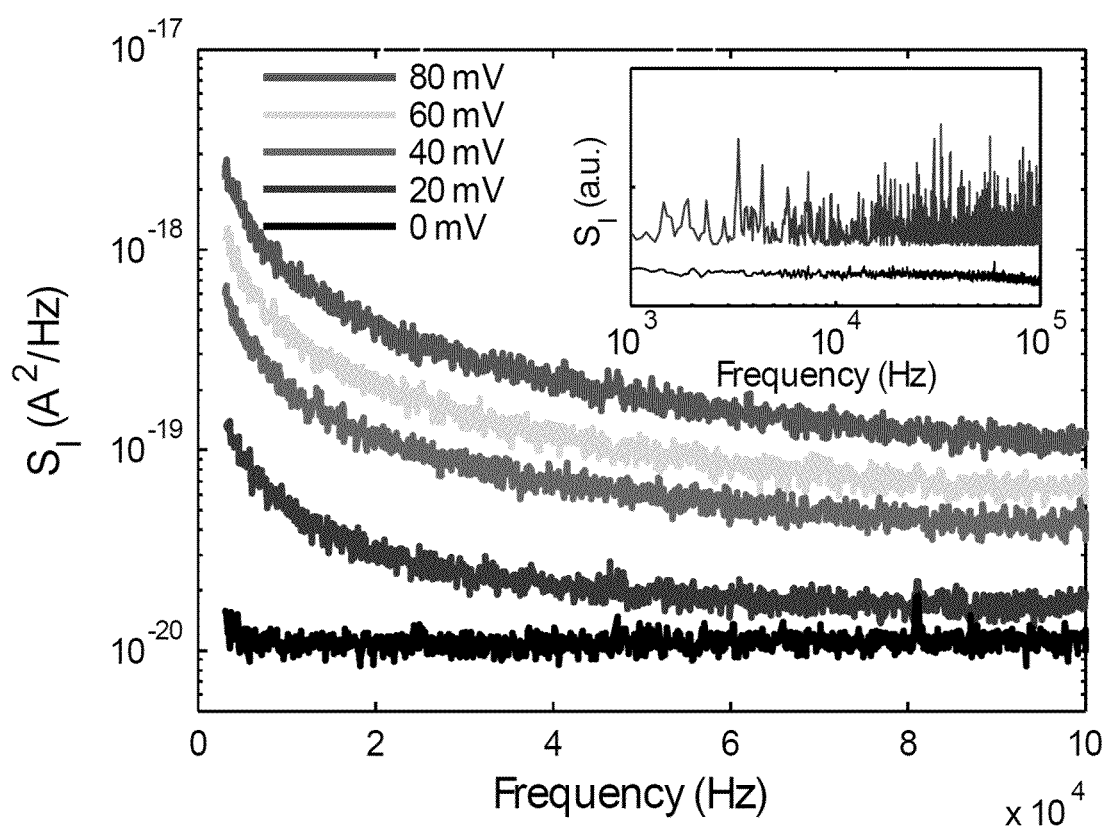
FIG. 8.4

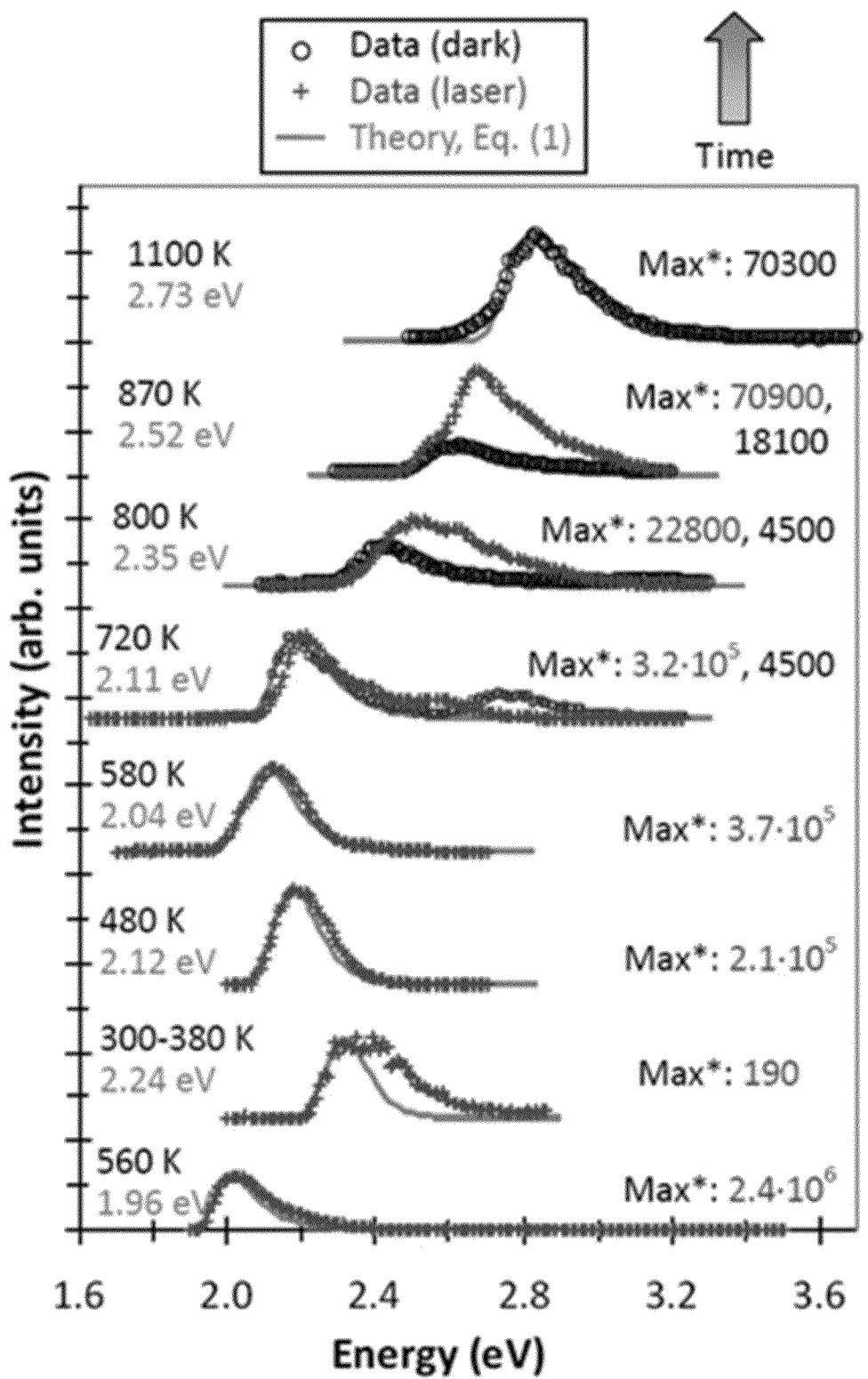
FIG. 8.5

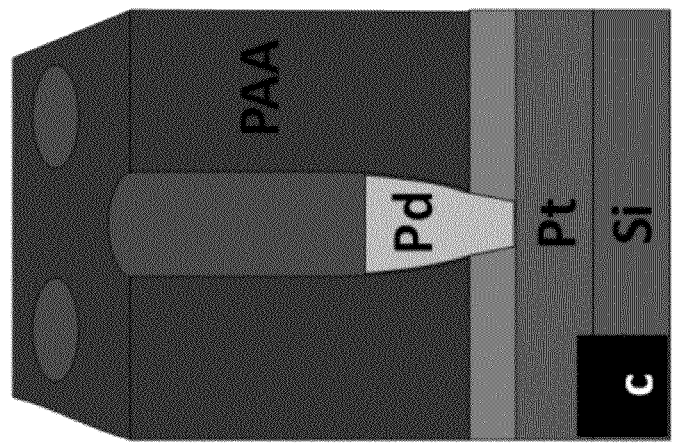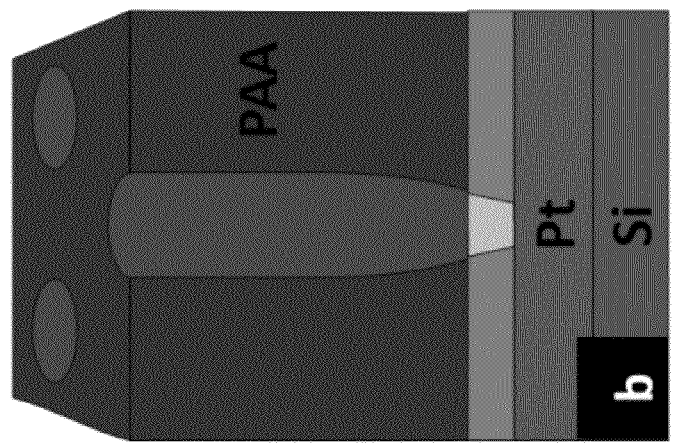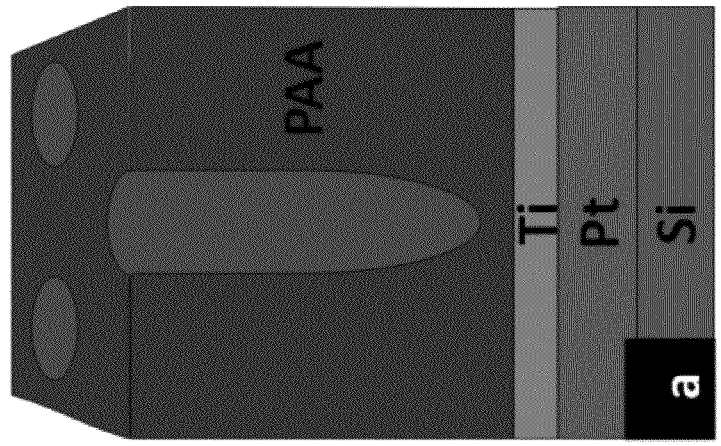
FIG. 9.1

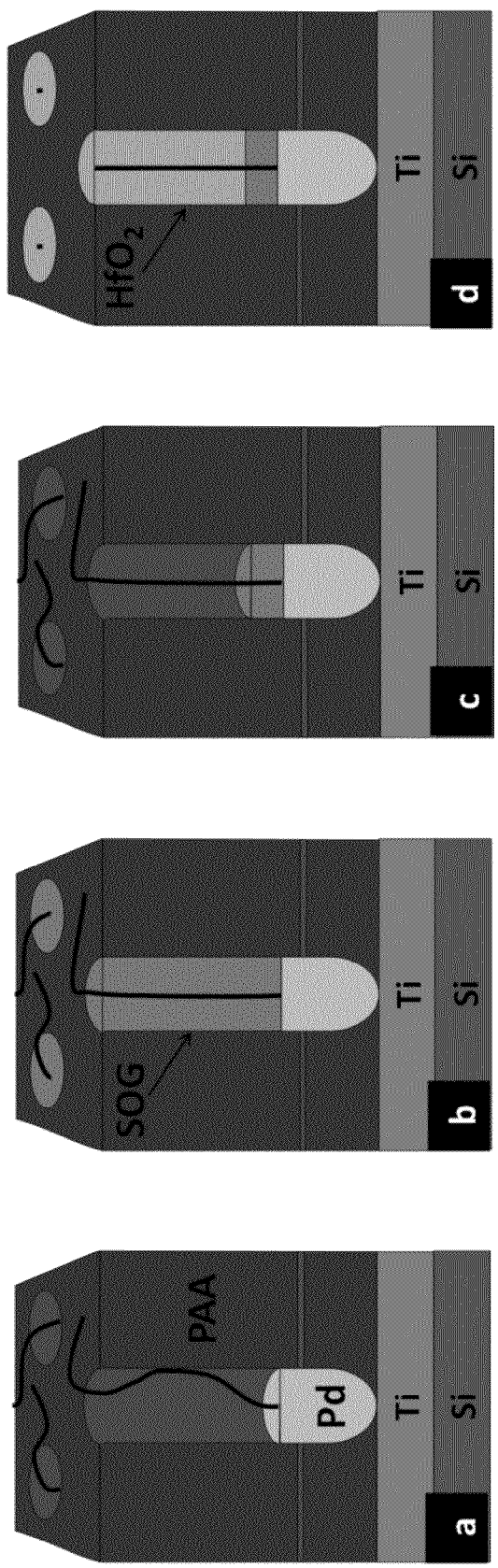
FIG. 9.2

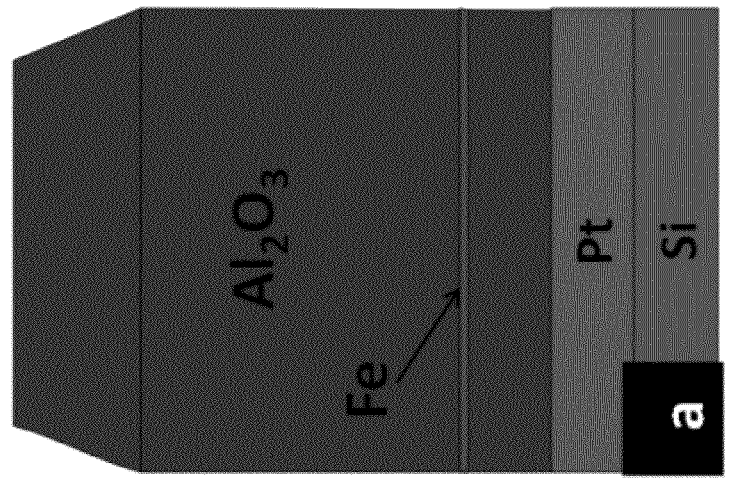
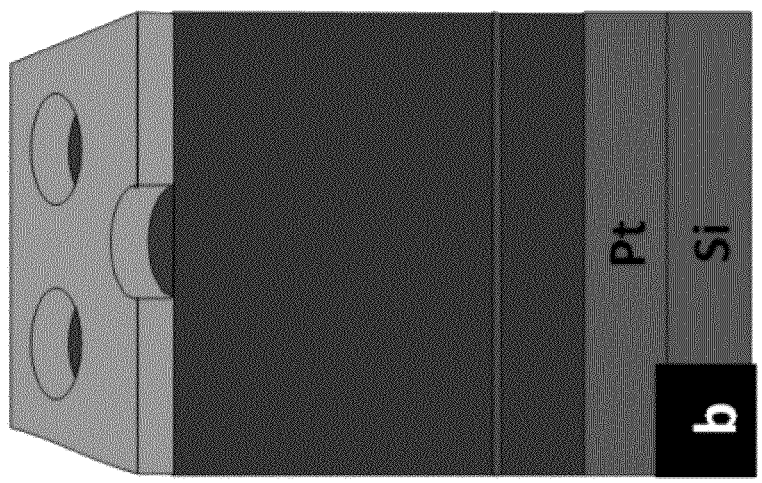
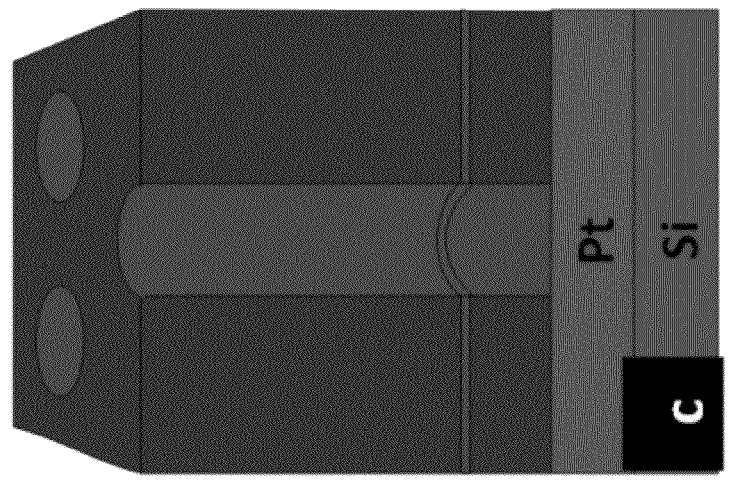
FIG. 9.3

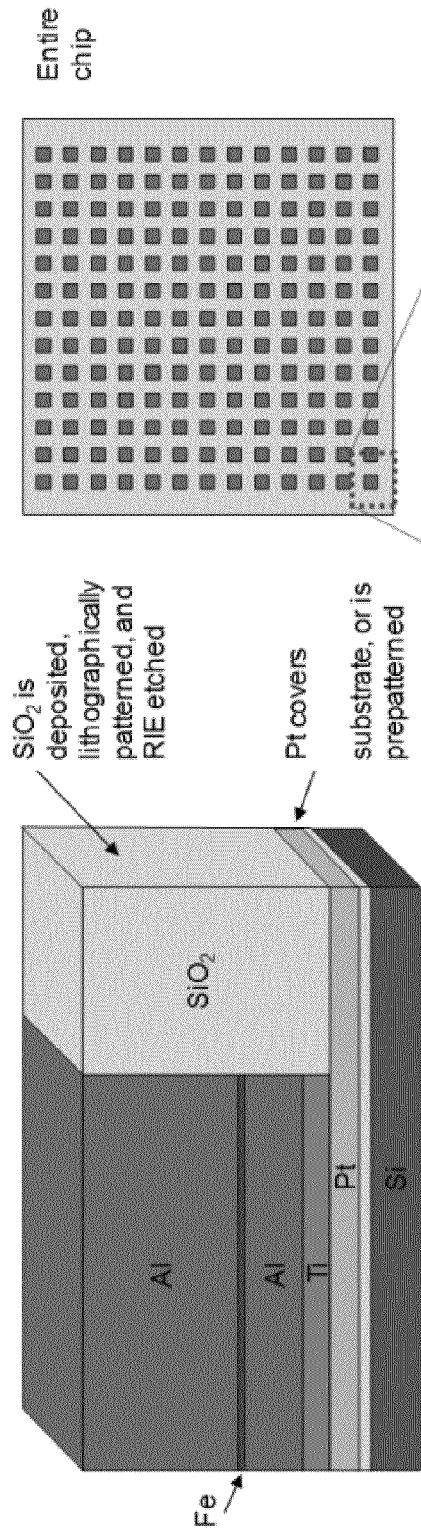
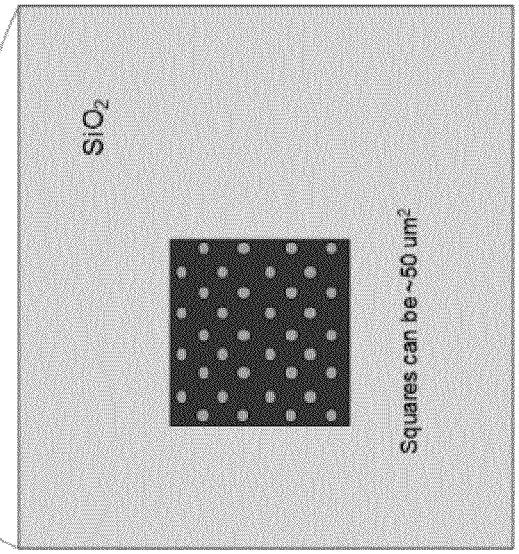
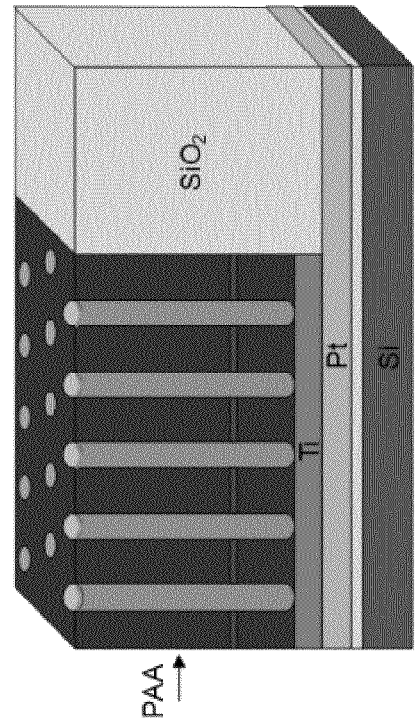
FIG. 10-1
FIG. 10-2

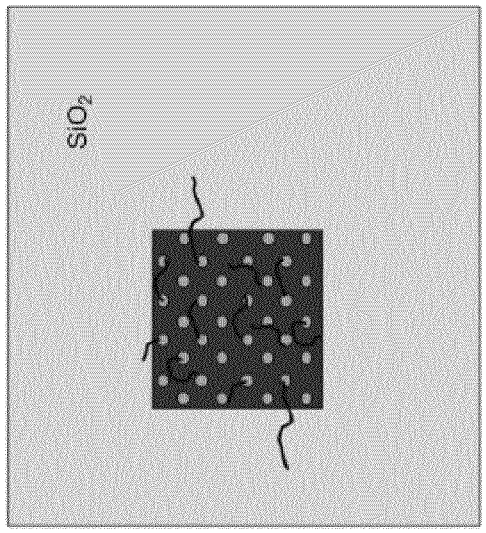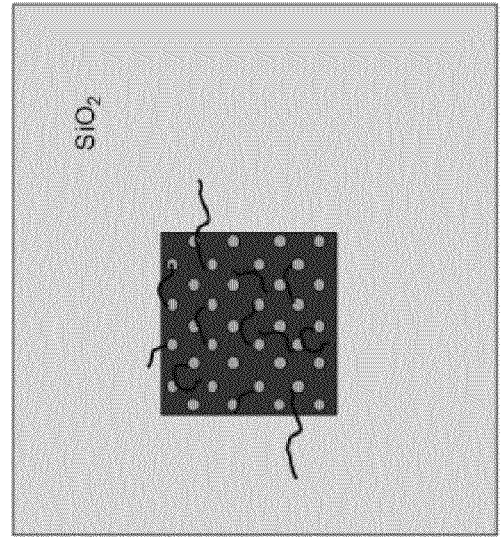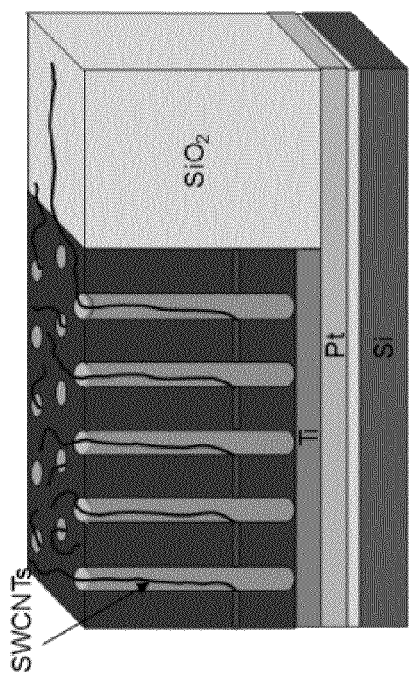
FIG. 10-3
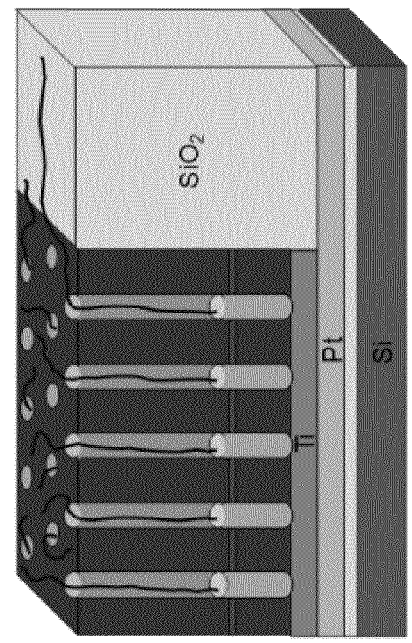
FIG. 10-4

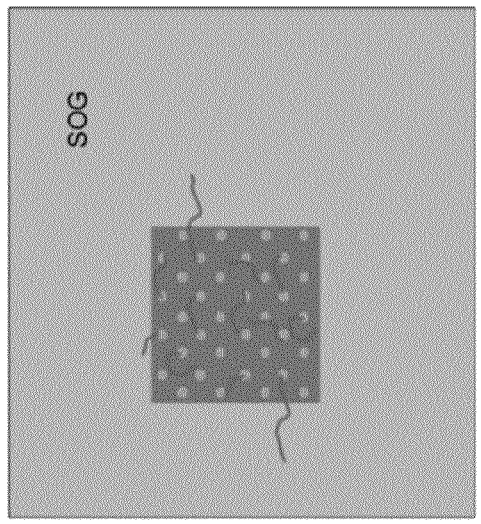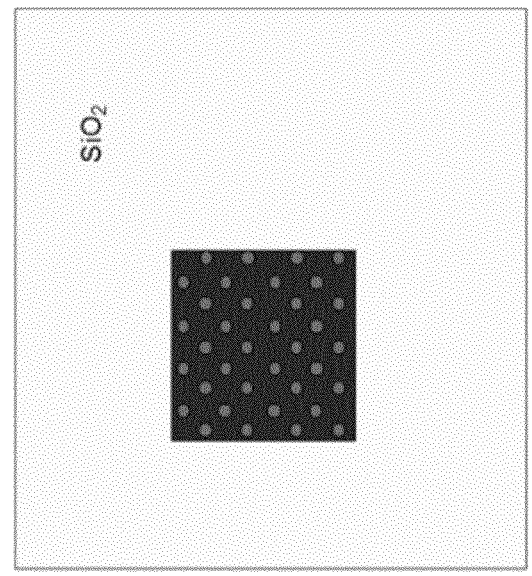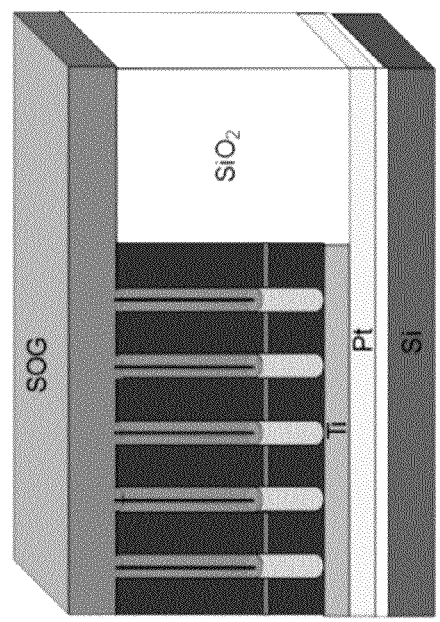
FIG. 10-5
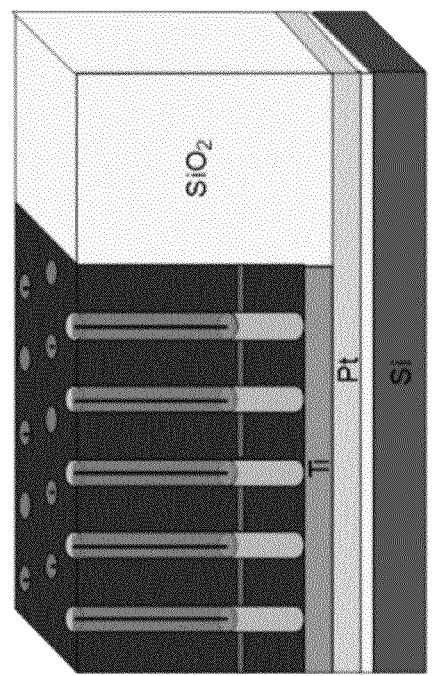
FIG. 10-6

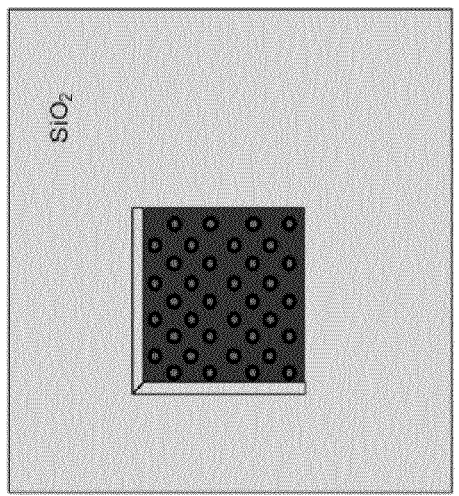
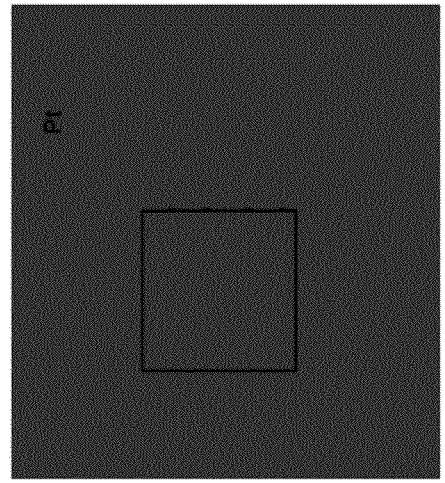
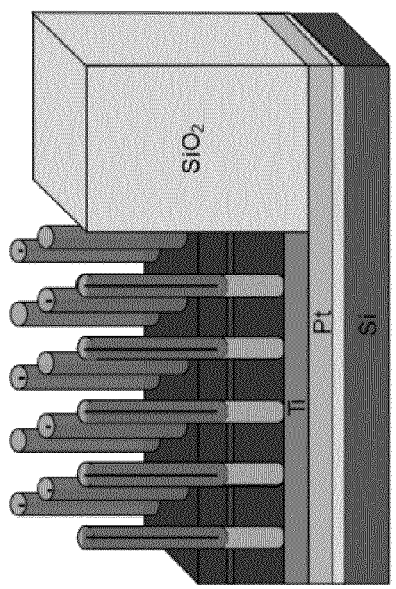
FIG. 10-7
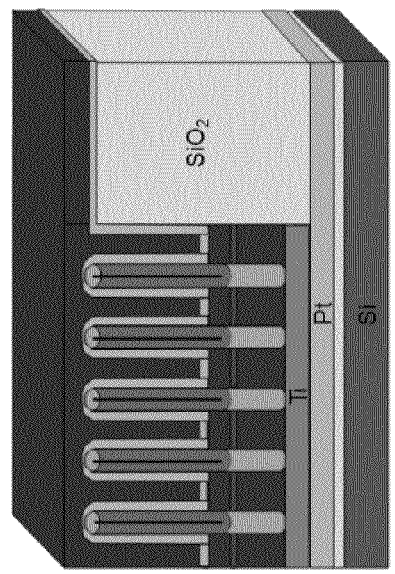
FIG. 10-8

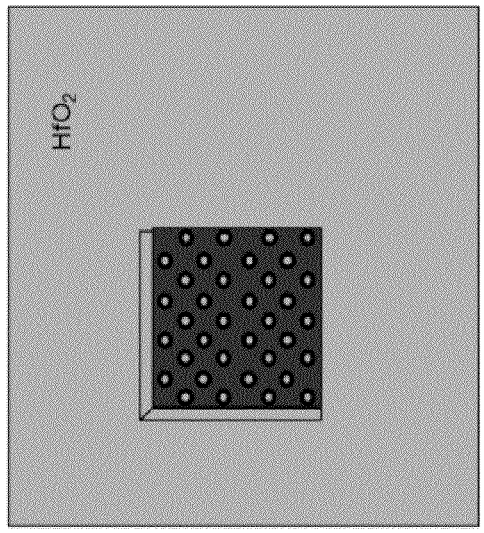
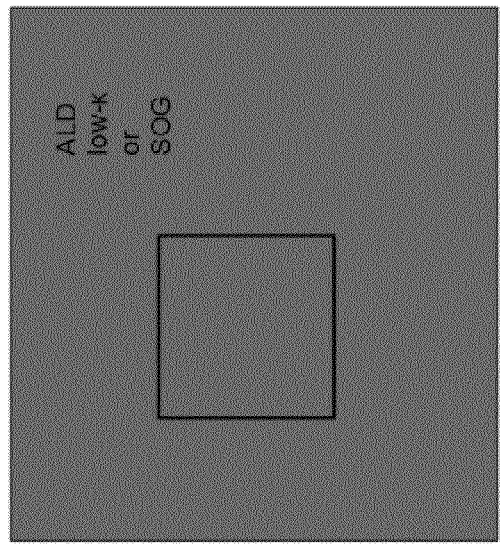
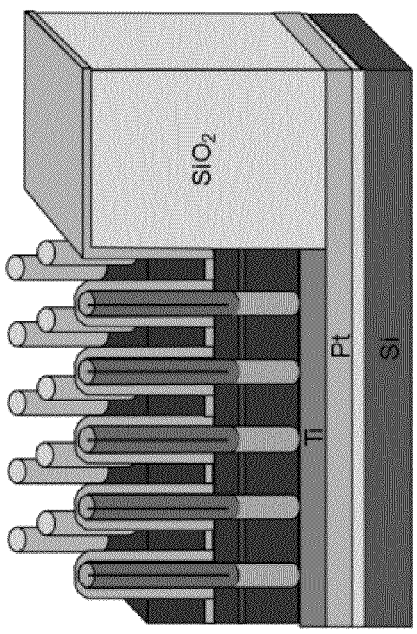
FIG. 10-9/1
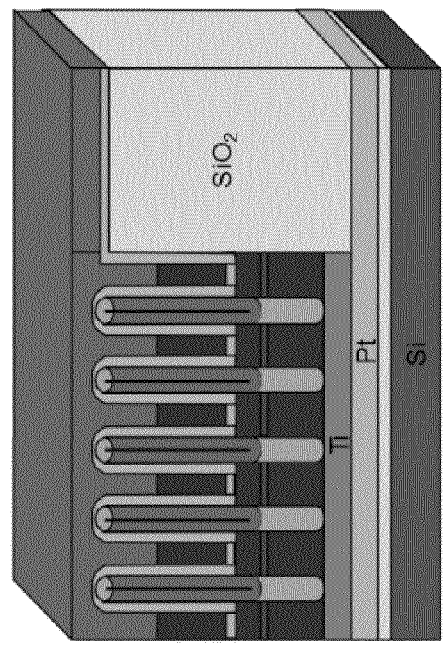
FIG. 10-10/1

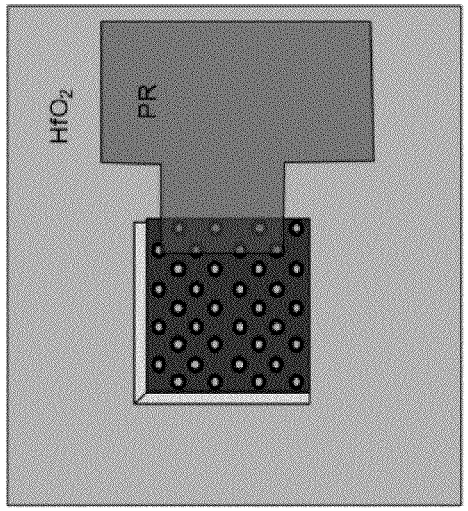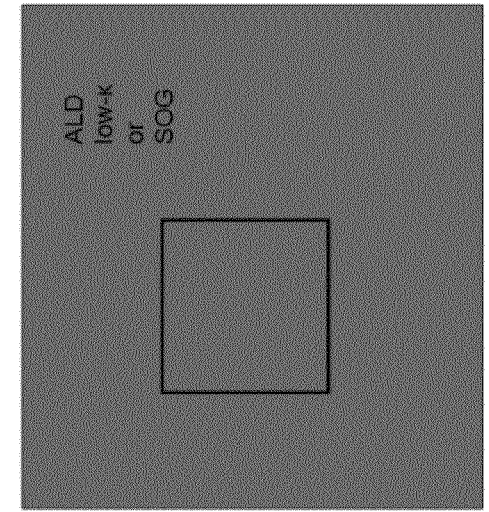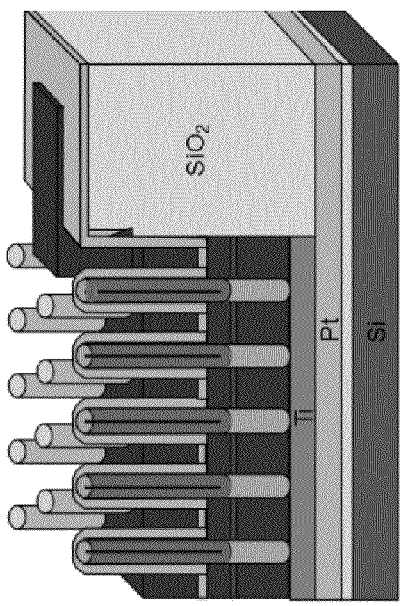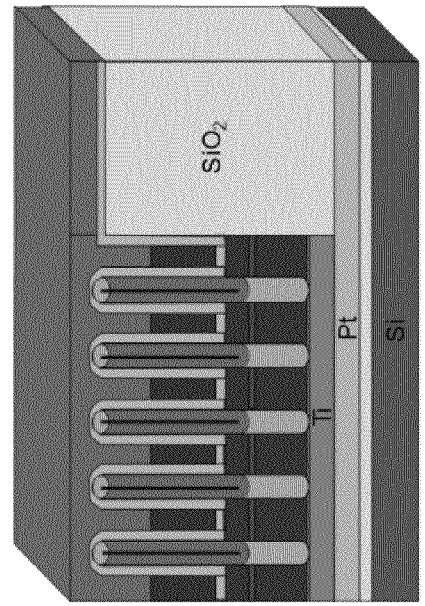
FIG. 10-9/2
FIG. 10-10/2

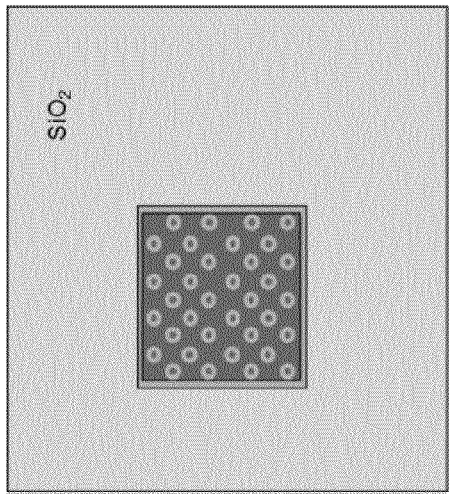
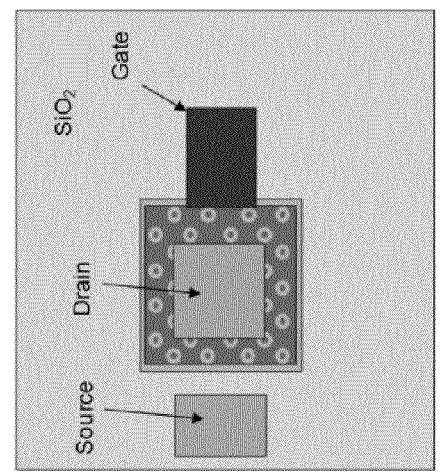
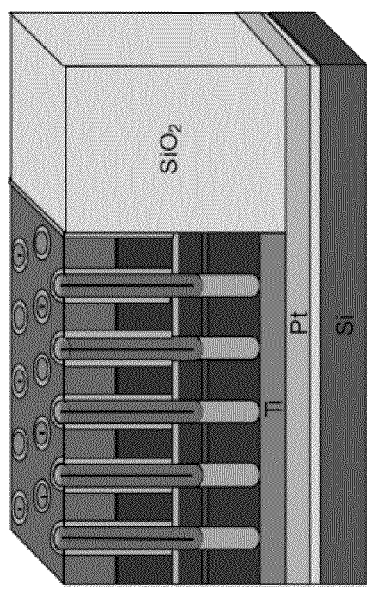
FIG. 10-11/1
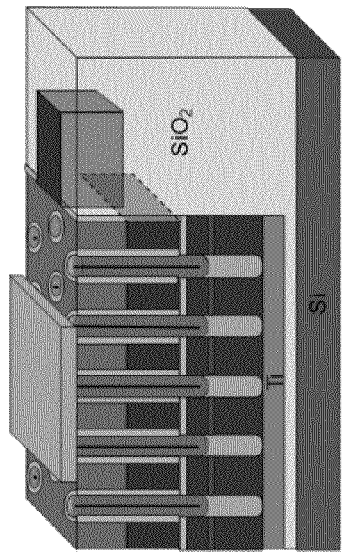
FIG. 10-12/1

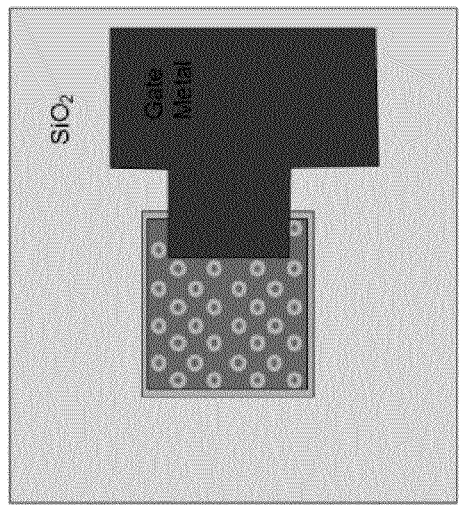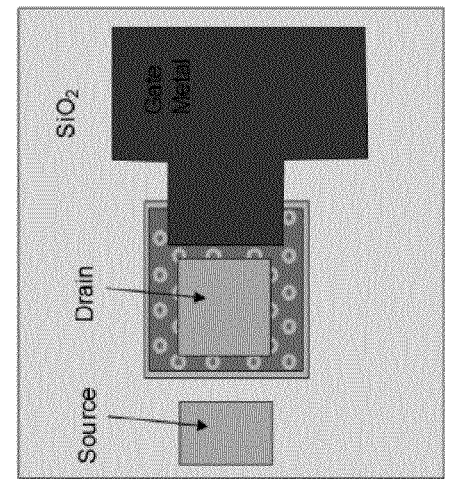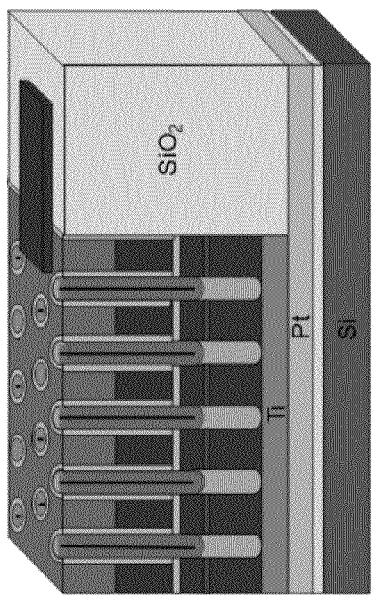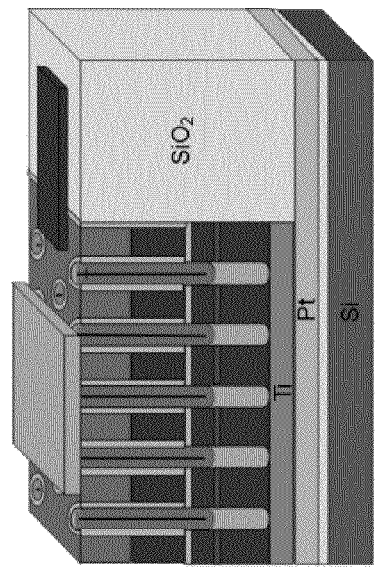
FIG. 10-11/2
FIG. 10-12/2

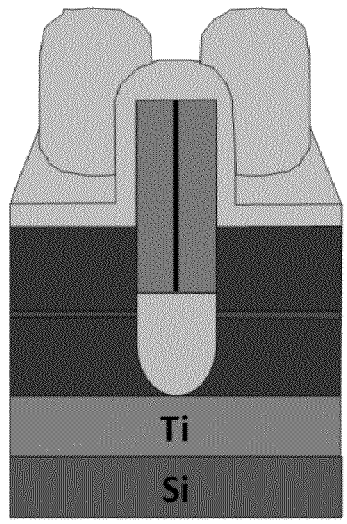 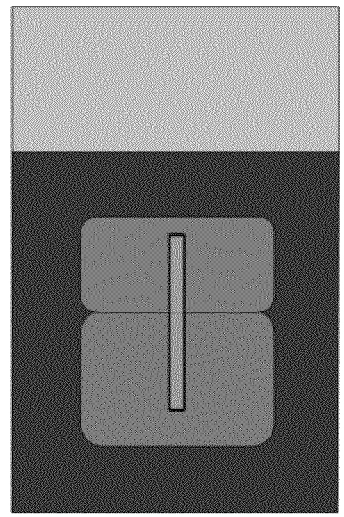
Only sputtered in ordered pores region
FIG. 11-9
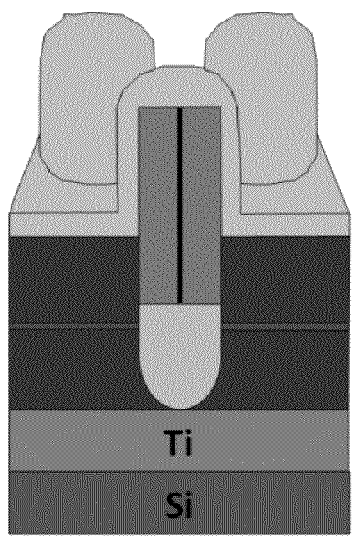 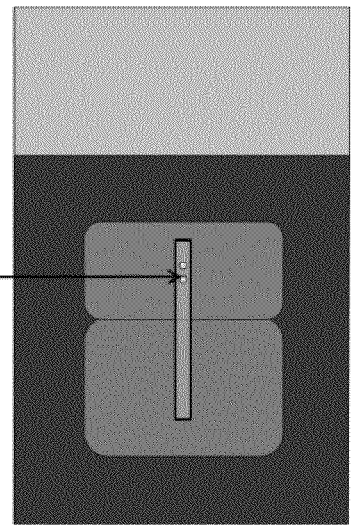
Gate electrodes
FIG. 11-10

FIELD EFFECT TRANSISTOR FABRICATION FROM CARBON NANOTUBES

CROSS REFERENCE TO RELATED APPLICATION

This application claims the benefit of priority to U.S. Provisional Patent Application Ser. No. 61/166,953, filed Apr. 6, 2009, entitled FABRICATION OF FIELD EFFECT TRANSISTORS FROM CARBON NANOTUBES, incorporated herein by reference.

FIELD OF THE INVENTION

Various embodiments of the present invention pertain to the fabrication of devices including nanotubes, and in particular to electronic devices including semiconducting carbon nanotubes.

BACKGROUND OF THE INVENTION

With a market that constantly hungers for smaller, faster, and cheaper electronics, the ability for Si transistor technology to continue to satisfy the demands will soon reach its end. Marvelous innovations, such as strained Si, have enabled engineers to continue to shrink Si transistors while maintaining reasonable device performance. However, heat dissipation is becoming a critical problem with advanced electronic chips, and many researchers are looking for salvation to come from the integration of new nanomaterials into transistor technology. Carbon nanotubes (CNTs) are one of the leading candidates for transistor applications. CNTs are nanosized cylinders of a couple of nanometers in diameter with such intriguing features as zero-resistance (ballistic) transport of electric current and an exceptional ability to transfer heat. For these, and many other reasons, CNTs would provide excellent channels for the next generation transistors. However, several obstacles remain to be resolved in the growth and placement of CNTs, and these issues currently hinder the ability to readily integrate them into advanced electronics.

In addition to the transistor, myriad other device applications exist for which CNTs are promising candidates. Their surface atoms, which are arranged in a honeycomb lattice, provide excellent sensitivity to charge-transferring molecules, enabling them to increase the sensitivity in biological sensing applications. The robust electrical properties of CNTs, such as the ability to carry an order of magnitude more current per unit area than copper, make them viable for use in low-power electron emission applications, such as those used to make flat-panel televisions. Integration of CNTs into many other applications, from noise thermometers to antennas, is being actively explored for the unique improvements that are possible when using the intrinsic properties of this nanoscale material.

SUMMARY OF THE INVENTION

Various aspects of the present invention pertain to the growth of carbon nanotubes, and including methods for producing fields of carbon nanotubes that are semiconducting. Other aspects pertain to the support of nanotubes of any type within a cavity such as a pore. Yet other aspects pertain to the creation of pores in which nanotubes will be placed.

One aspect of some embodiments pertain to a field effect transistor. The FET can include an insulating material defining a pore. The FET can include a semiconducting carbon nanotube within the pore, the nanotube having two ends. The FET can include a drain in electrical communication with one end of the nanotube. The FET can include a source in electrical communication with the other end of the nanotube. The FET can include a gate surrounding a portion of the nanotube.

Other aspects of some embodiments pertain to a method for fabricating an electronic device. The method can include providing a template of an electrically insulating material, each pore including at least one carbon nanotube. The method can include establishing a common electrical connection each carbon nanotube. The method can include placing a first dielectric material in each pore of the template. The method can include removing a portion of the insulating material and exposing a portion of the first dielectric material. The method can include placing a conducting material around the exposed portions of the first dielectric material. The method can include surrounding the conducting material with a second dielectric material.

Still other aspects of some embodiments pertain to a method for fabricating an electronic device. The method can include providing an electrically insulating substrate. The method can include placing a pattern of electrodes on the substrate. The method can include depositing an electrically insulating material on at least a portion of the electrodes. The method can include removing a portion of the deposited insulating material and exposing an area of an electrode. The method can include depositing aluminum within the exposed area. The method can include anodizing the deposited aluminum and creating a plurality of vertical pores.

One aspect of yet other embodiments pertain to a method for fabricating an electronic device. The method can include providing a first insulating material having a porous array, each pore including a nanotube, each pore having an end proximate to a conductive layer. The method can include placing the insulating material next to a dielectric material. The method can include depositing a first conductive material within each pore and establishing electrical communication between the nanotube and the conductive layer. The method can include depositing a second insulating material on at least a portion of the deposited first conductive material. The method can include depositing a second conductive material on at least a portion of the deposited second insulating material.

Still further aspects of some embodiments pertain to a method for fabricating an electronic device. The method can include providing a substrate comprising an insulating material. The method can include depositing a first layer of a first conductive material on the substrate. The method can include depositing a second layer of a second conductive material on the first layer, the second conductive material being different from the first conductive material. The method can include depositing a third layer of aluminum on the second layer. The method can include anodizing the aluminum and creating a plurality of pores extending from the surface of the alumina towards the second layer. The method can include removing a portion of the second conductive layer between the end of the pore and the first conductive layer.

One aspect of some embodiments pertain to a method for growing nanotubes. The method can include providing a substrate comprising an insulating material. The method can include depositing a first layer of a first conductive material on the substrate. The method can include depositing a second layer of a catalytic material on the first layer. The method can include depositing a third layer of material on the second layer. The method can include coating the third layer with a resist material. The method can include exposing a pattern in the resist material. The method can include etching the exposed pattern and creating a corresponding pattern of pits in the top surface of the third layer. The method can include oxidizing the third material and creating a pore from each pit that extends generally normal to the top surface of the third material. The method can include growing a nanotube within each pore from the catalytic material.

It will be appreciated that the various apparatus and methods described in this summary section, as well as elsewhere in this application, can be expressed as a large number of different combinations and subcombinations. All such useful, novel, and inventive combinations and subcombinations are contemplated herein, it being recognized that the explicit expression of each of these combinations is excessive and unnecessary.

BRIEF DESCRIPTION OF THE DRAWINGS

FIG. 3.2 is a cross-sectional SEM images of (a) SWCNTs growing vertically from PAA and (b) SWCNTs draping along the PAA surface and appearing as bright strands.

FIG. 3.3 is a schematics showing the random deposition of Fe patches on an Al film for the (a) first catalyst layer, followed by (b) the deposition of ≈2 nm Al and a second Fe catalyst layer. Note how the random patches of multiple Fe layers will work to cover a larger percentage of the surface. Tilted cross-sectional SEM images showing SWCNT yield from (c) a single Fe catalyst layer and (d) three Fe catalyst layers separated by thin Al layers.

FIG. 3.4 is a tilted cross-sectional SEM images showing the effect of pore-widening on the SWCNT yield.

FIG. 3.5 is a schematics illustrating the fabrication of PAA trenches in $SiO_2$. (a) Lithographic patterning, RIE and wet etching of SiO2, metal evaporation, and lift-off. (b) Anodization of the Al film stack in the trenches to form PAA (note that the topmost portion of the metal remains unanodized as it was used as the contact for anodization). (c) Top-view SEM image of a PAA trench with inset showing SWCNTs grown from PAA and extending onto neighboring SiO2.

FIG. 3.6 is a schematics illustrating the fabrication of electrically isolated PAA fields embedded in SiO2. (a) Lithographic patterning of Ti/Pt electrodes on SiO2. (b) PCVD of SiO2 followed by a patterned wet etch. (c) Lithographic definition of square fields on electrodes, dry and wet etching of SiO2, deposition and lift-off of Ti/Al/Fe/Al film stack. (d) Anodization of the Al film stacks and subsequent cleaving of the common electrode.

FIG. 3.7 is a (a) tilted cross-sectional SEM image of a PAA field embedded in SiO2 showing the PAA/SiO2 boundary. (b) SEM showing a PAA field on top of an independent electrode; note that SiO2 covers the entire surface except where the PAA is embedded. (c) Top-view SEM of the PAA/SiO2 boundary. (d) Tilted view SEM image of the boundary with SWCNTs extending from the PAA onto the SiO2 surface.

FIG. 3.8 is a schematic of the process for obtaining pore order in thin-film PAA. (a) PMMA coated sample. (b) PMMA after EBL patterning. (c) Pattern transferred to Al film by wet etching. (d) Anodization of Al to form ordered PAA.

FIG. 3.9 are SEM images of a hexagonal pattern with 100 nm inner-pore spacing in (a) PMMA, (b) Al after etching, and (c) PAA.

FIG. 4.2 are SEM cross-sectional images of PAA structures demonstrating control of Pd nanowire array length by varying the number of electrodeposition cycles. The average diameter of nanowires is 30 nm for sulfuric, 50 nm for oxalic, and 130 nm for phosphoric anodized PAA (all scale bars are 1 μm). Note that the specimens were prepared for SEM by fracture, leaving some of the fractured pores without a nanowire on either the imaged or discarded side of the specimen.

FIG. 4.3 are SEM images of Pd contacting the Ti layer in templates anodized in (a) phosphoric acid (~130 nm pores), (b) oxalic acid (~50 nm pores), and (c) sulfuric acid (~30 nm pores). (d) STEM images of Pd nanowires released by etching the PAA template (which was anodized in oxalic acid at 40 V with no subsequent pore widening) showing uniformity of diameter along the length of nanowires.

FIG. 4.4 is a (a) I-V characteristic showing ohmic contact between the Pd nanowires and the Ti layer from samples anodized in oxalic acid at 40 V with 50 nm pores (blue), in sulfuric acid at 18 V with 30 nm pores (red), and in phosphoric acid at 100 V with 130 nm pores (green). (b) Schematic of a Pd-filled PAA structure detailing the electrical measurement arrangement.

FIG. 5.2 is a schematic of electrochemical setup used to galvanostatically electrodeposit Pd into the PAA/SWCNT templates.

FIG. 5.3 is a (a) Working electrode potential as a function of deposition time for various pulses at 2.0 mA/cm2 showing the steady-state potential. (b) Plot of the steady-state potential from each pulse as a function of deposition time for three different depositions at 2.0 mA/cm2. Region I corresponds to the nucleation of Pd on Ti and Pd nanowire growth, region II involves the gradual charging of the SWCNTs' capacitances as they are contacted by nanowires, and region III relates to the deposition of Pd to both the nanowires and nanocubes.

FIG. 5.4 are (a-c) SEM images of Pd nanocubes on SWCNTs from samples deposited at 2.0 mA/cm2, demonstrating the increase in nanocube size with increasing deposition time. (d-f) are cross-sectional SEM images showing increasing Pd nanowire length with increasing deposition time. The dotted line indicates the approximate location of the Fe catalyst layer from which the SWCNTs grow. Electrodeposition data from these samples is plotted in FIG. 5.3(b).

FIG. 5.5 is a (a) Steady-state potential from each current pulse as a function of deposition time at three different current densities. (b) SEM image of Pd nanocubes on SWCNTs from a 2.0 mA/cm2 deposition for 200 s. Circled area shows a noncubic deposit formed on a SWCNT that likely remained bound to the PAA surface during electrodeposition.

FIG. 5.6 (a-c) SEM images of Pd nanocubes from electrodepositions for 200 s using different current densities (see FIG. 6.5(a)), showing an improvement of nanocube smoothness with decreasing current density. (d-f) are cross-sectional SEM images showing the representative Pd nanowire length for each deposition current density. The dotted line indicates the approximate location of the Fe catalyst layer from which the SWCNTs grow.

FIG. 5.7 are cross-sectional SEM images showing bright and dark SWCNTs on the PAA surface (a) before immersion in the Pd solution and (b) after 2 min submersion with no applied bias (inset shows magnified view of spontaneously formed Pd nanocube). (c) is a composite plot showing the potential of Pd2+ as well as schematic electronic band diagrams of metallic and semiconducting SWCNTs with respect to both SHE and the vacuum level.

FIG. 6.2 are (a) Schematic cross-section of a two-terminal, multi-nanotube V-SWCNT device. (b) Cross-sectional SEM image showing the vertical nanopores and Pd nanowire bottom contacts with a Pd/Ti/Au top contact. Inset shows a V-SWCNT supported in SOG with an arrow indicating the VSWCNT location. (c) Tilted cross-sectional SEM showing the ordered nanopores prior to top contact metallization.

FIG. 6.3 are cross-sectional SEMS showing V-SWCNT lengths that have been controlled by using different ion bombardment etch times. Additionally, (a) and (b) show false color SEMS for material delineation (red is PAA, yellow is Pd, blue is SOG, white line is V-SWCNT). In (c), the arrows indicate the distance between the top of the Pd nanowire and the top of the PAA (or the beginning of the top contact). Note that fracturing the samples for SEM prep caused the Pd nanowires to break away from some pores.

FIG. 6.4 are (a) I-V characteristics from a two-terminal V-SWCNT device (LCNT ≈100 nm) showing domination in conduction by a metallic V-SWCNT before it is burned out (blue) and by a semiconducting V-SWCNT after the metallic tube is burned (red). (b) Conductance versus applied bias showing the burn-out of the metallic V-SWCNT first (blue) and the subsequent burn-out of the semiconducting V-SWCNT (red).

FIG. 6.5 is a bar graph showing the number of devices that exhibited a certain conductance (rounded to the nearest hundredth of a micro Siemen). The inset shows the distribution for the single semiconducting nanotube devices.

FIG. 6.6 are (a) I-V characteristics from a single semiconducting V-SWCNT device with the contacts swapped (bias is applied to the top contact for the orange line and the bottom contact for the purple line). Qualitative band diagrams corresponding to (b) Vds=−1 V applied to the top contact, and (c) Vds=−1 V applied to the bottom contact. The p-channel SB at the top contact is assumed to be smaller than the SB at the bottom contact for these illustrations. EFB and EFT denote the bottom and top contact metal Fermi levels, respectively.

FIG. 6.7 are (a) Schematic of planar CNTFETs fabricated from V-SWCNTs that have been overgrown from the PAA onto a neighboring oxide and contacted with Pd source/drain contacts. The gate dielectric is 200 nm of thermal SiO2 with a 3 µm channel length. (b) Subthreshold characteristics of two representative devices, each containing a single semiconducting nanotube and displaying an Ion/Ioff current ratio of more than five orders of magnitude with Vds=−1 V. (c) I-V and G-V characteristics showing the burnout of a single nanotube from one of the devices in (b) at Vgs=−5 V.

FIG. 7.2 are plots of the screening length versus (a) channel body thickness (i.e., nanowire or nanotube diameter), (b) gate oxide thickness, (c) gate oxide dielectric constant, and (d) body dielectric constant. Except as noted, the following constants were used for the relative simulations: $\in ox=3.9$, $\in body=30$, dox=8 nm, and dbody=2 nm.

FIG. 7.3 is a schematic process flow for fabricating SG V-SWCNTs. The template is shown after (a) V-SWCNTs synthesis, (b) Pd nanowire electrodeposition, SOG application and ion bombardment etchback, (c) selective etchback of PAA, (d) sputtering of Al gate metal, and (e) SOG application and final ion bombardment etchback.

FIG. 7.4 are (a) and (b) are tilted cross-sectional SEM images of dielectric pillars after selectively etching back the PAA; V-SWCNTs are within the dielectric pillars. (c) is a top-view SEM image showing the agglomeration of SOG pillars that occurs when the aspect ratio becomes too large.

FIG. 7.5 are (a) Top-view SEM image of the dielectric pillars after sputtering of Al gate metal; inset shows cross-section of the pillars. (b) Top-view SEM image of the final SG on V-SWCNTs with the metal coated pillars supported in SOG—each bright ring is the Al gate metal with a dielectric pillar within the ring surrounding a V-SWCNT.

FIG. 7.6 is a Schematic of a SG V-SWCNT device with a top contact in place. On the right is a top view of a typical sample showing the unanodized top metallization that is used as the access for the bottom (drain) contact.

FIG. 7.7 is a tilted cross-sectional SEM images of top contacts on two-terminal VSWCNT devices. The insets show the Pd coating the topography of the template surface and extending down within the pores.

FIG. 7.8 is a schematic of a SG V-SWCNT FET using PAA fields with a gate contact supported on the neighboring SiO2.

FIG. 7.9 is a schematic of a SG V-SWCNT FET with a vertical strip of ordered pores where the devices are fabricated. For detailed process steps see Appendix A.

FIG. 8.2 is an (a) Optical image of a chip showing a PAA field on one independent electrode functionalized with Pd-decorated SWCNTs, while a PAA field on the neighboring electrode has been separately functionalized by coating the Pd nanocubes with Au. Note that the entire surface (including the electrodes) is covered by SiO2 except for the PAA fields.

(b) and (c) are optical images of a PAA field with Pd nanocubes on SWCNTs and with Au/Pd nanocubes on SWCNTs, respectively. SEM images of (d) a Pd nanocube decorating a SWCNT and (e) a Au/Pd nanocube decorating a SWCNT (arrows indicate SWCNT).

Figures 1, 11:
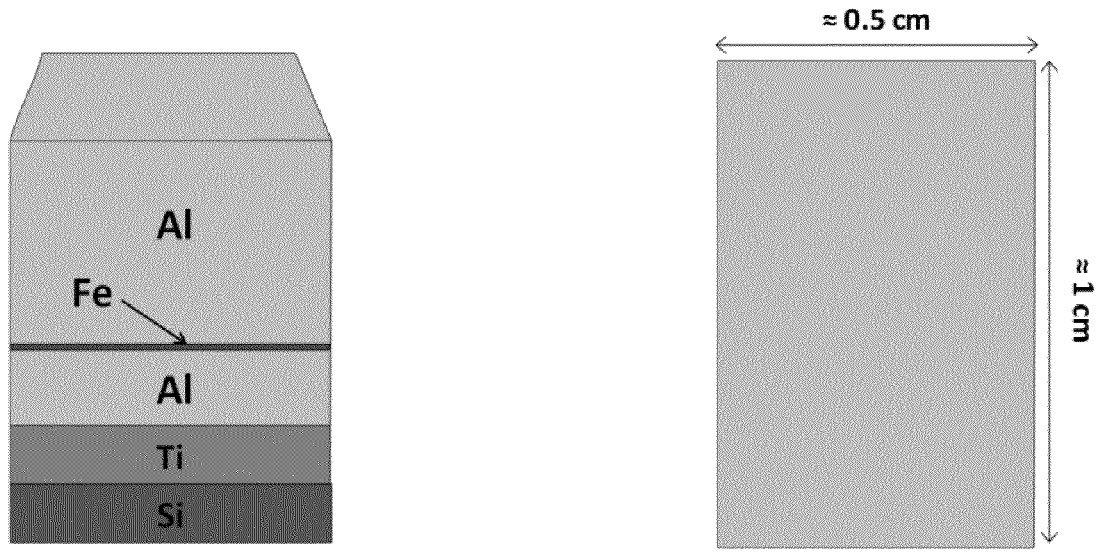
FIG. 1(a) is a method for fabricating an electronic device according to one embodiment of the present invention.
FIG. 1(b) is a method for fabricating an electronic device according to one embodiment of the present invention.
FIG. 1(e) is a flowchart representing a method according to one embodiment of the present invention.
FIG. 1(f) is a flowchart representing a method according to one embodiment of the present invention.
FIG. 1(g) is a flowchart representing a method according to one embodiment of the present invention.
FIG. 1(h) is a flowchart representing a method according to one embodiment of the present invention.
Figures 2, 11:
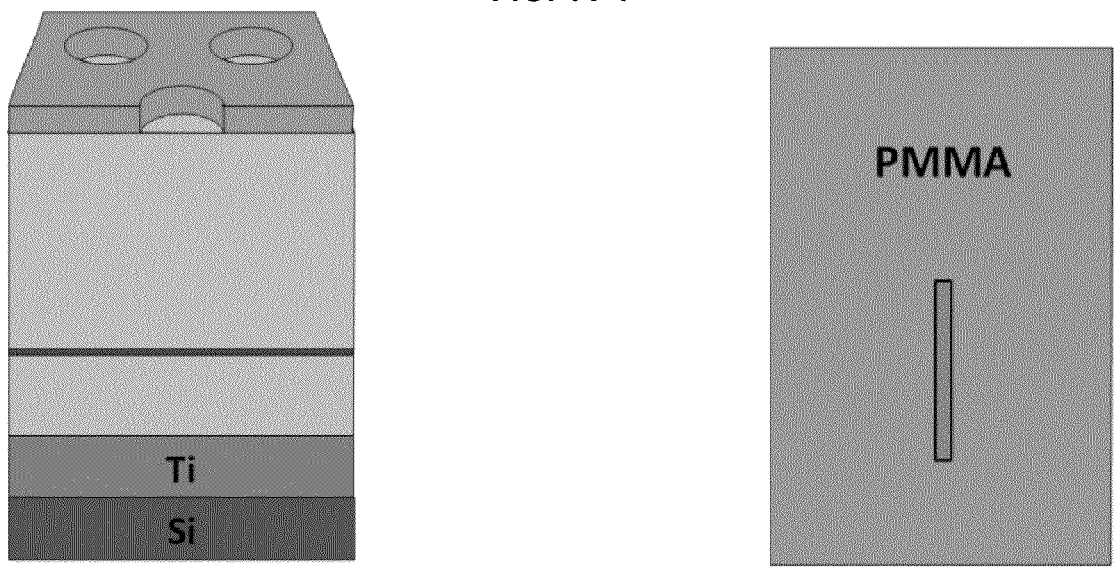
FIG. 2.3 is a schematic of a multi-nanotube V-CNTFET consisting of ten SG-SWCNT channels and a single gate-drain underlap.
Figures 3, 11:
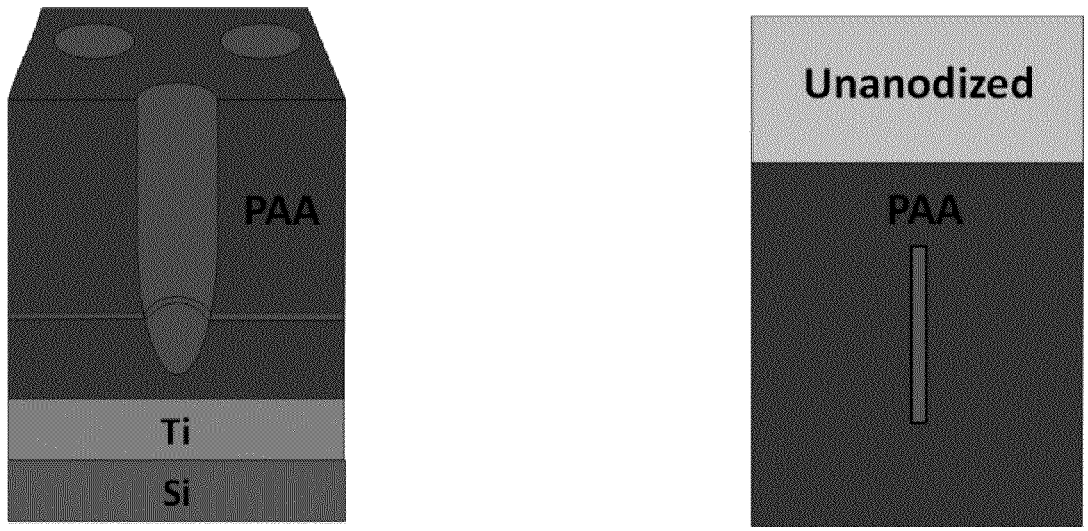
FIG. 3.1 is a cross-sectional schematic of (a) metal film stack deposited on Si wafer, (b) PAA film after anodization, and (c) SWCNTs emerging from PAA pores after undergoing MPCVD synthesis; the box emphasizes the vertical SWCNT channels.
Figures 4, 11:
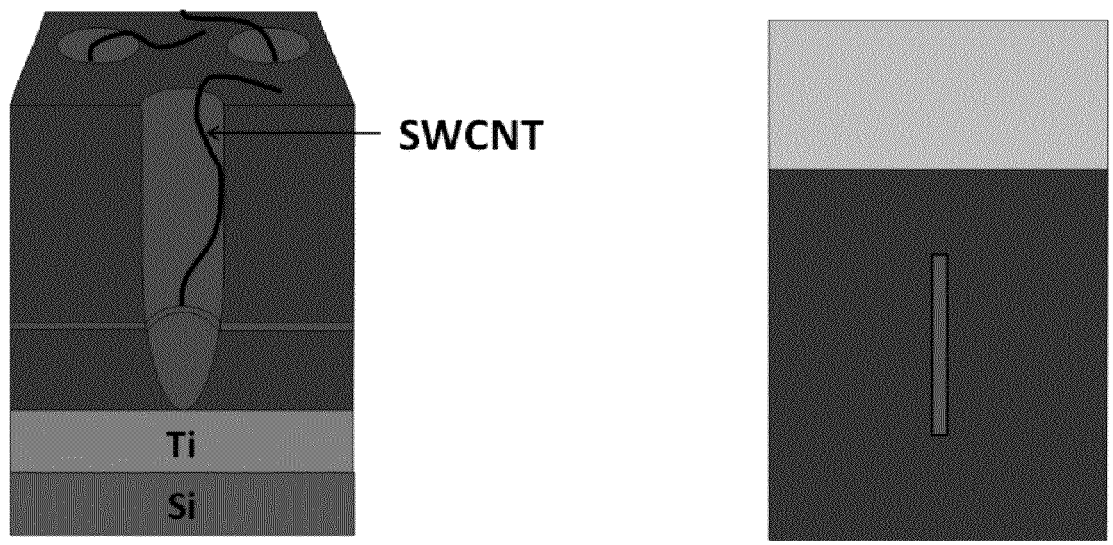
FIG. 4.1 is a schematic of a PAA structure on a silicon substrate (Si/SiOx/Ti/PAA) with the oxide (alumina) barrier emphasized.
Figures 5, 11:
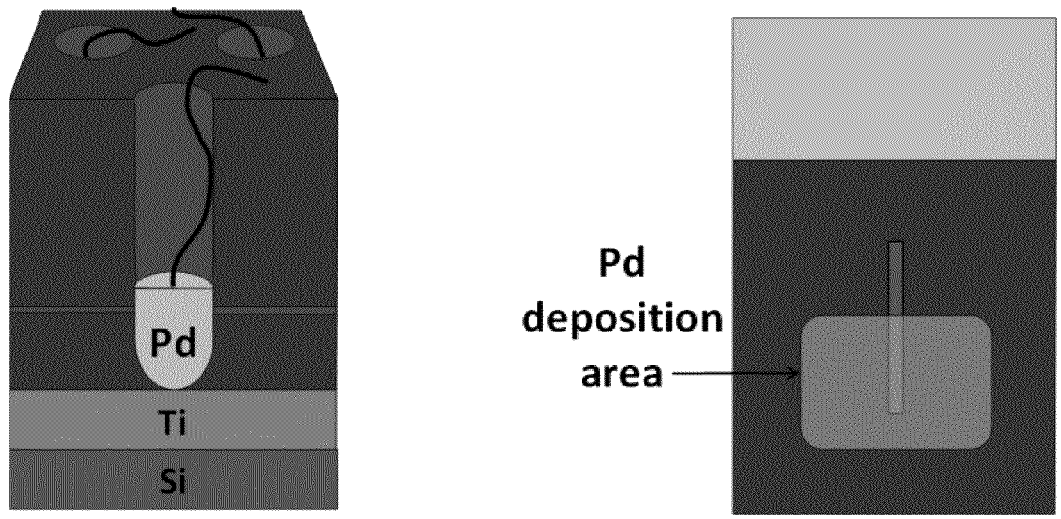
FIG. 5.1 is a tilted cross-sectional schematic of the process showing (a) an evaporated metal film stack on a Si substrate, (b) the structure following anodization and alumina barrier penetration/SWCNT synthesis by MPCVD, and (c) the result of electrodepositing Pd to form nanowires in the pores and nanocubes on the surface portion of the SWCNTs.
Figures 6, 11:
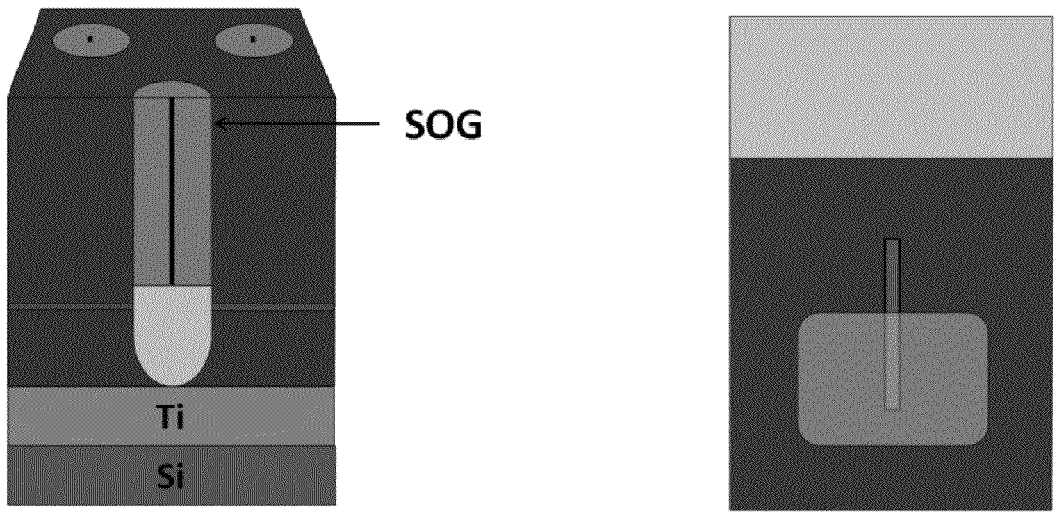
FIG. 6.1 is a process for obtaining highly ordered V-SWCNTs. Schematics illustrating (a) the EBL patterning of PMMA with a hexagonal pattern of 100 nm spacing, (b) the Al surface following a brief wet etch to transfer the pattern, and (c) the PAA template formed by anodization having self-aligned V-SWCNTs synthesized from the embedded Fe layer. (d)-(f) are top-view SEM images of a sample at each step of the process. The inset SEM image in (f) shows SWCNTs that have grown out of their respective nanopores and extend laterally on the PAA surface.
Figures 7, 11:
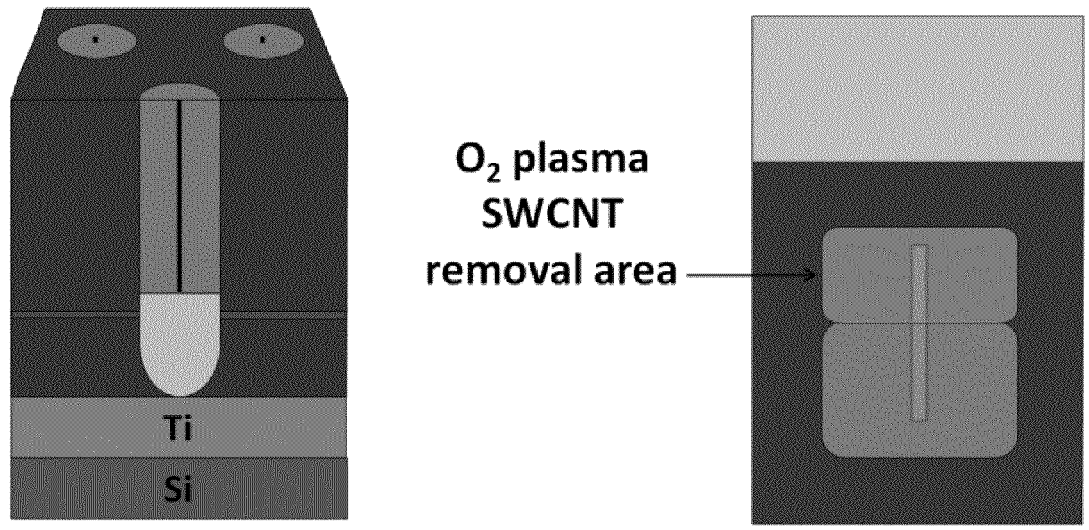
FIG. 7.1 are (a) Schematic band diagram of a hypothetical CNTFET illustrating the screening length ($\lambda$) in the channel. CNTFET schematics with (b) a bottom-gate (BG) configuration and (c) a surround-gate (SG) configuration.
Figures 8, 11:
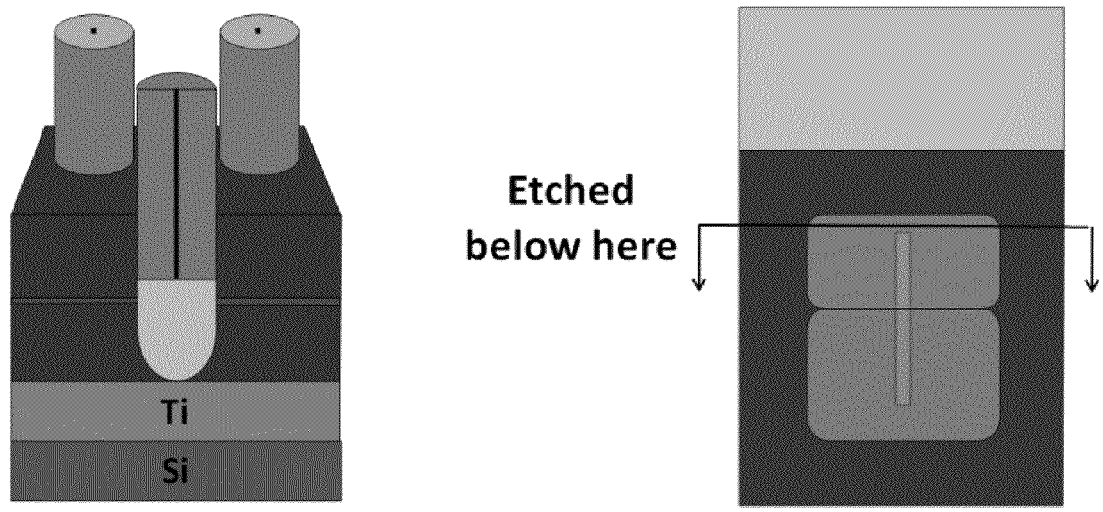
FIG. 8.1 is an (a) Optical image of two independent electrode columns, each having three PAA fields of different sizes. The PAA fields on the left column contain Pd nanocube-decorated SWCNTs while the fields on the right contain bare SWCNTs. (b) and (c) are top-view SEM images of the Pd decorated and bare SWCNT PAA fields, respectively.
Figure 11:
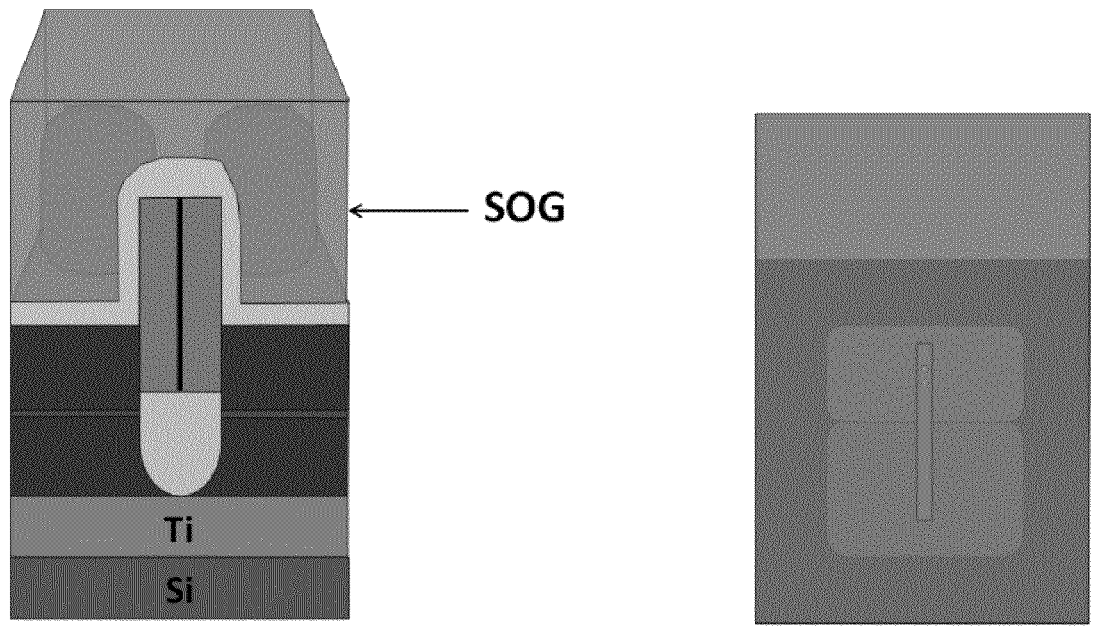

FIG. 8.4 is a current spectral density measured across a vertical SWCNT device. 1/f noise dominates the signal at frequencies below 60 kHz, while shot noise is observed at frequencies above 60 kHz. (inset) Measured current spectral density at 0 mV using (blue) 1 and (black) 200 RMS data averages.

FIG. 8.5 is a scaled, vertically offset EEDs from the K/SWCNT emitter subject to three dark conditions and illumination from an unfocused 100 mW, 532 nm laser. First number at right for each temperature is the scale factor for laser illuminated distributions, and the second number (where applicable) is the scale factor for dark conditions. An acceleration voltage of −5.0 V was applied to the heater to help emitted electrons reach the analyzer.

FIG. 9.1 is a schematics of recommended process for complete removal of alumina barrier at pore bottoms. (a) PAA fully anodized on a Ti/Pt metal film stack. (b) Ion bombardment etch removal of alumina barrier and exposed Ti. (c) Electrodeposition of Pd to the exposed Pt surface.

FIG. 9.2 is a schematics of recommended process for centering V-SWCNTs and depositing a surrounding high-K dielectric. (a) V-SWCNTs in PAA touching pore walls. (b) PAA filled with SOG (or comparable material) to center nanotubes. (c) SOG etched away. (d) ALD of HfO2 as high-K dielectric followed by a planarization step.

FIG. 9.3 is a schematics of recommended process for fabricating a template of vertical channels similar to PAA. (a) ALD of atomically smooth films on Si. (b) Lithographic patterning of resist to expose regions for vertical channels. (c) RIE etch to create vertical channels with Fe catalyst exposed.

FIG. 10-1 shows cross sectional and top views (left and right, respectively) of a process for fabricating field effect transistors according to one embodiment of the present invention.

FIG. 10-2 is a schematic representation of a process act for the embodiment of FIG. 10-1.

FIG. 10-3 is a schematic representation of a process act for the embodiment of FIG. 10-1.

FIG. 10-4 is a schematic representation of a process act for the embodiment of FIG. 10-1.

FIG. 10-5 is a schematic representation of a process act for the embodiment of FIG. 10-1.

FIG. 10-6 is a schematic representation of a process act for the embodiment of FIG. 10-1.

FIG. 10-7 is a schematic representation of a process act for the embodiment of FIG. 10-1.

FIG. 10-8 is a schematic representation of a process act for the embodiment of FIG. 10-1.

FIG. 10-9/1 shows a processing act according to another embodiment of the present invention subsequent to that shown in FIG. 10-8.

FIG. 10-10/1 shows schematic representations of the processing method subsequent to that of FIG. 10-9/1. FIG. 10-11/1 shows schematic representations of the processing method subsequent to that of FIG. 10-9/1.

Figures 11, 12:
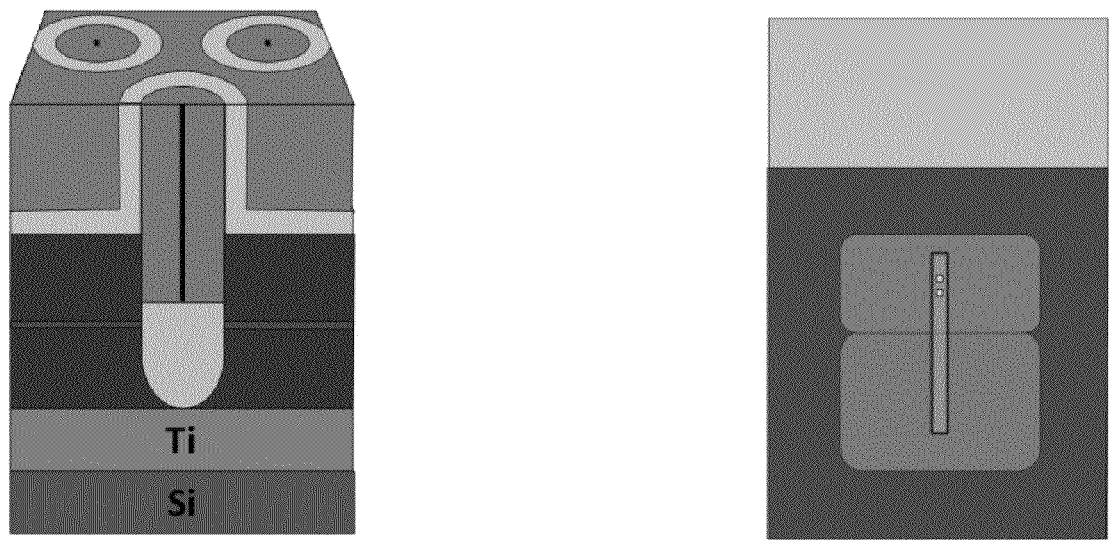

FIG. 10-12/1 shows schematic representations of the processing method subsequent to that of FIG. 10-9/1.

FIG. 10-9/2 shows a processing act according to another embodiment of the present invention subsequent to that shown in FIG. 10-8.

FIG. 10-10/2 shows schematic representations of the processing method subsequent to that of FIG. 10-9/2.

FIG. 10-11/2 shows schematic representations of the processing method subsequent to that of FIG. 10-9/2.

FIG. 10-12/2 shows schematic representations of the processing method subsequent to that of FIG. 10-9/2.

FIG. 11-1 shows cross sectional and top views (left and right, respectively) of a process for fabricating field effect transistors according to one embodiment of the present invention.

FIG. 11-2 is a schematic representation of a process act for the embodiment of FIG. 11-1.

FIG. 11-3 is a schematic representation of a process act for the embodiment of FIG. 11-1.

FIG. 11-4 is a schematic representation of a process act for the embodiment of FIG. 11-1.

FIG. 11-5 is a schematic representation of a process act for the embodiment of FIG. 11-1.

FIG. 11-6 is a schematic representation of a process act for the embodiment of FIG. 11-1.

FIG. 11-7 is a schematic representation of a process act for the embodiment of FIG. 11-1.

FIG. 11-8 is a schematic representation of a process act for the embodiment of FIG. 11-1.

FIG. 11-9 is a schematic representation of a process act for the embodiment of FIG. 11-1.

FIG. 11-10 is a schematic representation of a process act for the embodiment of FIG. 11-1.

FIG. 11-11 is a schematic representation of a process act for the embodiment of FIG. 11-1.

FIG. 11-12 is a schematic representation of a process act for the embodiment of FIG. 11-1.

Figures 11, 12, 13:
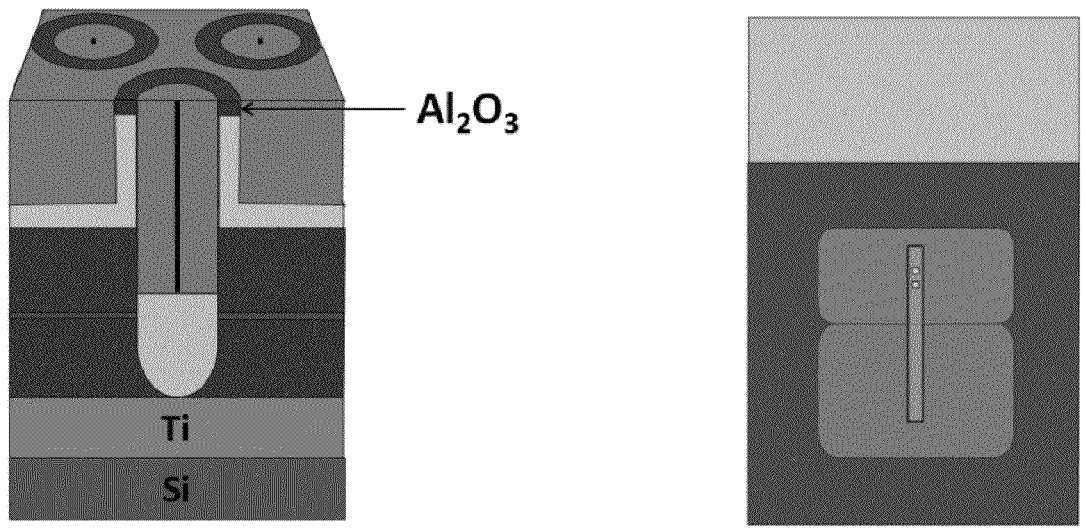
Figures 11, 12, 13, 14:
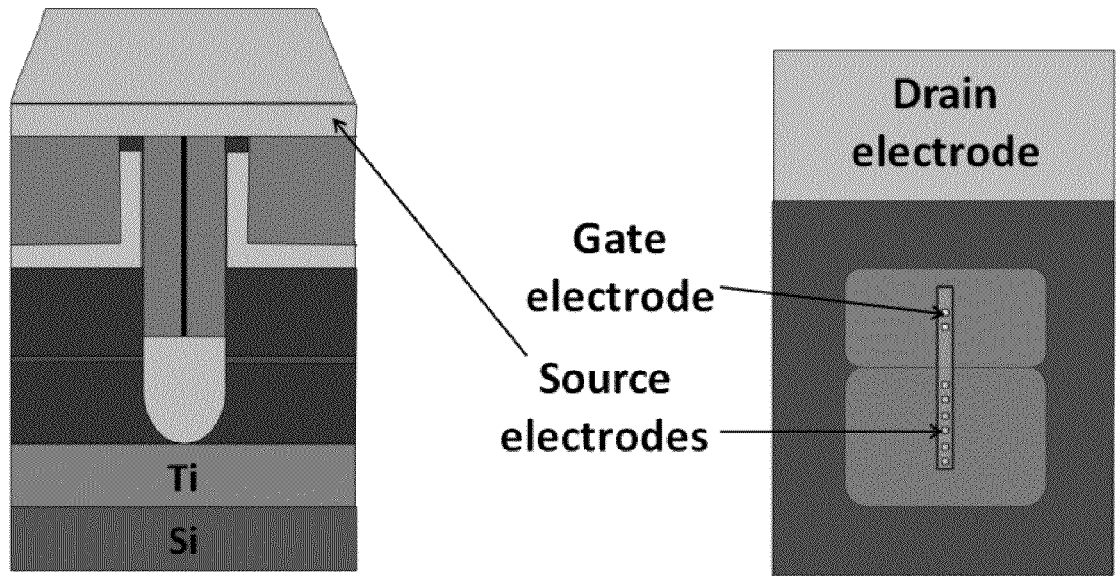

FIG. 11-13 is a schematic representation of a process act for the embodiment of FIG. 11-1.

FIG. 11-14 is a schematic representation of a process act for the embodiment of FIG. 11-1.

NOMENCLATURE d diameter, thickness, or spacing of a material, m
E Young's modulus, Pa
$F_{ad}$ adhesion force, N
h Planck's constant, 6.626×10−34 m2 kg/s
length of pillar, m
q electron charge, 1.602×10−19 C
R radius of pillar, m
R resistance, Ω
S spacing between pillars, m
voltage, V
W width of contact pad, m Greek Symbols δ displacement of pillar, m
∈ dielectric constant
κ dielectric constant
λ screening length, m Subscripts ad adhesion
BG bottom gate
body channel body
D drain
ds drain to source
G gate
ox oxide S source
SG surround gate

DESCRIPTION OF THE PREFERRED EMBODIMENT

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates. At least one embodiment of the present invention will be described and shown, and this application may show and/or describe other embodiments of the present invention. It is understood that any reference to "the invention" is a reference to an embodiment of a family of inventions, with no single embodiment including an apparatus, process, or composition that should be included in all embodiments, unless otherwise stated.

The use of an N-series prefix for an element number (NXX.XX) refers to an element that is the same as the non-prefixed element (XX.XX), except as shown and described thereafter. As an example, an element 1020.1 would be the same as element 20.1, except for those different features of element 1020.1 shown and described. Further, common elements and common features of related elements are drawn in the same manner in different figures, and/or use the same symbology in different figures. As such, it is not necessary to describe the features of 1020.1 and 20.1 that are the same, since these common features are apparent to a person of ordinary skill in the related field of technology. Although various specific quantities (spatial dimensions, temperatures, pressures, times, force, resistance, current, voltage, concentrations, wavelengths, frequencies, heat transfer coefficients, dimensionless parameters, etc.) may be stated herein, such specific quantities are presented as examples only, and further, unless otherwise noted, are approximate values, and should be considered as if the word "about" prefaced each quantity. Further, with discussion pertaining to a specific composition of matter, that description is by example only, and does not limit the applicability of other species of that composition, nor does it limit the applicability of other compositions unrelated to the cited composition.

This application incorporates by reference the following: U.S. patent application Ser. No. 11/747,680, filed May 11, 2007, titled VERTICAL CARBON NANOTUBE DEVICE IN NANOPOROUS TEMPLATES, to inventors Maschmann, Fisher, Sands, and Bashir; U.S. patent application Ser. No. 12/024,635, filed Feb. 1, 2008, entitled CONTACT METALLIZATION OF VERTICAL CARBON NANOTUBES to inventors Franklin, Maschmann, Fisher and Sands; U.S. patent application Ser. No. 12/025,453, filed Feb. 4, 2008, entitled CONTACT METALLIZATION OF CARBON NANOTUBES, to inventors Franklin, Maschmann, Fisher and Sands; and U.S. patent application Ser. No. 12/694,876, filed Jan. 27, 2010, entitled ELECTROCHEMICAL BIOSENSOR, to inventors Claussen, Franklin, Fisher and Porterfield.

In one embodiment of the present invention, a V-CNTFET templated in a single PAA pore includes a vertical SWCNT channel with a SG. The schematic modeling herein depicts various ideal conditions, such as 100% yield of semiconducting SWCNTs at a density of one SWCNT per pore of the PAA template and the ability to independently access all three contacts (gate, source, and drain) for each device. Additionally, each device includes ten SWCNTs, which is a reasonable assumption based on the need in some embodiments for a high enough ON-current to charge and discharge the capacitance of metal interconnects and switch ON other transistors. However, it is understood that these depictions are not limiting on any of the embodiments or claims included herein. FIG. 2.3 provides a schematic of a generic multi-nanotube V-CNTFET 20 illustrating the various dimensions. The SWCNT length is 150 nm within 20 nm diameter ($d_p$) pores, hexagonally arranged with a 100 nm innerpore ($d_i$) spacing (note that the schematic in FIG. 2.3 is not to scale in all dimensions). The effective gate length ($L_g$) of each SWCNT is 30 nm, with a 100 nm underlap ($L_{g\_Nw}$) on the drain end. The top contact source electrode is used to capture the desired ten SWCNT channels and has an area of 90000 $nm^2$ (equivalently 300 nm×300 nm), which is based on the pore density of ≈115 pores/$\mu m^2$. The scheme provides a gate metal that contacts all SG channels in the V-CNTFET simultaneous. Metal contacts to the source and drain are Pd and the high-κ dielectric is HfO2 (κ=20) with a radial thickness ($t_{ox}$) of 9 nm.

Top contact electrodes (vias) for the gate and drain are assumed to be the same size as that of the top source contact (90000 $nm^2$). In the hexagonal arrangement of the PAA template, the total chip 'real-estate' area that this transistor occupies would be 0.27 μm2. Accounting for some needed separation between the electrodes, a 1 $cm^2$ chip would be able to hold roughly 3.5 million of these 0.2 mA ON-current transistors (based on each SWCNT carrying 20 μA of current).

A microwave-generated hydrogen plasma is used to penetrate the bottom oxide barrier in PAA films supported on silicon substrates. A titanium layer between the alumina film and the silicon substrate is incorporated to promote adhesion and to provide a conductive layer for subsequent electrodeposition of Pd. Following the hydrogen plasma treatment, Pd nanowire arrays of controllable length and diameter are synthesized in templates of various pore diameters by utilizing the exposed Ti layer as the working electrode for electrodeposition. Of the reported techniques for penetrating the oxide barrier, the hydrogen plasma treatment process is helpful because it does not significantly widen the pores, does not form voids in the PAA, and provides consistent penetration of the oxide barrier across the template that yields nanowires with a high uniformity in length. Additionally, this process is shown to provide nanowires with ohmic contact to the underlying substrate—this characteristic is convenient for use in conjunction with further fabrication steps for nano-scale devices, such as MPCVD synthesis of CNTs.

The schematic in FIG. 5.1 portrays the synthesis of the modified PAA template with SWCNTs and their subsequent metallization by electrodepositing Pd to form nanowires in the pores and nanoparticles on the surface-portion of the SWCNTs. By electrodepositing at high current densities, the resulting Pd nanoparticles are cubic and possess rough and inconsistent surfaces; but, by sufficiently lowering the current density, Pd nanocubes with smooth and flat facets are obtained. Variation of current density and deposition time provides data that advances understanding of the mechanisms controlling nanocube formation. Furthermore, the electrochemical response and resulting nanocube deposits provide insights into the differences in electrochemistry between metallic and semiconducting SWCNTs. Obtaining shape-selective Pd deposits on SWCNTs provides a structure that can be tuned for specific applications in electronic, magnetic or optical devices and enables further research into highly functionalized catalysts and face-selective reactions. Since the nanoparticle shape dictates the arrangement of surface atoms, the ability to form specific shapes, such as cubes, creates the possibility of enhancing sensing ability and catalytic properties of Pd. In contrast, nanoparticles of less-controlled or uncontrolled shapes, such as rough spheres, have unpredictable arrangements of surface atoms.

In some embodiments of the present invention, vertical SWCNTs (V-SWCNTs) templated in ordered PAA are fabricated. These self-aligned V-SWCNTs are vertical and confined to their nanopores without a lateral extension above the surface. In further emdiments, they have a potential density of 115 SWCNTs/$\mu m^2$ with a SWCNT-SWCNT spacing of 100 nm. Source and drain contacts are established using electrochemical and physical vapor deposition, respectively. The length of the V-SWCNTs is controlled using simple deposition and/or etching techniques with a variability of ±10 nm. In yet other embodiments, nanoscale length SWCNT devices are realized without the need for lithographic patterning of the SWCNTs. In yet other embodiments, planar FETs are fabricated that demonstrate Nanostructures according to various embodiments of the present invention such as nanowires and nanotubes enable good performance for field-effect transistors (FETs), including decreased gate delay, enhanced mobility, lower power operation, and greater opportunity to scale channel length. Single-walled carbon nanotubes (SWCNTs), which structurally are rolled graphene sheets with no edge states and diameters ranging from 1 to 3 nm, exhibit excellent 1D electrostatics that allow for the good channel length scaling among nanomaterials considered for nanoelectronic applications. Some embodiments of the present invention include a surround (i.e., coaxial, annular, wrap-around) gate to obtain optimal control over the energy bands in the nanotube channel. Vertical SWCNTs (V-SWCNTs) that are free-standing and supported in a template can access to the nanotube for applying a surrounding dielectric and metal gate as well as control over device placement and channel length. Various embodiments of the present invention include the fabrication of surrounding dielectrics and gates on nanotubes along with a facile means for controlling the device channel length. An inert gas ion bombardment etch is used to define the final channel length to within a narrow range (±15 nm) over an chip and in a single step, thus eliminating or reducing any need for complex and expensive lithography. The combination of surround gates on V-SWCNTs and a method for scaling the channel length at the wafer-level provides a platform for realizing CNTFETs 1D electrostatics.

Various embodiments of the present invention pertain to apparatus and methods for fabricating electron devices, such as field effect transistors. However, it is understood that the apparatus and methods described herein are not so limited, and other embodiments contemplate fabrication devices other than FETs.

Figure 1C:
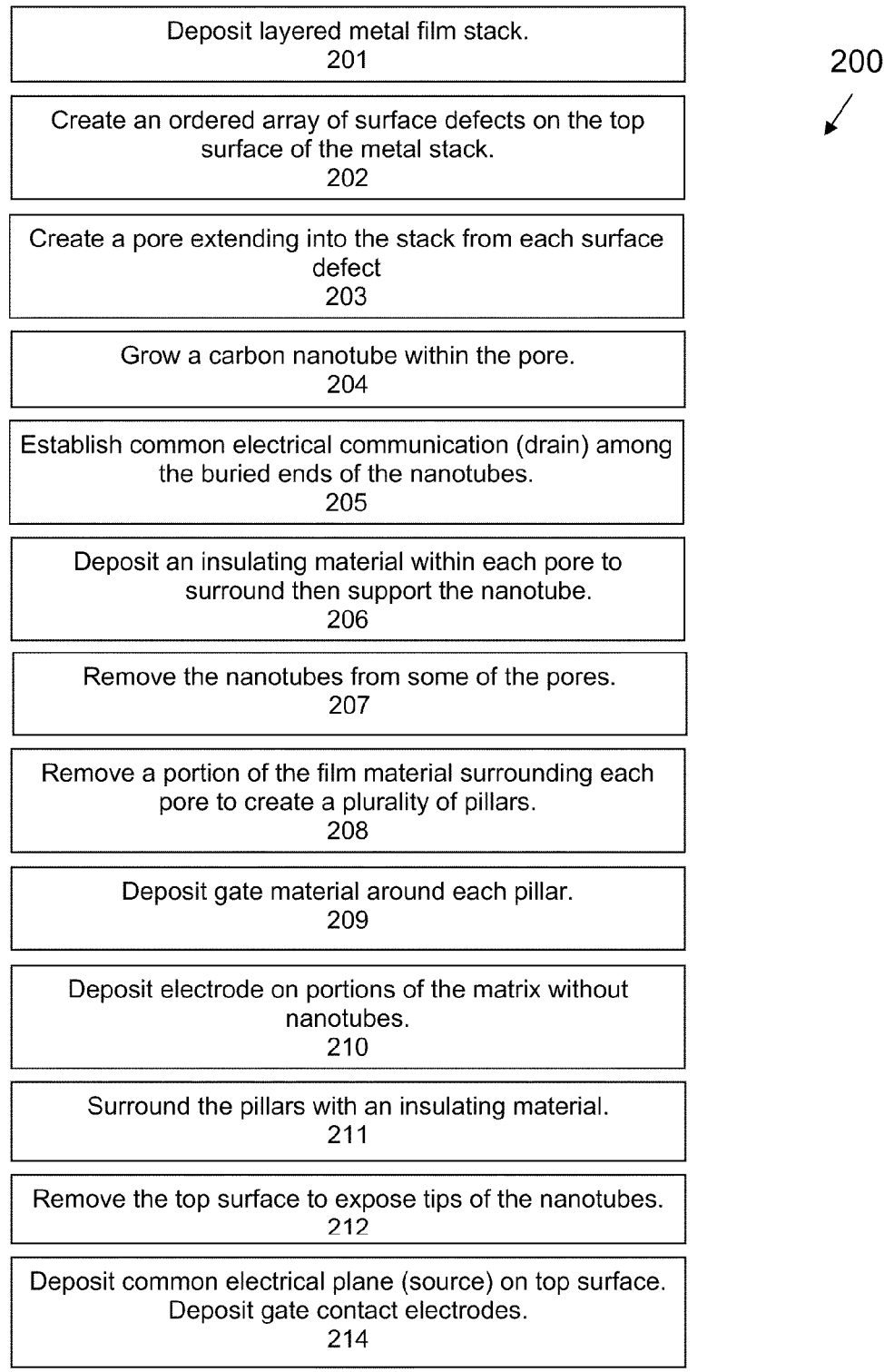
FIG. 1(c) is a method for fabricating an electronic device according to one embodiment of the present invention.
Figure 1D:
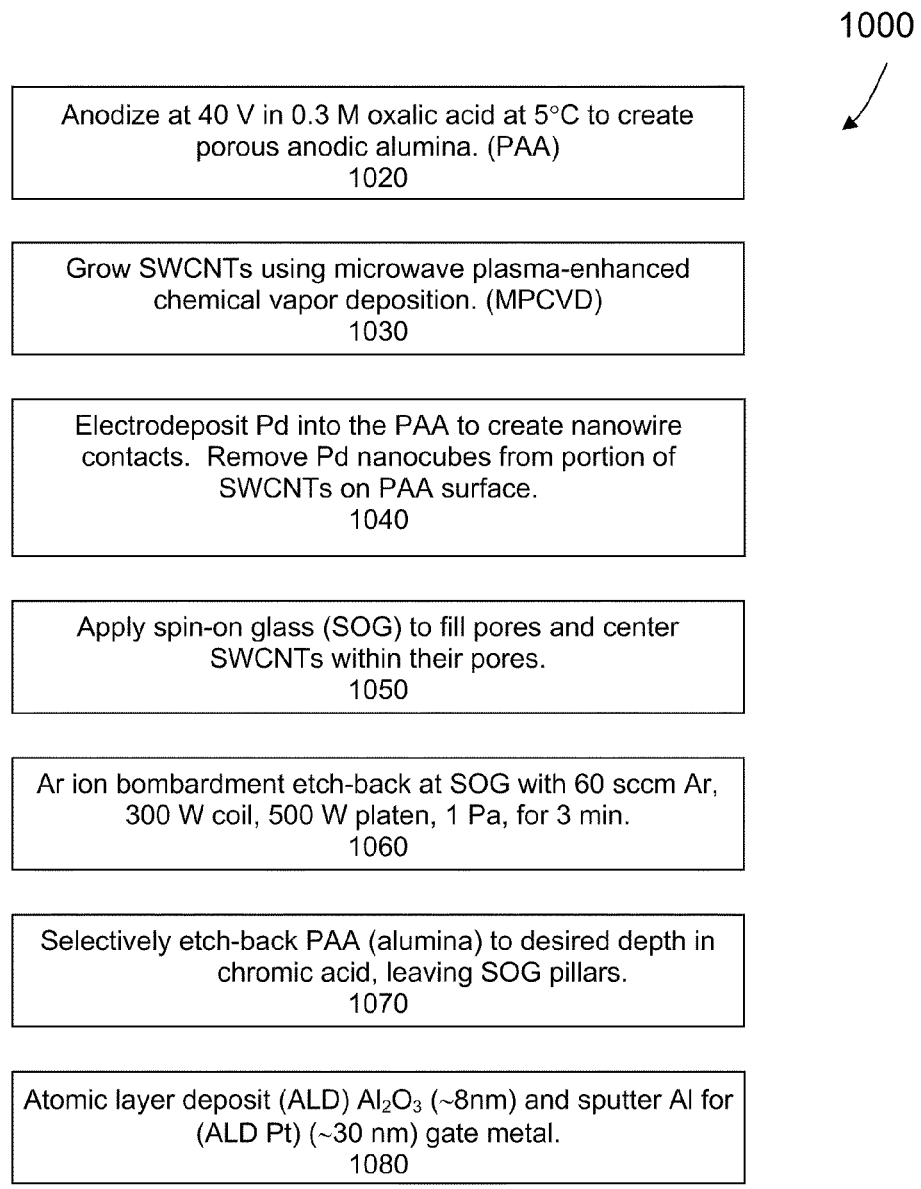
FIG. 1(d) is a flowchart representing a method according to one embodiment of the present invention.

This document provides detailed description of the apparatus and methods used in a variety of different embodiments. However, before providing detailed descriptions, FIGS. 1(a), 1(b), and 1(c) depict three methods that will be described in more detail herein.

FIG. 1(a) shows a method 100 for fabricating a portion of an electronic device such as a field effect transistor. The method includes act 101 in which a plurality of metal film stacks are placed within a matrix of insulating materials. In some embodiments, the metal film stacks are layers of electrical conductor, CNT catalysts and insulator. In some embodiments, the layers of insulating material are first deposited in metallic form, and later oxidized to a configuration that includes pores. In some embodiments, the metal stacks are placed within an insulating matrix such as silicon or silicon dioxide.

Method 100 further includes the act of creating a plurality of ordered, vertical pores within each stack. It is understood that the term "vertical" refers to a pore extending lengthwise and substantially normal from an outer surface. In some embodiments, the pores are created during the oxidation process. In yet other embodiments, the pores can be etched by other methods described herein, and yet other methods known to those of ordinary skill in the art.

Method 100 further includes the act 103 of growing a nanotube within each pore. Preferably, the pore extends within the film stack and exposes a ring of catalytic material on the inner surface of the pore. For those embodiments in which a transistor is being fabricated, the nanotube is preferably semiconducting in nature and further is a carbon nanotube. However, other embodiments of the present invention contemplate semiconducting tubes other than those fabricated from carbon, and in those embodiments not pertaining to field effect devices the carbon nanotube may be of any chirality, and further need not be fabricated from carbon.

Method 100 further includes the act 104 of establishing electrical communication among the ends of the nanotubes within the pores. This electrical communication can be established from a nanotube to a respective conducting layer within the film stack. In some embodiments a nanowire is deposited within each pore to establish electrical communication from the end of the nanotube to the common electrical plane.

Method 100 further includes the deposition of an insulator within each pore. This insulator preferably surrounds the nanotube and centers the nanotube. Further, some embodiments include the deposition of a material with good wetting properties, such that the material can wick into the nanopores.

Method 100 further includes the act 107 of removing the material surrounding the filled pores, so as to create an array of substantially vertical pillars extending from the film stack. Each pillar contains a nanotube.

Method 100 further includes the act 108 of depositing a gate material around a portion of the pillars. A current later flowing through the gate material provides the electromagnetic field that effects the semiconducting properties of the nanotube within the pillar.

FIG. 1(b) shows a method 100/1 for further processing that can be performed on the structure resulting from act 108. Method 100/1 includes the act 110/1 of the depositing insulating material around the pillars and their respective gates. Method 100/1 further includes the act 111 of removing the top surface of the stack and exposing the ends of the nanotubes. A subsequent act 112 establishes a common electrical plan (such as the drain for an FET) on top of the exposed nanotube ends. Further, electrical contact with the gates is established with a third electrical plane.

FIG. 1(c) shows a method 200 for creating an electronic device, such as a field effect transistor. Method 200 includes the acts 201 of depositing a layered metal stack. Preferably, the stack includes a layer that would act as a common electrical plane, and yet another layer that will serve as a catalyst for the creation of nanotubes. It is contemplated that acts 201 and 101 can both pertain to placing one or more metal stacks within an insulating matrix, or can pertain to a stack not contained in an insulating matrix.

Method 200 further includes an act 202 of creating an ordered array of surface defects on the top surface of the layered stack. These surface defects, in some embodiments, are nanodimples on the top surface created by photolithography, electron beam lithography, or other methods known in the art. Method 200 further includes the act 203 of creating a pore extending from the surface defect into the stack in a direction substantially normal to the surface. These pores in some embodiments are created by an oxidation process acting on the top layer of metal film, and in yet other embodiments the pores are created by a method such as EBL.

Method 200 further includes the act 204 of growing a carbon nanotube within the pore, similar to act 103 previously discussed. Method 200 further includes an act 205 similar to act 104 discussed previously.

Method 200 further includes the deposition of an insulating material within each pore, act 206, which is similar to act 105 discussed earlier.

Method 200 further includes the act 207 of removing nanotubes from some of the pores, as will be discussed later.

Act 208 includes removing a portion of the film material surrounding the filled pores and creating a plurality of substantially vertical pillars. Act 208 includes depositing gate material around each pillar, and act 210 pertains to the deposition of electrodes, including for the drain and gate.

The present invention includes a method 1000 similar to method 100, but providing specific examples. Further, described herein is a method 1000/1 that is similar to method 100/1, except providing specific examples. Yet other embodiments of the present invention are represented by method 2000, which are similar to method 200, except providing specific examples.

Various other embodiments of the inventions shown herein pertain to fabrication of field effect transistors arranged vertically within pores of an insulating material. An overview of a method 1000 is depicted in the flowchart of FIG. 1(*a*). This method begins with the formation of a layered structure as depicted in FIG. 10-1. The subsequent acts during process 1000 (acts 1020 to 1080) are represented graphically by FIGS. 10-2 thru 10-8, respectively.

The flowchart of FIG. 1(*e*) refers to the method 1001 that is a first method for continuing with fabrication of field effect transistors after act 1080. The acts 1090/1 thru 1120/1 correspond to FIGS. 10-9/1 to FIGS. 10-12/1, respectively.

A flowchart of a method 1002 that is an alternative to method 1001 is shown in FIG. 1(*f*). The acts of method 1002 (from act 1090/2 to act 1120/2) correspond to FIGS. 10-9/2 thru 10-12/2, respectively.

FIG. 1(*g*) is a flowchart for a method 2000 for fabricating field effect transistors with vertically aligned carbon nanotubes. FIG. 1(*g*) shows acts 2010 thru 2070, which correspond to FIGS. 11-1 thru 11-7, respectively.

FIG. 1(*h*) is a flowchart for a method of preparing field effect transistors, especially in those embodiments using method 2000. Method 2001 includes acts 2080 thru 2140, which correspond to FIGS. 11-8 to 11-14, respectively.

PAA is formed by anodic oxidation of Al in an acidic electrolyte. The Al is in some embodiments either a foil that is several tens of microns thick or a substrate-supported thin-film. The resulting alumina template includes vertical pores in a naturally occurring hexagonal arrangement. The pore diameter is linearly dependent on the anodization electrolyte and voltage—demonstrated pore diameter ranges from sub-10 nm to several hundred nanometers.

When synthesizing MWCNTs in PAA without a catalyst, the main formation mechanism is the adsorption of carbon on the alumina pore walls by the decomposition of hydrocarbons, and this process yields tubes of low crystalline quality. Reported MWCNT synthesis methods utilizing a catalyst yield MWCNTs that take on the diameter of the pores and in some embodiments have a high concentration of disordered carbon. However, in order to fabricate CNTFETs the channel CNT should be semiconducting, which MWCNTs are not.

It is in some embodiments more difficult to achieve SWCNT synthesis from customized templates or catalysts because of their relatively high activation energy in comparison to MWCNTs. Additionally, nucleation of SWCNTs can include catalyst particles of diameters less than a few nanometers. These two obstacles of high activation energy and difficult catalyst particle size-control are overcome in some embodiments work by burying a catalyst (such as iron) layer in a PAA template and synthesizing in a high temperature microwave plasma-enhanced chemical vapor deposition (MPCVD) environment. The plasma helps to lower the required thermal activation energy by providing a separate means for dissociating the hydrocarbon precursors, thus relieving part of the energy burden from the catalyst particle. Secondly, covering Fe with a thin layer (few nanometers) of alumina raises the surface diffusion barrier of the catalytic Fe particles and thus keeps them from agglomerating.

The catalytically active PAA template is formed by first depositing a Ti/Al/Fe/Al film stack on a $SiO_2$ covered Si wafer, as shown in FIG. 3.1(*a*). The Ti serves as an adhesion layer for the film and a conductive layer for anodization and other post-processing. In some embodiments, the first (bottom) Al layer is about 100-200 nm thick, while the top Al is about 200-1000 nm thick, and the sandwiched Fe layer is approximately 1 nm thick. Anodization is carried out in an acidic electrolyte maintained at 5° C. under a constant voltage that is applied with respect to a Pt gauze counter electrode. While there are several electrolytes that can be used in the formation of PAA, 0.3 M oxalic acid provides pores of z 20 nm diameter at an anodization voltage of 40 V, which is a good average size when working with the present catalytically-active PAA. Larger pores or smaller pores can be obtained by anodizing in phosphoric acid or sulfuric acid, respectively.

Synthesis of the SWCNTs from the catalytically active PAA is accomplished in a hydrogen-supported MPCVD with methane as the hydrocarbon precursor gas. Observations to date indicate that only one SWCNT nucleates in any given pore, likely because of the limited gaseous-carbon supply and the relatively high activation energy required for nucleation. After nucleating at the sidewall of a pore, the SWCNT proceeds to grow vertically to the surface of the PAA, towards the carbon supply. Evidence of this vertical growth is seen in cross-sectional field-emission scanning electron microscope (SEM) images showing freestanding, vertical SWCNTs, as shown in FIG. 3.2(*a*). However, some SWCNTs can grow too long to remain vertical and instead lay horizontally across the PAA surface as seen in FIG. 3.2(*b*).

Several other pre-synthesis processes can affect the SWCNT yield. First, in order to use the SWCNTs grown in the PAA for active devices, it is desirable to achieve the highest possible yield of SWCNTs. Variations in the catalyst layer thickness revealed that thick (greater than 2 nm) or thin (less than 0.5 nm) layers decreased the SWCNT yield. Pre-anodization thermal annealing provides an increase in the yield upon thermally annealing the metal film stack in air for 20 min at 450° C.

If nominal catalyst layer thickness is small (1 nm), it can be difficult to determine the uniformity of the Fe film on the Al. When less than 1 nm of Fe is deposited as the catalyst for the PAA/SWCNT template, the SWCNTs can grow from select regions of the sample as shown in FIG. 3.3(*c*). Observation of this patchy SWCNT growth led to the postulation that the SWCNT yield is hindered by the availability of catalytically active pores, which is directly related to the uniformity of available catalyst.

Two factors in SWCNT yield appear to be the catalyst layer thickness (which should be kept around 1 nm for optimal particle size) and the catalyst layer uniformity (which likely increases with increasing catalyst layer thickness). In order to balance these two competing factors, multiple catalyst layers were deposited with a vertical separation of approximately 2 nm of Al. Because confinement of the Fe nanoparticles in the alumina enhances SWCNT yield, separating the catalyst layers by a thin Al layer ensures that all catalyst is incorporated with the alumina formation during anodization, yet retains its deposited thickness. The deposition of each separate catalyst layer will yield a new random dispersion of Fe patches (FIG. 3.3(b)), which work to cover a greater percentage of the sample surface without causing an increase in the overall catalyst layer thickness since each layer is separated by the thin Al. This process is illustrated in FIGS. 3.3(a-b), with the corresponding SWCNT yield shown in FIGS. 3.3(c-d).

Other post-deposition processes can affect the SWCNT yield. One process involving PAA is an alumina etch in dilute phosphoric acid (0.1 M) to widen the pores. Pore-widening also helps to thin the intrinsic alumina barrier at the pore bottoms—the barrier hinders access to an underlying conductive layer that can be used for electrochemical post-processing. Introduction of a brief pore-widening etch on the catalyst-embedded PAA template may decrease SWCNT yield. The SEM images in FIG. 3.4 show a lower SWCNT yield in the region of a sample that was immersed in 0.1 M phosphoric acid for ten minutes.

In some embodiments of the present invention it would be helpful to have the PAA positioned next to a planar insulator for use in functionalizing devices. However, one difficulty with forming PAA within an insulator is the expansion of the Al when oxidizing to form $Al_2O_3$. In some embodiments a sequence of dry and wet etching of $SiO_2$ can provide enough space to account for this film expansion. The process involves the simple etching of lithographically defined trenches into $SiO_2$ followed by metal deposition and finally anodization.

FIG. 3.5(a, b) illustrates the process for obtaining trenches of PAA. Beginning with a Si substrate having a 1 μm thick thermal oxide, the desired dimensions of the trenches are lithographically patterned. In the present case, the trenches ranged in width from 3 to 500 μm. Preferably all of the trenches meet at a common top electrode that will be used for anodization. Once the photoresist is patterned, it is used as an etch mask for removing the desired amount of $SiO_2$ to form the trenches. The depth of the trenches should be well calibrated to the desired PAA film thickness. Using a reactive ion etch (RIE) process, 500 nm of $SiO_2$ was removed for these experiments. Following the RIE, the $SiO_2$ was etched isotropically in a 6:1 buffered oxide etch (BOE) for 30 s. This BOE etch accounts for the film expansion during anodization. After etching, 100 nm Ti, 100 nm Al, 1 nm Fe, and 300 nm Al are sequentially evaporated onto the sample. A two-hour soak in acetone is used to lift-off the photoresist, resulting in the structure shown in FIG. 3.5(a). Using the interconnected Ti as electrical path to all of the trenched Al film stacks, anodization is accomplished as outlined previously to form PAA (FIG. 3.5(b)).

After anodization, SWCNTs were synthesized from the embedded Fe in the PAA using the MPCVD process outlined above. The SEM images in FIG. 3.5(c) show a representative trench of PAA with an inset of SWCNTs extending across the junction of the PAA and neighboring $SiO_2$. This overgrowth of the nanotubes onto the $SiO_2$ provides an opportunity to fabricate planar or even semi-vertical devices. Some embodiments include the fabrication of CNTFETs using the horizontal portion of the SWCNTs as the channel and the supporting $SiO_2$ as the gate dielectric.

The procedure developed for fabricating electrically isolated fields of PAA is similar to that used for PAA trenches and is illustrated in FIG. 3.6. A large common electrode (with smaller branches that eventually serve as independent electrodes) is created by electron-beam evaporation of Ti (80 nm) and Pt (20 nm) onto a thermally oxidized Si substrate that is pre-patterned lithographically. After lift-off, 500 nm of $SiO_2$ is deposited on the chip using plasma-enhanced CVD (PCVD). Following $SiO_2$ deposition, the common electrode and a portion of the electrode branches are lithographically exposed, and the $SiO_2$ is etched using 6:1 BOE.

Another lithography step defines the fields (in this case, squares) along the branch electrodes that remain covered by the PCVD $SiO_2$. The $SiO_2$ is dry-etched in a reactive ion etcher using $CF_4$ as the active etching gas. The RIE process provides highly anisotropic removal of the $SiO_2$, and is followed by a brief (≈30 s) wet etch in BOE. The BOE etch serves the purposes of removing contaminants remaining from the RIE and of undercutting the photoresist to minimize the effects of expansion in the Al film as it anodizes to form PAA. Using the same patterned photoresist, a metal film stack of 50 nm Ti, 100 nm Al, 1.2 nm Fe, and 300 nm Al is thermally evaporated and subsequently lifted off.

By briefly wet-etching the PCVD-deposited $SiO_2$ prior to depositing the Al film stack, some effects of volume expansion of the film during formation of the PAA are significantly reduced. The BOE, being an isotropic etchant, undercuts the photoresist to provide space for the film to expand during anodization. The SEM image in FIG. 3.7(a) shows the boundary of the PAA and $SiO_2$ from a 30 s BOE etch, resulting in a gap of approximately 60 nm (the gaps in some embodiments ranges between 50 and 100 nm). Adjusting the duration of the BOE etch controls the resulting gap between the PAA and $SiO_2$. Also, the elimination of compressive stress at the $SiO_2$/PAA interface allows the resulting PAA to be planar, without a central thickening of the PAA field.

One aspect of using Ti/Pt electrodes buried beneath 500 nm of $SiO_2$ is that the Pt surface is visible in both optical and electron microscopy, enabling alignment to the electrodes when defining patterns within which the PAA is formed. FIG. 3.7(b) shows a SEM image of one PAA field that has been formed on top of an independent electrode. Square fields of various sizes were created on each electrode, ranging from 5 μm×5 μm to 100 μm×100 μm. All fields were anodized to form PAA by biasing the common electrode with 40 V relative to a Pt gauze auxiliary electrode in 0.3 M oxalic acid held at a constant temperature of 5° C. Following anodization, the common electrode was removed from the chip, leaving independent electrodes beneath fields of PAA as illustrated in FIG. 3.6(d). Pt was chosen as the surface metal for the electrodes because of its resistance to oxidation, allowing for a low-resistance contact between the electrode and the subsequently deposited Ti/Al/Fe/Al film stack. The contact between the Pt and the Ti (beneath the PAA) is provides a back contact to the nanowires that eventually can be used to address the SWCNTs electrically.

FIG. 3.7(d) shows SWCNTs extending across the interface between the PAA and $SiO_2$. Restricting the PAA to these embedded fields provides a way to estimate the density of SWCNT growth from PAA. Overall, this process for embedding independently addressable fields of PAA within $SiO_2$ provides a method for initially fabricating and interconnecting the V-CNTFETs. The $SiO_2$ support provides ample area for contact pads to be defined for accessing the Ti/Pt source contact to the nanowires and the eventual gate electrode to the SWCNT channels.

While PAA pore patterns naturally tend toward hexagonal arrangements, the nucleation of the pores at random sites of the Al surface creates the need for long anodization times on thick Al foils to allow the pores to take on their hexagonal arrangement (because of the compressive stress in the template during formation). Consequently, the use of thin-film PAA has traditionally been less common than that of PAA foils. However, because the pores will have a tendency to nucleate at defect sites on the Al surface, methods have been developed for creating ordered defects, which are simply dimples, in the Al surface prior to anodization. Of these methods, few have been developed for dimpling thin-film Al, perhaps because of the surface roughness of most deposited Al films and the inability to apply high pressures to the Al surface using stamps or molds as can be done with Al foils. Processes for dimpling thin-film Al have included the use of a focused ion beam (FIB) to mill dimples into the Al, but the FIB processing is generally not scalable to the wafer level. Some embodiments presented herein use electron-beam lithography (EBL) and wet Al-etching is used to create large regions of ordered, thin-film PAA. However, other embodiments of the present invention are not so constrained and contemplate these other methods for creating the PAA pattern.

One act in creating large regions of ordered, thin-film PAA is to pattern a resist layer using EBL. In designing the pattern to be written, it is helpful that the holes are spaced the proper distance apart and that they do not merge together. The settings for writing patterns with 100 nm spacing for one embodiment were determined to be: a beam current of 500 pA, beam step size of 2 nm, resolution of 2 nm, and dose of 8000 $\mu C/cm^2$. After the sample is exposed, the pattern is developed with constant agitation for 90 s in MIBK developer diluted 1:3 with isopropanol. After the pattern has been fully exposed and fully developed, the sample will now be at the stage depicted by the schematic in FIG. 3.8(b).

A commercial Al etchant (a phosphoric acid mixture, from Transene Company) is used to etch the Al at room temperature. The sample is held vertically and agitated from side-to-side to ensure that the etchant proceeds to the Al surface through the patterned PMMA. A 20 s etch is sufficient to transfer the pattern to the Al surface in the form of dimples, as illustrated in FIG. 3.8(c). Following the etch, the PMMA is removed in acetone.

Anodization of the now dimpled Al surface causes pores to nucleate from the dimples and thus begin with a hexagonally arranged template and the designed pore-to-pore pitch. For an inner-pore spacing of 100 nm, the anodization voltage is 40 V in 0.3 M oxalic acid. SEM images of patterned PMMA, a dimpled Al surface, and ordered pores after anodization are shown in FIG. 3.9(a), (b), and (c), respectively.

A microwave-generated hydrogen plasma is used to penetrate the bottom oxide barrier in PAA films supported on silicon substrates. A titanium layer between the alumina film and the silicon substrate is incorporated to promote adhesion and to provide a conductive layer for subsequent electrodeposition of Pd. Following the hydrogen plasma treatment, Pd nanowire arrays of controllable length and diameter are synthesized in templates of various pore diameters by utilizing the exposed Ti layer as the working electrode for electrodeposition. Of the reported techniques for penetrating the oxide barrier, the hydrogen plasma treatment process is helpful because it does not significantly widen the pores, does not form voids in the PAA, and provides consistent penetration of the oxide barrier across the template that yields nanowires with a high uniformity in length. Additionally, this process is shown to provide nanowires with ohmic contact to the underlying substrate—this characteristic is convenient for use in conjunction with further fabrication steps for nano-scale devices, such as MPCVD synthesis of CNTs.

One aspect of using PAA to template devices on pre-functionalized substrates is the presence of an intrinsic alumina barrier at pore bottoms (FIG. 4.1). This oxide layer, in some embodiments 20-60 nm thick, hinders the creation of electrical contact to either the remaining aluminum (Al) beneath the pore bottoms, or to a buried conductive layer that is designed to serve as an electrode in a subsequent electrochemical deposition process. studying one embodiments a hydrogen plasma has been used to penetrate the bottom oxide layer in PAA films having pore diameters from 10 nm to 130 nm, and supported on silicon wafers. Vertical arrays of palladium (Pd) nanowires of controllable length are then deposited into the PAA templates using a chronopotentiometry technique. Uniform deposition of the Pd nanowires suggests a consistent opening of the oxide barrier in each pore. Furthermore, ohmic contact between the Pd nanowire array and the underlying conductive layer is verified, enabling the array structure to be directly integrated into devices.

Electron-beam evaporation at a base pressure of $5\times10^{-7}$ torr was used to deposit 50 nm $SiO_x$, 150 nm Ti, and 1500 nm Al, respectively, on a thermally oxidized silicon substrate. Anodization of the Al to form PAA was performed using three electrolytes: 0.3 M $H_2SO_4$ (sulfuric acid), 0.3 M $H_2SO_4$ (oxalic acid), and 0.3 M $H_3PO_4$ (phosphoric acid). Anodization employing sulfuric acid yielded the smallest pores (5-10 nm), while oxalic acid and phosphoric acid anodization yielded pore diameters of 20-30 nm and 100-130 nm, respectively. Anodization voltages were 18 V for sulfuric acid, 40 V for oxalic acid, and 100 V for phosphoric acid. All acid electrolytes were maintained at a temperature of 5° C. during anodization. Some of the structures anodized in sulfuric and oxalic acids were immersed in 0.1 M $H_3PO_4$ solution following anodization to widen the pores slightly. To obtain highly ordered pores with thin Al films, multiple anodization steps were employed. Following the initial anodization steps, the PAA was removed by immersion in a mixture of diluted chromic and phosphoric acids, leaving the remaining Al imprinted with the pore structure of the removed PAA to serve as initiation sites for subsequent anodization steps. The samples were anodized in two or three-step processes.

Hydrogen plasma treatments were performed in a MPCVD chamber. The plasma power was maintained at 300 W at a pressure of 10 torr and a hydrogen flow rate of 50 sccm. Plasma treatments were performed for 10 minutes with the substrate maintained at a constant temperature of 900° C. using inductive heating. Treatments were also performed at room temperature to study the effect of a lower temperature environment on the penetration of the oxide barrier. Samples were cooled to room temperature in a 3 torr hydrogen ambient prior to removal from the chamber.

Electrodeposition of Pd into the PAA structures was accomplished using a three-electrode system comprised of a platinum gauze auxiliary electrode, a silver/silver chloride reference electrode, and the Ti layer beneath the PAA as the working electrode. Pd nanowires were deposited using a solution of $PdCl_2$ (0.0067 g $PdCl_2$, 0.2 mL HCl, 20 mL DI $H_2O$) in a cyclical chronopotentiometry process using a BAS Epsilon system. A constant current was established between the auxiliary and working electrodes, while the potential of the working electrode was monitored with respect to the reference electrode. For all experiments, a constant current density of 1.5 mA/cm² was applied in cycles of 500 ms duration, during which the monitored voltage ranged from 0.0887 V to 0.2081 V. To control the length of Pd nanowires, the number of cycles was varied. Following the electrodeposition of Pd, samples were characterized using a Hitachi S-4800 field-emission scanning electron microscope (SEM). Pd nanowires created in a template anodized in oxalic acid at 40 V (without subsequent pore widening) were released by removing the PAA using a NaOH mixture. These nanowires were subsequently imaged using the scanning transmission electron microscope mode of the aforementioned SEM.

The incorporation of pore widening by many reported methods for penetrating the oxide barrier limits the minimum nanowire diameter and porosity. This excessive pore widening also places the nanowires in close proximity to each other, thereby greatly limiting the ability to integrate the array into a device structure. Treating the PAA film in a hydrogen plasma did not significantly affect pore diameters. This anisotropic result allows for the fabrication of nanowire arrays in PAA templates of a wide range of diameters. From our results, templates were created with pores of diameters as small as 10 nm and as large as 130 nm. Within each template, nanowires were successfully synthesized.

As shown in the SEM images of FIG. 4.2, the length of the Pd nanowires in various templates was uniformly controlled by varying the number of 0.5 s electrodeposition cycles. In order to maintain the applied current during electrodeposition, a reduction reaction of the positive Pd ions occurs at the Ti working electrode at the bottom of the pores. If the oxide barrier was not penetrated, then the reduction of the Pd ions could not occur at the pore bottom. Therefore, uniform deposition of Pd into the PAA structures confirms a consistent penetration of the oxide barrier layer. As expected, the Pd conforms to the shape of the pores, thus replicating the pore diameter. The length of the nanowire arrays was more uniform in the larger (phosphoric acid anodized) pores, and this observation is attributed to the slower linear growth rate of the larger diameter Pd nanowires. The standard deviation of nanowire lengths was calculated by sampling various cross-sectional SEM images of each structure. Table 4.1 summarizes deviations of nanowire lengths associated with different anodization voltages and average pore diameters.

TABLE 4

Anodization voltages, average pore diameter after hydrogen plasma treatment (and thus the average diameter of Pd nanowires), and standard deviation of Pd nanowires length.

| Acid | Anodization Voltage | Average Pore Diameter | Length Std. Deviation |
| --- | --- | --- | --- |
| Sulfuric | 18 V | 30 nm | 6% |
| Oxalic | 40 V | 50 nm | 4% |
| Phosphoric | 100 V | 130 nm | 2% |

A hydrogen plasma treatment was performed with the substrate at two different temperatures (32° C. and 900° C.), as recorded from an embedded thermocouple beneath the substrate. For both temperatures used, the oxide barrier was sufficiently penetrated to allow for electrodeposition of Pd; however, samples treated at the higher temperature (900° C.) produced a more uniform penetration of the barrier. The length of the nanowires in 130 nm diameter pores of a sample treated at 32° C. had a standard deviation of 32%, compared to a similar sample treated at 900° C. with only a 2% standard deviation. The higher temperature may provide a more uniform reduction reaction rate with the alumina bottom oxide barrier. Additionally, heating the PAA to such a high temperature in a hydrogen ambient could, in and of itself, provide favorable conditions for a reduction of the oxide barrier.

After plasma treatment, the oxide barrier is still visible in most PAA structures with larger diameter pores (and thus thicker oxide barriers) when the samples are fractured for SEM imaging, as in FIG. 4.3. However, as shown at the interface of some nanowires with the Ti layer, the hydrogen-plasma treatment creates small openings in the oxide, sufficiently exposing the Ti layer. The exposure of the Ti layer beneath each pore is evident from the demonstration of uniform electrodeposition of Pd at a low potential. The thinner oxide barriers in structures with smaller-diameter pores [FIG. 4.3(c)] appear to be removed, thus exposing the Ti layer. This exposure of the Ti layer in the plasma seems to affect the planarity of the Ti surface. Because the oxide barrier is only approximately 10 nm thick for these structures, it is possibly that a thin titanium oxide layer is formed on the top surface of the Ti layer. With this titanium oxide/Ti layer more fully exposed to the plasma, this topology is thought to be a result of the titanium oxide being reduced and roughened by the plasma.

In order to use the Pd nanowires as electrodes in nanoscale devices, or for any other in situ device functionalization, electrical contact between the nanowires and the underlying substrate should be confirmed. Verification of electrical contact between the Pd nanowires and the Ti layer was obtained from three samples (anodized in oxalic acid at 40 V, sulfuric acid at 18 V, and phosphoric acid at 100 V) that were intentionally overfilled with Pd, thereby electroplating the top PAA surface. I-V characteristics were obtained between the Pd plated on the PAA top surface and the bottom Ti layer that was exposed approximately 3 mm away. Measurements were also obtained from a PAA template that was not completely overfilled by nanowires, and this sample exhibited no measurable conduction. For all three overfilled samples, ohmic contact between the Pd nanowires and the Ti layer was observed (FIG. 4.4). Pd is known to create ohmic contacts to CNTs and is therefore convenient to use in addressing template-grown CNTs.

PAA templates were fabricated previously. A metal film stack of Ti/Al/Fe/Al/Fe/Al (100 nm/150 nm/1 nm/2 nm/1 nm/350 nm) was electron-beam evaporated at a base pressure of 5.0×10⁻⁷ torr. Each sample was anodized at 40 V in 0.3 M oxalic acid maintained at 5° C., yielding pores with an average diameter of 20 nm. In one step, SWCNTs were synthesized from the embedded Fe catalyst (exposed on the inner-sidewalls of the vertical PAA pores) and the alumina barrier was penetrated to partially expose the Ti at each pore bottom using hydrogen-supported microwave plasma-enhanced chemical vapor deposition (MPCVD). FIG. 5.1(a-b) schematically illustrates this process.

Using a BAS Epsilon Electrochemical System, Pd was galvanostatically electrodeposited into the PAA/SWCNT templates. As shown in FIG. 5.2, a three-electrode setup was used with a Pt gauze auxiliary electrode, Ag/AgCl reference electrode, and the sample (initially the underlying Ti at the pore bottoms) as the working electrode. A working electrode area of approximately 0.16 cm² is defined by applying an acid resistant coating to the PAA surface. The macroscopic definition of the area creates some variation from sample to sample, but is consistent within a reasonable margin. Constant current pulses of 0.5 s were applied between the working and auxiliary electrodes, while the potential was monitored between the working and reference electrodes. Applied current density and total deposition time were varied systematically. The deposition bath was 2 mM $PdCl_2$ in 0.1 M HCl. A schematic of a sample following a Pd electrodeposition is given in FIG. 5.1(c). Scanning electron microscope (SEM) micrographs were obtained using a Hitachi S-4800 to characterize the size, shape, and density of the Pd nanocubes.

During the electrodeposition of Pd to form nanowires in the PAA, it is helpful to be able to distinguish when the nanowire front has reached the elevated catalyst layer within the pores and thus contacted the SWCNTs. If deposition continues past the point of nanowire/SWCNT contact, the nanowires will continue to grow, filling the remainder of the pore channels until, eventually, they will protrude from the PAA and Pd will electroplate the surface. In order to fit in a process flow for vertical SWCNT devices in some embodiments, the vertical channel regions should be as consistent in length as possible, which means that the extension of the nanowires past their contact to the SWCNTs should be limited. In addition to the continued growth of the nanowires, Pd nanocubes also begin to form on the SWCNTs when deposition continues past the point of nanowire/SWCNT contact.

Electrodepositions in one embodiment were performed by applying 0.5 s pulses of constant current between the auxiliary and working electrodes while monitoring the potential between the reference and working electrodes. FIG. 5.3(a) shows the working electrode potential transient during select 0.5 s pulses at 2.0 mA/cm$^2$ from a single electrodeposition. The first pulse begins with a sharp decrease in the potential related to the establishment of a sufficient electrochemical double-layer at the Ti surface and initial Pd nucleation, which requires a more negative potential due to the presence of native $TiO_x$. Note that for cathodic electrodeposition, a more positive potential corresponds to a lower deposition rate. For a constant current deposition, the potential required to maintain the current will change over time due to changes in contact barriers, double-layer effects, and effective electrode area. In this case, a more positive potential corresponds to a situation in which maintaining the current is easier. As expected, each pulse beyond the first begins at a relatively high potential and then proceeds to a Cottrelian decay, indicating a linearly diffusive deposition. A rest time of approximately one second between pulses allows the ions to redistribute to a homogeneous concentration.

Cyclic voltammograms (CVs) are in some embodiments very useful in investigating deposition mechanisms; however, CVs could not provide data to understand the present system that involves the gradual change of composition and nature of the working electrode (e.g., Ti, Pd, and SWCNTs) over time. One metric for analyzing the time-dependent changes at the working electrode during electrodeposition is the steady-state potential (or the final potential) from each pulse as a function of deposition time.

Plots of the steady-state potential versus deposition time for several 2.0 mA/cm$^2$ depositions are shown in FIG. 5.3(b). The initial steady-state potential is quite low and quickly becomes more positive as Pd nucleates on the Ti at each pore bottom (region I). At approximately 30 s, the growth-front of the nanowires begins to reach the embedded Fe layer from which the SWCNTs protrude (150 nm from the Ti), which can be seen in FIG. 5.4(e). Over the next 50 s, the potential decreases by 20 mV (region II), which is believed to correspond to a progressive contacting of the SWCNTs by the Pd nanowires and electrical charging of their quantum and double-layer capacitances for the nucleation of Pd. This gradual contact to the SWCNTs is consistent with the observed variation in Pd nanowire height within the pores. The region II decrease in potential was not observed for the pulsed growth of Pd nanowires in PAA when SWCNTs were.

Around 80 s, the potential upturns and increases by more than 50 mV over the next 50 s before tapering off again (region III). This large increase is due to the increase in the working electrode area from the addition of the SWCNTs. The SWCNTs can now also reduce $Pd^{2+}$, generating additional cathodic currents, which results in a more positive potential to maintain the same level of total current. Note that the size of the Pd nanocubes nearly doubles and the nanowire height increases between the demarcation of regions II and III (75 s deposition, FIG. 5.4(b, e)) and the final condition in region III (200 s deposition, FIG. 5.4(c, f)).

In some embodiments it is preferred that the current density for forming Pd nanocubes is one that is large enough to enable Pd nanowire nucleation and growth from each pore bottom yet small enough to obtain nanocubes without rough surfaces. Electrodeposition at current densities below 1.0 mA/cm$^2$ greatly reduces the nanowire density; current densities above 3.0 mA/cm$^2$ produce nanocubes with rough and spiky surfaces as well as increased nucleation on many SWCNTs. Therefore, the current density was varied between 1.0 and 3.0 mA/cm$^2$, and the plots of the steady-state potential as a function of deposition time are shown in FIG. 5.5(a). Note that the decrease in potential (~20 mV) associated with the charging of the SWCNTs' capacitances is independent of current density, which is attributed to the consistent density of SWCNTs on each sample. However, while the magnitude of the potential shift is consistent between the depositions, the rate of change depends on the current density. At low current density (1.0 mA/cm$^2$) the rate of change in potential is low, corresponding to a slow growth rate of the nanowires and thus the gradual contact of the SWCNTs by Pd nanowires. In contrast, deposition at 3.0 mA/cm$^2$ has a high rate of change as the nanowires quickly contact the available SWCNTs.

After adding the SWCNTs to the working electrode, a deposition pulse causes $Pd^{2+}$ to reduce at their surfaces. FIGS. 5.4(a-c) and 5.6(a-c) show nanocubes on SWCNTs from various depositions. The Pd nanocubes annularly encompass the SWCNTs as opposed to forming solely on their top portion and further pinning them to the surface. This annular deposition is attributed to the weak binding of the SWCNTs to the PAA surface.

Some embodiments of the present invention pertain to methods in which the Pd deposits have a selective and distinct shape. A combination of mechanisms could be contributing to the formation of Pd crystals with well-defined cubic shapes. First, equilibrium Pd nucleates in truncated octahedral shapes with {100} and {111} facets. It appears that Cl$^-$ ions in the deposition solution serve as additives that selectively adsorb on the {100} planes, enhancing the stability of these planes. This preferential adsorption reduces the crystal growth rate along the <100> direction and makes {100} planes gain in area while other planes, with relatively faster growth rates along their normal directions, grow out of existence in the final morphology, resulting in cubic shapes.

Secondly, the SWCNTs here are supported on PAA instead of a planar insulator (such as $SiO_2$), and the lack of intimate contact between the SWCNTs and the PAA surface would allow the nanocubes to drift freely in the electrolyte, being tethered by SWCNTs that are bound only at one end by their nucleation sites within the pores. Therefore, the SWCNTs can be fully exposed to the solution for Pd deposition. Combined with the relatively low nucleation density of Pd on the SWCNTs, the fully exposed SWCNT surface allows each Pd nucleus to build a spherical diffusion layer around it, which promotes isotropic and uniform growth of cubic Pd crystals.

Another factor that may contribute to the tendency toward cubic shapes is the lack of post-synthesis processing of the SWCNTs. SWCNTs are transferred directly from the MPCVD synthesis chamber to the electrolyte for electrodeposition, allowing the SWCNTs to maintain, as nearly as possible, their as-grown characteristics.

After initial Pd nucleation to the SWCNTs further pulses cause reduction at the Pd nanocube surface at a mass-transfer rate proportional to the applied current density. Therefore, it is expected that higher current densities will yield nanoparticles with less stable morphologies having rough and patchy surfaces, as is evident with the nanocube in FIG. 5.6(c) from a 3.0 mA/cm$^2$ deposition. As the current density is lowered, Pd is deposited at a slower rate and the nanocube surface becomes smoother. It was observed that a current density of 1.0 mA/cm$^2$ is capable of both nucleating a high density of nanowires and forming smooth-surface nanocubes on the SWCNTs (FIG. 5.6(a)).

The increasing size of the nanocubes in FIG. 5.6(a-c) is due to the increasing deposition current density for the same deposition time; a longer 1.0 mA/cm$^2$ deposition (not shown) yielded larger nanocubes that still maintained the smooth-surfaces. Within the resolution limits of the SEM, the nanocubes appeared to be approximately uniform in size, though there is likely a small variation within ten nanometers. Not all observed Pd nanoparticles are nanocubes; at higher current densities various unstable shapes are formed. While lower current density depositions increase the percentage of Pd nanocubes, the disordered Pd nanoparticles are not completely eliminated. Many of these unstable formations likely derive from SWCNTs that are too strongly bound to the PAA surface and thus are not able to float in the solution to fully expose their surface area (see FIG. 5.5(b)). For the 1.0 mA/cm$^2$ depositions, the average fraction of Pd nanoparticles that are nanocubic is 70%, which was determined by counting the nanoparticle formations in 500 µm2 areas from several low magnification SEM images. Some embodiments of the present invention include decreasing the current density at the onset of Pd nanoparticle formation to the SWCNTs in order to increase the percentage of nanocubic nanoparticles.

One observation is the presence of Pd nanocubes on the SWCNTs before the Pd nanowires have contacted the SWCNTs, as shown in FIG. 5.4(a, d). As previously reported by Choi et al., certain noble metals in salt solutions can spontaneously be reduced at SWCNT sidewalls without the presence of reducing agents or an applied potential. In order to verify that Pd was in fact spontaneously reducing, several samples were immersed in the 2 mM PdCl$_2$ solution, and Pd nanocubes were subsequently observed on a portion of the SWCNTs (FIG. 5.7(b)). The density and size of the nanocubes saturated within 30 s at a cube size of approximately 20 nm.

Few of the SWCNTs hosted spontaneous Pd nanocube formations, and the SWCNTs that did were the brightest when viewed in the SEM. It is possible that the brighter SWCNTs on the insulating PAA surface are metallic while those that are dark are semiconducting. FIG. 5.7(c) illustrates in an energy level diagram the difference between metallic and semiconducting SWCNTs in the spontaneous reduction process. With the SWCNT work function in the range 4.8 to 5.2 eV, the SWCNT Fermi level would be located approximately 0.6 V from the standard hydrogen electrode (SHE). Therefore, m-SWCNTs would be at a more negative potential (higher energy) than the reduction potential of Pd$^{2+}$ (the standard reduction potential of Pd$^{2+}$ is 0.951 V), which would allow reduction of the Pd$^{2+}$ ions to Pd without an applied potential (see FIG. 5.7(c)). However for s-SWCNTs, because of their energy bandgap (assumed to be ≈0.8 eV in the present diagram with the Fermi level at mid-gap), electrons in the valence band are at a more positive potential (lower energy) than the Pd$^{2+}$ reduction potential and therefore do not spontaneously transfer to support the Pd$^{2+}$/Pd reduction.

In scanning electron microscopy, conductors appear bright compared to insulators because of the ease with which secondary electrons can be emitted from them. When imaging SWCNTs on PAA, prior to any post-synthesis processing, a portion of the SWCNTs appear bright while the rest are darker as shown in FIG. 5.7(a). This unusual observation of distinct contrast differences among SWCNTs on an insulating surface may be specific to the present PAA surface. Brintlinger et al. reported that SWCNTs exhibit contrast differences in SEM imaging based upon their electrical connection to a local metal pad. However, in the present study the SWCNTs exhibit such differences while supported solely by the porous alumina insulator, prior to any post-synthesis processing.

In the experiments performed by Brintlinger et al., as with most other reports of SWCNTs imaged using SEM, the SWCNTs were supported on a planar SiO$_2$ substrate. Furthermore, Brintlinger et al. observed a decrease in contrast and overall visibility of the SWCNTs for accelerating voltages greater than 2 kV and/or slow scan speeds; in comparison, the images shown herein used a 5 kV accelerating voltage and observed an increase in the contrast with increasing voltage as well as with slower scan speeds. Notably, low-magnification SEM images show that approximately one-third of the SWCNTs on the PAA are bright (see FIG. 5.7(a)), consistent with the statistical yield of one-third metallic SWCNTs from CVD synthesis. When the SWCNT density in the PAA is increased, the SWCNTs begin to bundle, and eventually all SWCNTs on the PAA surface appear bright, because each is a part of a bundle that has at least one m-SWCNT. The spontaneous reduction of Pd solely at the bright SWCNTs supports the hypothesis that these SWCNTs are metallic. A variation of the m-SWCNT work function may also play a role because not all of the bright SWCNTs are spontaneously decorated. Furthermore, spontaneous reduction likely occurs at defect sites on the m-SWCNTs, so that the bright tubes without decoration could also be defect-free as previously observed with the spontaneous reduction of Pt on graphite.

The process for obtaining highly ordered PAA thin films and subsequently synthesizing V-SWCNTs within the nanopores is and illustrated in FIG. 6.1. Some embodiments are fabricated with a film stack that was thermally evaporated onto a thermally oxidized (500 nm) Si substrate: 100 nm Ti/100 nm Al/1 nm Fe/2 nm Al/1 nm Fe/300 nm Al. Polymethyl-methacrylate (PMMA) resist was then applied, and a hexagonally arranged pattern exposed using electron beam lithography (EBL). Even though EBL was used for the demonstration herein, this redundant pattern can also be produced at the wafer scale using nanoimprint or interference lithography, for example.

After development, the hexagonal pattern is transferred to the Al surface by a 25 s wet etch using Transene Al-Etchant Type A at room temperature with moderate agitation. The resulting pits in the Al surface, seen in FIG. 6.1(b, e), serve as the nucleation sites for pore formation in an electrochemical anodization. In 0.3 M oxalic acid, the samples were anodized at 40 V until the current decreased from the range of several mA to several pA, indicating the complete anodization of the Al layers to form PAA.

Microwave plasma-enhanced chemical vapor deposition (MPCVD) was subsequently used to synthesize the SWCNTs, which nucleate at the embedded Fe layer within the pores and grow vertically to the PAA surface with a yield of one SWCNT per pore. The density of SWCNTs in the present templates was kept low by growing for times of 1 min or less in order to facilitate the testing of single (or few) nanotube devices per 100 μm2 contact area. The portions of the SWCNTs that protrude from the pores are removed in a subsequent etch to leave the vertical channels of V-SWCNTs within the nanopores.

The spacing between nanopores in the hexagonally arranged template is 100 nm, which yields a potential V-SWCNT density of 115 SWCNTs/μm². Source contacts to the V-SWCNTs were made by electrochemically depositing Pd nanowires within the PAA pore bottoms as described previously. The standard deviation in the length of these nanowires is 4% or less than 10 nm in the present case. A spin-on glass (SOG) dielectric (Honeywell 214) was then applied at 6000 rpm for 30 s followed by a 450° C. cure in N2 for one hour to support each V-SWCNT within its respective pore. The SOG fills the pores, provides a passivating dielectric support of the V-SWCNTs, and forms a planar layer on the PAA surface that is ≈180 nm thick.

Removal of this surface SOG was accomplished using an inductively coupled plasma reactive ion etcher (ICP-RIE). An inert gas plasma was supported by 60 sccm Ar at 1 mTorr and 300 W of coil power while the Ar ions were accelerated to the sample surface with an 800 W platen bias power. The resulting ion bombardment etch removes the 180 nm of surface SOG, along with the portions of the SWCNTs that extended along the PAA surface in 80 s. Continued ion bombardment etching past 80 s removes the PAA/V-SWCNT template at a vertical rate of 40 nm/min as determined from 42 etching trials with different etching times. After the etch, the top of the SOG within the nanopores is relatively level with the PAA surface. A further act in fabrication is the evaporation of 8 nm Pd/20 nm Ti/60 nm Au top contacts of various lithographically-defined sizes completes the fabrication of vertical two-terminal devices.

FIG. 2.3($a$) illustrates the final SWCNT length ($L_{CNT}$) in these devices, which is defined from the top of the Pd nanowire source contact to the top of the PAA template. $L_{CNT}$ has been controlled by a combination of the initial top Al layer thickness (300 nm in the present case) and the ion bombardment etch time on the PAA/V-SWCNT template. The accuracy of controlling $L_{CNT}$ from device to device by the top Al thickness depends on the uniformity of the Al film. The roughness of the Al film is determined by the deposition process, which was thermal evaporation in this case with a surface roughness around 40 nm, as determined from cross-sectional field-emission scanning electron microscope (SEM) images of the deposited film. Control of the length from sample to sample by varying the initial Al thickness can be accomplished with reasonable accuracy preferably by taking into account expansion.

The ion bombardment etch yields very accurate control over the V-SWCNT length as compared to simply varying the Al thickness. The etch rate of the surface SOG (2.25 nm/s) is more than three times faster than the etch rate of the PAA/V-SWCNTs (0.67 nm/s). This rate difference enables close control in defining the V-SWCNT length. As seen in the SEM image of FIG. 6.2($b$), the final $L_{CNT}$ is also affected by the uniformity of the Pd nanowire height and the roughness of the initial substrate and underlying films. Taking these factors into consideration, the ion bombardment etch has produced nanoscale V-SWCNT lengths with a variability of ±10 nm from device to device as determined from cross-sectional SEM images over hundreds of devices. FIG. 6.3 shows cross-sectional SEMS of several different V-SWCNT device structures with lengths from 50 nm to 260 nm that have been defined using the ion bombardment etch for different durations. Some embodiments contemplate channel lengths between about 50 nm and about 150 nm are optimal for CNTFETs (with top gates) to avoid short-channel effects while still maintaining ballistic transport.

Electrical characteristics from a two-terminal V-SWCNT device consisting of one metallic and one semiconducting nanotube are given in FIG. 6.4. The dimensions of the top contact for devices tested are 10 μm×10 μm, which yielded between zero and two V-SWCNTs per device (the density of nanotubes was purposely kept low to achieve devices consisting of single V-SWCNTs). Initially, the device in FIG. 6.4 exhibits nearly symmetrical, linear I-V characteristics. When a high bias is swept, the conductance drops abruptly by over an order of magnitude, corresponding to the breakdown (burn-out) signature of a metallic tube as observed in planar devices. The conductance does not drop to zero but rather remains at a few tenths of a micro Siemens. This conductance is attributed to a remaining semiconducting V-SWCNT as observed by the red I-V curve in FIG. 6.4($a$) that was obtained after burn-out of the metallic nanotube. The nonlinear behavior results from Schottky barriers (SBs) at the contacts to the semiconducting nanotube. While SBs are in some embodiments small for p-channel transport in Pd-contacted nanotubes, they can still be present. Also, the slight asymmetry in this I-V characteristic suggests a disparity in the SB height between the two contacts (examined in greater detail in relation to FIG. 6.6). A final high-bias sweep burns out the semiconducting V-SWCNT as shown in the red curve of FIG. 6.4($b$).

With a V-SWCNT length below 300 nm (close to the mean free path for acoustic phonon scattering), a generally defect-free, metallic nanotube should be ballistic and exhibit a low-bias conductance near the theoretical limit of 4 q²/h (154.8 μS). The substantially lower conductance observed here is attributed to the series and contact resistances in the device. The low conductance of the semiconducting V-SWCNT is attributed to the normally-OFF nature of semiconducting nanotubes in terms of band positions under no gate bias (illustrated in FIG. 6.6($b$)). The same conductance range was observed in more than 60 other semiconducting V-SWCNT devices from several samples (see FIG. 6.5). The conductance did not show dependence on the V-SWCNT length with the $L_{CNT}$ below ≈300 nm. Devices with lengths in the range 50 nm to 260 nm were studied. Four of the 78 devices tested contained metallic nanotubes—the statistical yield based on the chiral vector is one-third metallic nanotubes from a CVD growth, and therefore, this result suggests for some embodiments a possible selectivity toward semiconducting nanotubes.

FIG. 6.6 displays the I-V characteristics of a single semiconducting V-SWCNT device. The orange curve was obtained using the top contact as the drain, while the purple curve was obtained with the contacts reversed. The disparity between the two curves in FIG. 6.6 suggests a difference in the metal-SWCNT transport properties at the top and bottom contacts. One cause for such a contrast would be a disparity in the SB height at the contacts, which would cause a difference in current due to the exponential dependence of the current on the SB height. The Pd nanowire bottom contact is formed around the V-SWCNT within the nanopore, which allows for transport to occur between the metal and sidewalls of the nanotube. In contrast, the top contact is deposited directly to the tip of the V-SWCNT (see FIG. 6.2($a$)), possibly enabling improved transport between the metal and the opened carbon bonds that were created during the ion bombardment etch. A certain length of metal-SWCNT sidewall contact is helpful to obtain a coupling—too strong of a coupling could hamper the carrier transport.

Qualitative band diagrams for a possible configuration of the semiconducting device are shown in FIG. 6.6(*b*, c) with operation under the two different contact configurations and the assumption that the SB at the bottom contact is substantially larger than the SB at the top contact. When the drain bias is applied to the top contact, the hole current from the source is suppressed by the SB. With the drain at the bottom contact, the smaller SB to the valence band on the source end allows for holes to flow from the source. This effect can be seen both in the faster rise of the associated purple I-V in FIG. 6.6(*a*) and the larger resulting current at $V_{ds}=-1$ V.

Templated, V-SWCNTs have several aspects in nanoelectronic applications. First, the V-SWCNT length can be scaled down without the use of lithography. Variation of the ICP-RIE ion bombardment etch time (a rate of about 40 nm/min) provides control over $L_{CNT}$, which in the context of fabricating CNTFETs would serve as the device's channel length. FIG. 6.3 shows SEM images that demonstrate the scaling of $L_{CNT}$ using the ion bombardment process. Additionally, the length scaling is accomplished for devices on a chip in a single step compared to the typical use of EBL to write each individual device one at a time.

Another aspect of the V-SWCNT structure is the ability to obtain individual channels of V-SWCNTs that are wrapped in a dielectric (SOG in this case). While SOG was used as a dielectric support for the nanotubes herein, the V-SWCNTs could alternatively be coated with a high-κ dielectric using atomic layer deposition (ALD). When fabricating multi-nanotube devices for interconnects or FETs, the individual channels of V-SWCNTs will minimize deleterious charge screening between nanotubes that other configurations encounter as the nanotubes become more closely packed and bundled. In some embodiments density of nanotubes in the V-SWCNT templates is an order of magnitude greater than some densities reported to date for planar configurations. Other aspects include the ability to use these V-SWCNT templates for fabricating surround-gated CNTFETs, creating ordered arrays of V-SWCNTs of adjustable density, or even using the V-SWCNT tips as probes for biological interfacing.

To provide additional verification of the presence of semiconducting nanotubes in the V-SWCNT templates, planar CNTFETs were fabricated from the nanotubes. On the Each field of PAA was surrounded by a region of 200 nm-thick $SiO_2$ using a process reported in previously. The SWCNTs were grown for a longer time (15 min as opposed to 1 min for low density growth), which caused them to extend out of their pores and along the PAA surface (see FIG. 6.7(*a*)) and eventually over the SiO2 regions. Pd source and drain contacts were lithographically defined to contact the SWCNTs on the SiO2 surface. The Si substrate was used as a back gate during measurement, as illustrated in FIG. 6.7(*a*).

The final devices had long channels (3 μm), which caused them to operate in the diffusive transport regime. However, these devices were sufficient for identifying the semiconducting nature of the SWCNTs by use of the back gate. FIG. 6.7(*b*) shows the subthreshold characteristics from two representative devices, which exhibit $I_{on}/I_{off}$ ratios of over five orders of magnitude. The divergence in threshold voltage between the two devices is partially attributed to the lack of passivation, which has been noted in the past to cause a shift in threshold.

The screening length (λ) is an intrinsic property of a device configuration that represents the natural length over which potential is dropped between two electrically different materials (e.g., p-n or metal-semiconductor junctions). A similar intrinsic length often introduced in bulk semiconductor electrostatics is the Debye length, which traditionally represents some factor of the depletion width of a p-n junction in thermal equilibrium for a semiconductor with a particular doping level. The Debye length is a device parameter that depends on doping and temperature, while the screening length is an intrinsic parameter that depends only on dielectric/channel properties and thicknesses. For nanoscale devices, the smaller of these two lengths will determine the distance over which the bands bend—for thin body devices (e.g., nanowires or nanotubes) the doping would have to be high to render a Debye length shorter than λ.

In nanoelectronic devices according to some embodiments, λ offers a metric for determining how aggressively a device's channel length can be scaled down without incurring short-channel effects, such as high leakage currents and drain-induced barrier lowering (DIBL). One proposed rule-of-thumb according to some embodiments for scaling nanoelectronics is to keep the channel length greater than 3λ in order to maintain long-channel device behavior. FIG. 7.1(*a-b*) illustrates the screening length for a hypothetical CNTFET. For any 1D cylindrical channel (nanotube or nanowire) in a bottom-gate (BG) configuration, λ can be found using:

$$\lambda_{BG} = \sqrt{\frac{\varepsilon_{body}}{\varepsilon_{ox}} d_{ox} d_{body}} \qquad (7.1)$$

In equation 7.1, $\varepsilon_{ox}$ is the dielectric constant of the gate dielectric, $\varepsilon_{body}$ is the dielectric constant of the channel material (nanotube or nanowire), $d_{ox}$ is the gate dielectric thickness, and $d_{body}$ is the thickness (diameter) of the nanomaterial.

A schematic for a SG CNTFET is shown in FIG. 7.1(*c*). As compared to the BG geometry, the SG improves control over the electrostatics, and the potential distribution in the channel changes to give the following relation for the screening length:

$$\lambda_{SG} = \sqrt{\frac{\varepsilon_{body} d_{body}^2}{8\varepsilon_{ox}} \ln\left(1 + \frac{2d_{ox}}{d_{body}}\right)} \qquad (7.2)$$

FIG. 7.2 shows the variation of screening length from the two device geometries as a function of the parameters $d_{body}$, $d_{ox}$, $\varepsilon_{ox}$, and $\varepsilon_{body}$. These plots illustrate one aspect of an SG geometry, which allows for a channel length nearly an order of magnitude less than a BG geometry while still avoiding short-channel effects (based on the rule of a 3λ channel for long-channel behavior). In terms of the choice of channel material, the term $\varepsilon_{body}$ plays a minor role while $d_{body}$ strongly affects the screening length. It is this influence of a small $d_{body}$ that gives SWCNTs (in some embodiments 1-2.5 nm in diameter) a possible advantage over semiconductor nanowires (in some embodiments 10-100 nm in diameter). Another observation from FIG. 7.2 is that the oxide thickness has less impact on λ in the SG geometry than in the BG geometry.

FIG. 7.3 illustrates one process for fabricating SGs on V-SWCNTs templated in PAA. Beginning with a thermally evaporated thin film of 100 nm Ti/100 nm Al/1 nm Fe/2 nm Al/1 nm Fe/300 nm Al (bottom to top) on a thermally oxidized Si wafer, PAA is formed by anodizing the Al in 0.3 M oxalic acid at 40 V relative to a counter Pt gauze electrode at a constant temperature of 5° C. The resulting template contains pores with an average diameter of 20 nm at a spacing of approximately 100 nm. The V-SWCNTs are synthesized in a microwave plasma-enhanced chemical vapor deposition (MPCVD) system flowing 50 sccm hydrogen and 10 sccm methane gases with a 300 W plasma at 10 torr and a substrate temperature of 900° C. The SWCNTs grow vertically from the Fe layer embedded in the PAA, and extend beyond (see FIG. 7.3(a)) the top of the PAA, at a yield of no more than one SWCNT per pore. The percentage of pores that contain a SWCNT has not been determined, but this characteristic can be adjusted by varying the MPCVD growth conditions and can range from a few percent to more than 50%. After V-SWCNT growth, Pd is electrodeposited into the PAA to form Pd nanowire bottom contacts to the nanotubes.

To achieve the structure shown in FIG. 7.3(b), a silicate spin-on glass (SOG) from Honeywell (Product #214) is first spin-coated onto the samples at 6000 rpm for 30 s. The SOG is then cured on hotplates of 80° C., 150° C., and 250° C. for one minute each. A final cure of the SOG is performed at 450° C. for one hour in a quartz tube furnace with a nitrogen ambient. Next, the SOG is etched back to the PAA surface to expose the PAA and the V-SWCNT tips using an Ar ion bombardment in an inductively coupled plasma reactive ion etcher. The Ar ion bombardment was carried out with 60 sccm Ar, 300 W coil power and 800 W platen power at 0.5 mtorr for 90 s. An ion etch can be controlled the length of the V-SWCNTs to the sub-100 nm regime. While SOG is used for demonstration in this work, atomic layer deposition (ALD) of a high-κ dielectric is another viable method for filling the pores and supporting the V-SWCNTs.

A V-SWCNT supported in its own channel with the SOG dielectric can have the PAA be selectively etched back to expose these rigid dielectric pillars, which serve to template the SG formation. As In a solution of chromic acid at 65° C., the PAA is etched back at a rate of approximately 10 nm/min. This slow etch rate provides the ability to accurately define the portion of the source-to-drain channel length that is to be gated for the device. Once the PAA has been etched back (see FIG. 7.3(c) and FIG. 7.4), the Al gate metal is sputtered in a DC sputtering system with an Ar gas support at 75 W and 10 mtorr for 20 min. The result is a conformal Al thin film on the SOG/V-SWCNT pillars of approximately 20 nm, as shown in the field-emission scanning electron microscope (SEM) images in FIG. 7.5(a).

Another act to completing the SG V-SWCNTs begins with applying another SOG layer using the same process employed to fill the pores initially. This final SOG layer acts as a support for the SG pillars and allows the final gated channel length to be defined. After application and curing, the SOG is etched back using the same Ar ion bombardment process described above. This time, the ion etch is continued until the cylindrical Al gate metal is exposed as shown in FIG. 7.5(b), at which time the V-SWCNT tips also become exposed. The etch time for this process was about 50 s, but continuing the etch past this time allows for further scaling of the SG V-SWCNT channel at a rate of approximately 60 nm/min.

Results of selectively etching back the PAA to expose the V-SWCNTs wrapped in the rigid dielectric pillars are given in the SEM images of FIG. 7.4. Note that the pillars are the same diameter as the initial PAA pores, 20—25 nm with an inner-pore spacing of 100 nm in the current experiment. A limit may exist as to how far these pillars can be exposed because as their aspect ratio increases, attractive van der Waals forces will cause adjacent pillars to agglomerate. The adhesion force ($F_{ed}$) between two adjacent SOG pillars is calculated according to Derjaguin-Muller-Toporov (DMT) theory as $$F_{ad} = 2\pi R W_{ad} \quad (7.3)$$

where R is the radius of the pillar and $W_{ad}$ is the work of adhesion of the SOG. The elastic force generated by bending a pillar of stiffness kb ($kb = 3\pi R^4 E/4l^3$) over a displacement δ is $$F_{el} = \frac{3\pi R^4 E}{4l^3} \delta \quad (7.4)$$

where l is the length of the pillars and E is the Young's modulus of the SOG.

In order to prevent the pillars from adhering to each other, the elastic force should be greater than the adhesion force. Solving the inequality between equations 7.3 and 7.4, the maximum length of the pillars before they agglomerate is $$l \leq \left(\frac{3SR^3 E}{16 W_{ad}}\right)^{\frac{1}{3}} \quad (7.4)$$

where S=2δ is the spacing between the pillars. Assuming a Young's modulus of 20 GPa (approximately one-third that of $SiO_2$) and work of adhesion of 0.12 N/m, the maximum pillar length (R=10 nm, S=100 nm) is about 146 nm. It should be noted that this pillar length is given by way of example only, and is used to illustrate the inner relationship among process variables and the device geometry. The use of different process chemistry or different device geometry will yield a different calculated maximum value. Of course, those of ordinary skill in the art recognize that this maximum length is a calculation only, and there is actually a range of acceptable pillar lengths.

It should be also noted that the calculated length is for SOG pillars in air; however, during the drying of the SOG pillars after length definition in the chromic acid, capillary forces will increase the adhesion force between pillars, and this effect will cause agglomeration at somewhat shorter lengths. Experimentally, agglomeration of the pillars was observed to occur when they reached approximately 110 nm in length as shown in FIG. 7.4(c).

The dimensions of the PAA templates in this study would yield devices with d—of ≈9-12 nm and $\in_{ox}$ of ≈3.9 (the SOG is a silicate with a dielectric constant similar to SiO2). Also, the SWCNTs have a diameter of approximately 1-2 nm and have been shown to exhibit $\in_{body}$ values in the range of 20-30. Therefore, this SG device geometry would yield a screening length of λ≈3 nm, which is one-fourth of the λ achieved from the same parameters using a bottom-gate geometry. Replacement of the SOG with an ALD high-κ dielectric As in other embodiments of the present invention would decrease the screening length to 1.5 nm for the surround-gate and improve the electrostatics of the resulting FET. The PAA pore diameter and spacing can also be scaled to smaller dimensions by anodizing at lower voltages or in a different electrolyte (e.g., sulfuric acid) to decrease $d_{ox}$.

Two other process acts can be used to control the channel length: one is the etchback of the PAA to expose the dielectric pillars, and the other is the final etch of the SOG filler to expose the V-SWCNT tips. For the three samples, the final SG channel length had a maximum variability of ±15 nm as measured using cross-sectional SEM images. As the ordering of the pores improves, the uniformity of the etching will improve, thus reducing the variations in channel length across a sample. Furthermore, improvement of the initial Al film surface smoothness and the dielectric layer uniformity (SOG in this case) can also increase the uniformity of channel length.

Another of these SG V-SWCNTs for FETs is that they lend themselves to the facile fabrication of multi-nanotube devices. The current-carrying capacity for many devices based on nanomaterials can be high for their nanoscale dimensions Realization of nanomaterial-enabled nanoelectronics in some embodiments includes the use of FETs with multiple channels. In these modified PAA templates, V-SWCNTs grow at a yield of no more than one per pore, and the pores can be fabricated in highly ordered arrays. Such arrays allow for the definition of the desired number of channels for a FET simply by defining an appropriately sized top contact to the surface shown in FIG. 7.5(b) that encompasses a predefined number of pores and thus V-SWCNTs. Note that a short from the top contact to the gate metal can be avoided by oxidizing the Al to form alumina to the desired depth, thus creating an insulating barrier between the two metals. In some embodiments the device structure includes a single underlap between the gate and source. This underlap can help obtain n- and p-type FETs simply by changing the polarity of the drain bias.

The templated V-SWCNTs (with multi-nanotube FETs) with SGs also decrease detrimental charge-screening among nanotubes compared to planar SWCNT devices. When SWCNTs are closely packed, a capacitive coupling develops between them that causes a screening of the gate charge and thus a degradation of the current per nanotube. In the PAA template, each V-SWCNT is a fixed distance from its nearest neighbors and is individually coated in the dielectric and wrapped in the gate metal, thus allowing each channel to feel the same gate potential in a multi-nanotube FET.

The V-SWCNTs in the PAA still contain a mixture of metallic and semiconducting types. However, various embodiments described herein show a strong selectivity towards semiconducting nanotubes (95% of characterized nanotubes were semiconducting). Also, metallic nanotubes can be selectively removed by turning the semiconducting nanotubes OFF with the gate bias and sweeping a high bias on the metallic nanotubes to burn them out. When each multi-nanotube device contains a certain number of SG V-SWCNT channels, the statistical distribution of their band gap energies should be comparable from device to device, creating I-V characteristics within the same operating range as compared to the variation seen when testing many single nanotube devices.

A vertical FET structure for SG V-SWCNTs fabricated in accordance with some embodiments will contain a single underlap between the gate and Pd nanowire (drain) contact while the top contact is considered self-aligned to the gate. Al readily develops a 4-8 nm thick native oxide on its surface when exposed to air, and the presence of this layer has been shown to provide an adequate separation layer between gate and source/drain metals for self-aligned CNTFETs. The exposed Al gate (shown in the SEM image of FIG. 7.5(b)) can be further oxidized beyond this native $Al_2O_3$ formation using simple processes such as moderate heating in an oxygen ambient. FIG. 7.6 shows a cross-section schematic illustrating a device with this alumina separation between the gate and source electrodes. Note that a separation of less than 10 nm should not hinder the ability of the gate to modulate the energy bands of the V-SWCNT in this region.

The top contact metal is electron-beam evaporated with the following sequential layers: 8 nm Pd/20 nm Ti/80 nm Au. The intermediate Ti is added to improve adhesion, and the Pd is preferably thin because of its poor adhesion to insulating surfaces. FIG. 7.7 shows SEM images of the top contact interfacing with the SOG-supported V-SWCNTs. The nature of this contact to the tip of a vertical nanotube is unique compared to the more traditional planar contacts that can cover several microns of the SWCNT. This contact can provide a contact metal appropriately bonded with the dangling bonds at the end of the V-SWCNT.

One aspect of a vertical geometry for FETs includes gaining access to the gate, drain, and source contact metals. With the SG V-SWCNTs, addressing the bottom contact, which serves as the drain, is fairly straightforward—the top of the sample contains an unanodized portion of the original metal layers that directly accesses the underlying Ti, as shown in FIG. 7.6. This bulk access point for the drain is sufficient for device testing and more complex control of the PAA template can be added to suit a particular application as previously discussed. The top (source) contact is also straightforward to access in preliminary devices using lithographically defined metal pads.

approach to access the gate involved the use of SG V-SWCNTs that were templated in a PAA field surrounded by $SiO_2$. Figures of the 1000—series schematically outline acts in a method according to one embodiment of the present invention, with two options for accessing the gate (identified in the figure number either as/1 or/2). FIG. 7.8 illustrates one method for accessing the gate in this configuration, where each individual PAA field has its own gate electrode. The neighboring $SiO_2$ is used as a support for the gate contact pad, with a small lead extending over to the PAA to make contact to the Al metallization. One embodiment includes the use of atomic layer deposition (ALD) of 8 nm $Al_2O_3$ prior to Al sputtering. This approach can provide a barrier between the gate metal and any exposed portion of the underlying Ti that could cause shorting. Yet another embodiment of the present invention includes an approach for accessing the gate without the neighboring $SiO_2$. FIG. 7.9 shows this design, which involves a vertical line of ordered pores that is 420 µm wide and 4200 µm long. The remainder of the PAA is not ordered, but the active devices are restricted to the ordered area. Figures of the 1000 series provide a process flow for the fabrication of these devices. The gate electrode is isolated from the region that contains the electrodeposited Pd to eliminate the potential for the aforementioned short.

As previously discussed, the Pd nanocubes could be employed for studies from catalysis to sensing. However, other applications of these SWCNT-supported nanocubes can be achieved by further augmenting them with another electrodeposited layer. For instance, because of the biocompatibility of Au, biosensing applications can include a Au-coating on the Pd nanocubes. The Pd serves as a stable, low-resistance contact to the SWCNTs. The templating of these nanocube-decorated SWCNTs in PAA allows for even further customization; functionalizing independently accessible regions of nanocubes with specific metals/ligands can allow for the sensing of multiple biological species with a single chip (multiplexed biosensing).

Some embodiments of the present invention pertain to fabrication of individually addressable fields of PAA surrounded by $SiO_2$. This is accomplished by defining underlying electrodes, depositing the $SiO_2$ insulator, patterning user-defined fields on top of the electrodes, etching the $SiO_2$ in these fields to expose the electrode metal, evaporating the desired film stack for PAA formation, and anodizing the film to create PAA fields (see FIG. 3.5 for schematics of this process). In some embodiments a chip can contain multiple PAA fields, each with their own customized augmentation of the SWCNTs. FIG. 8.1 illustrates this customization with a chip having one independently addressable column of PAA fields (squares, in this case) containing Pd nanocube-decorated SWCNTs. This augmented column of PAA fields is situated next to another column of PAA fields with bare (undecorated) SWCNTs. This distinction was accomplished by selectively contacting the left column when the chip underwent electrodeposition of Pd to form the Pd nanocubes. The chip in FIG. 8.1(*a*) also demonstrates the ability to vary the size of the PAA fields to suit the needs of a specific application. The field-emission scanning electron microscope (SEM) images in FIG. 8.1(*b*, c) reveal the clear distinction between the nanocube-decorated SWCNTs in PAA to the virtually unseen bare SWCNTs.

A Pd nanocube-decorated field of PAA according to another embodiment was selectively augmented with a thin layer of electrodeposited Au. Au was chronoamperometrically electrodeposited at a potential of 750 mV for 5 sec in a chloroauric acid electrolyte, forming an overlayer on the Pd nanocubes (see FIG. 8.2(*c,e*)). In this way, Pd and Au-coated Pd (Au/Pd) nanocubes were synthesized with separate and intrinsic electrical contact through the SWCNT/nanowire/Ti electrodes on the same chip.

Thermal transducers are used to characterize effects such as heat conduction mechanisms, electrical self-heating, and phase change phenomena in nanoscale devices. One specific type of transducer is a solid-state thermometer, which relates changes in electrical resistance to temperature. Such solid-state devices exhibit electrical resistance that is both stable at a constant temperature and highly sensitive to temperature changes.

Noise thermometry offers an alternative to resistance thermometry for nanoscale objects. In yet another embodiment of the present invention, vertical two-terminal SWCNT devices are used to measure the temperature dependent shot noise. When measured in combination with Johnson noise, Spietz et al. showed recently that shot noise can be exploited to achieve accurate temperature measurements from the mK range to many hundreds of Kelvin.

FIG. 8.4 shows the current spectral density ($S_1$) of a two-terminal SWCNT device for DC voltage biases from 0 to 80 mV at room temperature with frequencies from 3 to 100 kHz measured. At frequencies below 60 kHz, the spectra are dominated by 1/f noise, consistent with previous studies. At intermediate frequencies the average magnitude of the noise is bias-dependent, as is characteristic of shot noise. The inset of FIG. 8.4 shows the measured noise signal at 0 mV with 1 and 200 averages, with a vertical offset to distinguish between the curves. Although both measurements fluctuate about the same mean value, averaging reduces the amplitude of these fluctuations. Overall, measurements of $S_1$ in the vertical SWCNT devices showed that frequencies between 60 and 100 kHz can provide unique information about the shot noise that can be used for thermometry.

Further analysis of the data in FIG. 8.4 revealed that the magnitude of the shot noise does not follow the expected curve for an isothermal device. Rather, a substantial deviation due to self-heating of the SWCNT device is observed. A simple self-heating shot noise model that assumes constant device resistance has been developed by Sayer et al. and provides a good fit to the measured data. The resulting thermal resistance of the CNT device is found to be $1.5 \times 10^8 \pm 0.1 \times 10^8$ K/W. This technique offers individually contacted SWCNTs to investigate electrical self heating in CNTFETs.

Thermionic emission involves the transfer of enough thermal energy to electrons that they overcome the work function (potential energy barrier) at the surface of a solid and escape either into vacuum or another material. Thermionic emission has been used for electron supply, including cathode ray tubes, fluorescent bulbs, scanning electron microscopes, mass spectrometers, and more. Vacuum and solid-state thermionic emission processes have attracted attention for generating electrical power from heat or solar energy. In such a device, electrons replace the usual working fluid, eliminating the need for mechanical components such as compressors, evaporators, and generators to convert mechanical work to electricity. The absence of moving parts in a thermionic emission diode potentially allows for long device lifetimes and silent operation.

The emitter material should have a very low work function to maximize the electron emission current and should also be stable at high temperatures. One embodiment includes the use of SWCNTs intercalated with potassium atoms (K/SWCNTs) as a possible emitter material for use in a thermionic emission power generator. It has been shown that the work function of pristine SWCNTs, which is similar to that of graphite ($\approx$4-5 eV), can be reduced to 2-3 eV by the introduction of alkali metal intercalants. As for stability at high temperatures, Robinson et al. showed that intercalated potassium metal atoms can be stable in graphitic nanofibers at temperatures up to 970 K, indicating that emission from intercalated carbon nanostructures may exhibit greater long-term stability than that from planar emitting cathodes.

The K/SWCNTs emitters were fabricated using SWCNTs templated in PAA with electrodeposited Pd nanowire back contacts. Potassium intercalation was carried out by depositing a 30-60 nm layer of potassium on the samples surface and then heating the sample to an appropriate temperature corresponding to a stage-1 ($C_8K$) or stage-2 ($C_{24}K$) K/SWCNTs intercalate. Photonic excitation was combined with thermal excitation to enhance the thermal efficiency and power generation capacity. The K/SWCNTs emitter was irradiated with a 100 mW Nd:YAG laser (532 nm) while the resultant energy distributions of photo-emitted and thermionic electrons were measured using a hemispherical electron energy analyzer.

FIG. 8.5 shows the general trends observed in the measured electron energy distributions (EEDs) obtained from one K/SWCNTs emitter for the full investigated temperature range. Heater temperatures are shown to the left of each EED and theoretical thermionic EEDs based on calculations shown elsewhere are also included for comparison. The work function values used to generate the curve-fitting theoretical EEDs are shown on the left below the respective temperature and are approximate area weighted values, which are not necessarily the actual values for individual emitter sites. Note that all of the EEDs in FIG. 8.5 have been scaled to have approximately the same height with the peak values shown to the right of each EED. The EEDs were recorded after sufficient time had passed at each temperature to allow transient effects to subside, and are shown in chronological order with the first distribution located at the bottom. The intensity of the Nd:YAG laser was 50 W/cm$^2$ over a spot $\approx$0.5 mm in diameter.

The first distribution was recorded at a sample temperature of approximately 560 K, and was followed by cooling to room temperature, which caused the magnitude of the laser-enhanced EED to decrease by over four orders of magnitude and shift toward higher energies by approximately 0.25 eV. Interestingly, reheating the sample to 380 K resulted in no visible change to the measured EED, yet when the sample was heated to 480 K the intensity increased by approximately 1000× and shifted to lower energies by 0.1 eV. Further heating of the sample to 580 K caused the emission peak to shift to nearly the same location as that of the first recorded data obtained at 560 K. Thereafter, heating the sample above 580 K caused the emission peak to shift to higher energies. At temperatures exceeding 580 K, potassium atoms are highly mobile in the SWCNT lattice; thus, the increase in the effective sample work function with increasing temperature may be due to rearrangement and deintercalation of the potassium atoms from the SWCNT surface.

Overall, it was observed that irradiating K/SWCNTs templated and contacted in PAA substantially increases the electron emission intensities above that which is obtained from thermionic emission alone. The PAA support provided an insulating support for the intercalation of SWCNTs that was stable at the high temperatures useful for thermionic emission studies.

Some embodiments of the present invention utilize a hydrogen plasma to allow for electrodeposition of Pd beginning at the underlying Ti. However, the present invention is not so limited, and yet other embodiments contemplate either methods for connection to the titanium substrate. One option is to use an inert gas ion bombardment etch to remove the barrier. An ion bombardment etch works by accelerating Ar ions toward the sample where they bombard and mechanically etch the surface. Directly following anodization, an ion bombardment can be performed to remove the barrier and fully expose the underlying Ti. FIG. 9.1 depicts an alternative that may allow for the removal of the alumina barrier without the limitation of an oxidized Ti surface. By covering Pt with a thin layer of Ti, the anodization will be able to complete and a slight increase in the ion bombardment etch time will subsequently serve to remove the Ti and expose the Pt for an unoxidized metal interface to the Pd nanowires.

Various embodiments of the present invention include the use of electron beam lithography (EBL) to define an ordered arrangement of holes, followed by an etch to create pits that serve as subsequent pore nucleation sites. However, other embodiments of the present invention contemplate other methods for obtaining the ordered pores. Some embodiments include the use of nanoimprint lithography. Using a quartz mold with the desired pore pattern etched out of it, a carefully prepared resist is applied to the sample, imprinted, and hardened. The result is akin to the EBL-patterned resist, serving as an etch mask for creating pits in the Al surface. The throughput for nanoimprint can be orders of magnitude higher than EBL, with the capability of processing an entire wafer within a few hours. Other lithographic techniques may also improve on the EBL.

Spin-on glass (SOG) plays a role in fabricating V-SWCNT devices in some embodiments described herein. The primary roles of the SOG include providing a support for the V-SWCNTs and a dielectric for gating the nanotube channel. However, SOG also plays a role in centering the V-SWCNTs within their pores. When the SWCNTs grow from the embedded Fe layer, there is a possibility that they interface with the pore sidewall. The SOG wets the PAA efficiently, which is hypothesized to force the V-SWCNTs toward the center of their pore.

However, other embodiments of the present invention contemplate alternatives to the use of SOG. Atomic layer deposition (ALD) is one option for forming high-quality, uniform high-K dielectrics. ALD may pin the nanotube to the wall by depositing around it. Yet another process would involve centering the V-SWCNTs and then uniformly depositing a high-κ dielectric.

FIG. 9.2 illustrates an alternative approach toward centering the V-SWCNTs and depositing a high-κ dielectric. First, the SOG (or a similar material that can be removed) is applied to center the nanotubes, followed by an etchback to leave a very small amount of SOG in the pores. Next, ALD is used to deposit a high-K dielectric that uniformly coats the V-SWCNT along its length. Note that this dielectric should be resistant to a wet etch of the PAA (alumina) to allow for the subsequent formation of a surround gate—a candidate material would be hafnium oxide.

An embodiment of the present invention shown in FIG. 9.2 includes a method for supporting nanotubes. The method includes providing a template including a plurality of substantially parallel pores, each pore including a nanotube generally aligned with the pore longitudinal axis. The method includes depositing a first insulating material within each pore and generally surrounding the nanotube with the insulating material. The method includes removing a portion of the first insulating material from each pore. The method includes depositing a dielectric material within each pore after said removing.

Yet another embodiment of the method discussed relative to FIG. 9.2 includes wherein said depositing is by atomic layer deposition. Yet another embodiment of the method discussed relative to FIG. 9.2 includes wherein the dielectric material is hafnium oxide. Yet another embodiment of the method discussed relative to FIG. 9.2 includes wherein the first insulating material is a glass. Yet another embodiment of the method discussed relative to FIG. 9.2 includes wherein the glass is spun onto the template. Yet another embodiment of the method discussed relative to FIG. 9.2 includes wherein the template includes catalytic material and the nanotube was grown from the catalytic material and within the pore.

Various embodiments described herein pertain to SWCNT devices templated in PAA. However, yet other embodiments pertain to the use of templates other than PAA. One example is illustrated in FIG. 9.3. Beginning with smooth films of sequentially deposited Pt/Al$_2$O$_3$/Fe/Al$_2$O$_3$ of average thicknesses 100 nm/50 nm/1 nm/200 nm, a pattern can be defined using EBL (or nanoimprint lithography) to expose certain regions of the film (FIG. 9.3(b)). A reactive ion etch, such as an ion bombardment, can then be used to etch open the expose regions to create vertical channels that are akin to the pores in a PAA template. These channels can be placed in arbitrary locations across a sample surface without being bound to a particular ordered arrangement. The embedded Fe catalyst are exposed within the vertical channels and can be used to synthesize SWCNTs. The catalysis should be fairly similar to that observed with Fe embedded in PAA.

An embodiment of the present invention shown in FIG. 9.3 includes a method for growing nanotubes. The method includes providing a substrate comprising an insulating material. The method includes depositing a first layer of a first conductive material on the substrate. The method includes depositing a second layer of a catalytic material on the first layer. The method includes depositing a third layer of insulating material on the second layer. The method includes creating a pattern of pits on the top surface of the third layer. The method includes etching a vertical channel in the material from the top surface to the first conductive layer. The method includes growing a nanotube within each channel from the catalytic material.

Yet another embodiment of the method discussed relative to FIG. 9.3 includes wherein said etching is by electron beam lithography. Yet another embodiment of the method discussed relative to FIG. 9.3 includes wherein said etching is by nanoprint lithography. Yet another embodiment of the method discussed relative to FIG. 9.3 includes wherein said creating is by coating the third layer with a resist material and exposing a pattern in the resist material. Yet another embodiment of the method discussed relative to FIG. 9.3 includes wherein the insulating material is alumina.

While the inventions have been illustrated and described in detail in the drawings and foregoing description, the same is to be considered as illustrative and not restrictive in character, it being understood that only certain embodiments have been shown and described and that all changes and modifications that come within the spirit of the invention are desired to be protected.

What is claimed is:

1. A field effect transistor, comprising:
   an insulating material defining a pore having a wall, the pore including a catalyst for growing a carbon nanotube;
   a carbon nanotube grown from the catalyst within the pore, the nanotube having two ends;
   a drain in electrical communication with one end of said nanotube;
   a source in electrical communication with the other end of said nanotube; and
   a gate surrounding a portion of said nanotube intermediate of the two ends;
   wherein the pore has a length spanning from a closed end to an opened end, and said nanotube is grown from a location on the wall of the pore beginning along the length intermediate of the closed end and the opened end.

2. The field effect transistor of claim 1 wherein the insulating material is aluminum oxide.

3. The field effect transistor of claim 1 which further comprises a nanowire within the pore electrically connecting said one end of said nanotube to said drain.

4. The field effect transistor of claim 1 which further comprises a nanowire within the pore electrically connecting said other end of said nanotube to said source.

5. The field effect transistor of claim 1 which further comprises a layer of conductive material in contact with said insulating material, said conductive layer being in electrical communication with one of said drain or said source.

6. The field effect transistor of claim 1 which further comprises a layer of conductive material in electrical communication with an end of said nanotube.

7. The field effect transistor of claim 1 wherein said insulating material comprises porous anodic alumina.

8. The field effect transistor of claim 1 wherein the nanotube has a length less than the length of the pore.

9. The field effect transistor of claim 1 wherein said carbon nanotube is a semiconducting carbon nanotube.

10. The field effect transistor of claim 1 wherein said pore and said carbon nanotube are vertically oriented.

11. The field effect transistor of claim 1 wherein there is only one carbon nanotube in electrical communication with said drain and said source.

12. The field effect transistor of claim 1 wherein the insulating material is a first insulating material and which further comprises a second insulating material substantially surrounding said nanotube within the pore.

13. The field effect transistor of claim 12 wherein the second insulating material is a glass.

14. The field effect transistor of claim 1 which further comprises a nanowire in said pore providing electrical communication either between the one end and said drain or between the other end and said source.

15. The field effect transistor of claim 14 wherein said nanowire comprises palladium.

* * * * *